(12) United States Patent
Koldiaev et al.

(10) Patent No.: US 9,520,501 B2
(45) Date of Patent: *Dec. 13, 2016

(54) VERTICAL SUPER-THIN BODY SEMICONDUCTOR ON DIELECTRIC WALL DEVICES AND METHODS OF THEIR FABRICATION

(71) Applicant: FinScale Inc., Dublin, CA (US)

(72) Inventors: Viktor I. Koldiaev, Morgan Hill, CA (US); Rimma A. Pirogova, Morgan Hill, CA (US)

(73) Assignee: FinScale Inc., Dublin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/729,917

(22) Filed: Jun. 3, 2015

(65) Prior Publication Data

US 2015/0279997 A1 Oct. 1, 2015

Related U.S. Application Data

(63) Continuation of application No. 13/940,190, filed on Jul. 11, 2013, now Pat. No. 9,093,304.

(Continued)

(51) Int. Cl.
*H01L 21/8238* (2006.01)
*H01L 27/092* (2006.01)
(Continued)

(52) U.S. Cl.
CPC ... *H01L 29/7851* (2013.01); *H01L 21/823814* (2013.01); *H01L 21/845* (2013.01);
(Continued)

(58) Field of Classification Search
CPC ............................ H01L 21/845; H01L 29/7851
(Continued)

(56) References Cited

U.S. PATENT DOCUMENTS 5,587,604 A * 12/1996 Machesney ......... H01L 27/1203
257/348
7,211,864 B2 5/2007 Seliskar
(Continued)

OTHER PUBLICATIONS

Notice of Allowanced mailed May 26, 2015, for U.S. Appl. No. 13/940,190 of Koldiaev, V. et al. filed Jul. 11, 2013.
(Continued)

*Primary Examiner* — Ha Tran T Nguyen
*Assistant Examiner* — Thai T Vuong
(74) *Attorney, Agent, or Firm* — Perkins Coie LLP

(57) ABSTRACT

The present invention is a semiconductor device comprising a semiconducting low doped vertical super-thin body (VSTB) formed on Dielectric Body Wall (such as STI-wall as isolating substrate) having the body connection to bulk semiconductor wafer on the bottom side, isolation on the top side, and the channel, gate dielectric, and gate electrode on opposite to STI side surface. The body is made self-aligned to STI hard mask edge allowing tight control of body thickness. Source and Drain are made by etching holes vertically in STI at STI side of the body and filling with high doped crystalline or poly-Si appropriately doped with any appropriate silicides/metal contacts or with Schottky barrier Source/Drain. Gate first or Gate last approaches can be implemented. Many devices can be fabricated in single active area with body isolation between the devices by iso-plugs combined with gate electrode isolation by iso-trenches. The body can be made as an isolated nano-plate or set nano-wire MOSFET's on the STI wall to form VSTB SOI devices.

18 Claims, 28 Drawing Sheets

Related U.S. Application Data

(60) Provisional application No. 61/713,003, filed on Oct. 12, 2012.

(51) Int. Cl.

| | | |
|---|---|---|
| *H01L 27/12* | (2006.01) | |
| *H01L 29/78* | (2006.01) | |
| *H01L 29/66* | (2006.01) | |
| *H01L 27/088* | (2006.01) | |
| *H01L 27/108* | (2006.01) | |
| *H01L 21/84* | (2006.01) | |
| *H01L 23/535* | (2006.01) | |
| *H01L 29/06* | (2006.01) | |
| *H01L 27/11* | (2006.01) | |
| *H01L 27/115* | (2006.01) | |

(52) U.S. Cl.
CPC .......... *H01L 23/535* (2013.01); *H01L 27/088* (2013.01); *H01L 27/0886* (2013.01); *H01L 27/092* (2013.01); *H01L 27/108* (2013.01); *H01L 27/115* (2013.01); *H01L 27/1211* (2013.01); *H01L 29/0649* (2013.01); *H01L 29/66795* (2013.01); *H01L 29/785* (2013.01); H01L 27/10826 (2013.01); H01L 27/10879 (2013.01); H01L 27/1104 (2013.01); H01L 27/11521 (2013.01); H01L 2924/0002 (2013.01)

(58) Field of Classification Search
USPC .......................... 257/296, 369; 438/212, 199
See application file for complete search history.

(56) References Cited

U.S. PATENT DOCUMENTS

| | | | | |
|---|---|---|---|---|
| 7,674,669 | B2* | 3/2010 | Hanafi | ................ H01L 29/1054 |
| | | | | 257/263 |
| 8,106,459 | B2 | 1/2012 | Chang et al. | |
| 8,148,776 | B2* | 4/2012 | Juengling | ........... H01L 29/7851 |
| | | | | 257/330 |
| 8,748,977 | B2 | 6/2014 | Kudou | |
| 8,796,085 | B2 | 8/2014 | Koldiaev et al. | |
| 9,093,304 | B2* | 7/2015 | Koldiaev | ............. H01L 21/845 |
| 2004/0092068 | A1* | 5/2004 | Hsieh | ...................... H01L 21/84 |
| | | | | 438/212 |
| 2006/0246649 | A1* | 11/2006 | Seo | ................... H01L 27/11521 |
| | | | | 438/212 |
| 2007/0020837 | A1 | 1/2007 | Bryant et al. | |
| 2007/0218620 | A1 | 9/2007 | Zhu et al. | |
| 2007/0228491 | A1* | 10/2007 | Forbes | ................ H01L 29/0657 |
| | | | | 257/401 |
| 2008/0049486 | A1* | 2/2008 | Gruening-von Schwerin | ........... G11C 13/0023 |
| | | | | 365/104 |
| 2008/0090348 | A1* | 4/2008 | Chang | ................... H01L 21/845 |
| | | | | 438/199 |
| 2008/0149984 | A1 | 6/2008 | Chang et al. | |
| 2009/0128221 | A1* | 5/2009 | Kam | ..................... B82Y 10/00 |
| | | | | 327/434 |
| 2009/0166751 | A1* | 7/2009 | Kim | ................. H01L 21/26506 |
| | | | | 257/369 |
| 2011/0079855 | A1 | 4/2011 | Chan et al. | |
| 2011/0169101 | A1* | 7/2011 | Doornbos | ........ H01L 29/66795 |
| | | | | 257/394 |
| 2011/0278672 | A1* | 11/2011 | Fuller | ................ H01L 21/3065 |
| | | | | 257/347 |
| 2012/0168855 | A1 | 7/2012 | Forbes | |
| 2012/0319167 | A1* | 12/2012 | van Dal | ......... H01L 21/823807 |
| | | | | 257/192 |
| 2013/0015534 | A1* | 1/2013 | Cheng | ................... H01L 21/845 |
| | | | | 257/401 |
| 2013/0146965 | A1* | 6/2013 | Fuller | ................ H01L 21/3065 |
| | | | | 257/329 |
| 2013/0168771 | A1* | 7/2013 | Wu | ..................... H01L 27/1211 |
| | | | | 257/351 |

OTHER PUBLICATIONS

Notice of Allowance mailed Jun. 24, 2014, for U.S. Appl. No. 13/940,197 of Koldiaev, V. et al. filed Jul. 11, 2013.

Kim, S. et al., "Paired FinFET Charge Trap Flash Memory for Vertical High Density Storage", VLSI Technology, 2006. Digest of Technical Papers, 2006 Symposium on. IEEE, 2006, pp. 84-85.

Kim, Y. et al., "Locally-Separated Vertical Channel SONOS Flash Memory (LSVC SONOS) for Multi-Storage and Multi-Level Operation", Silicon Nanoelectronics Workshop, 2008, IEEE, Jun. 15, 2008, pp. 1-2.

Koo, J.-M. et al., "Vertical Structure NAND Flash Array Integration with Paired FinFET Multi-Bit Scheme for High-density NAND Flash Memory Application", In VLSI Technology, 2008 Symposium on, IEEE, Jun. 17, 2008, pp. 120-121.

* cited by examiner

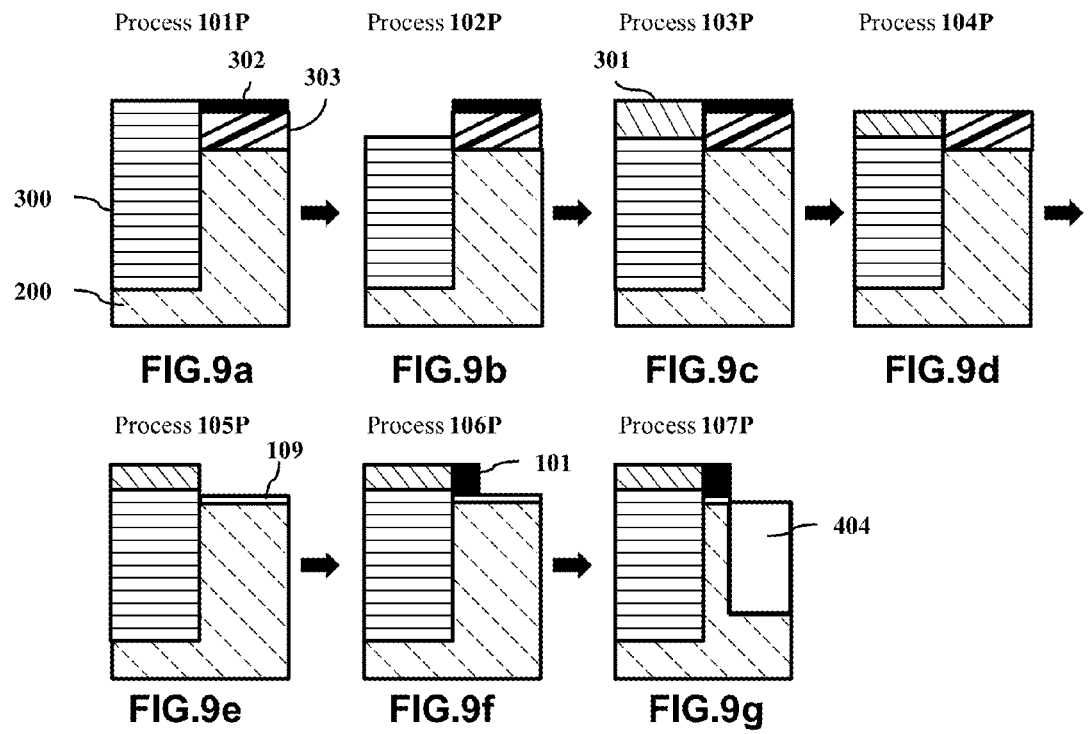
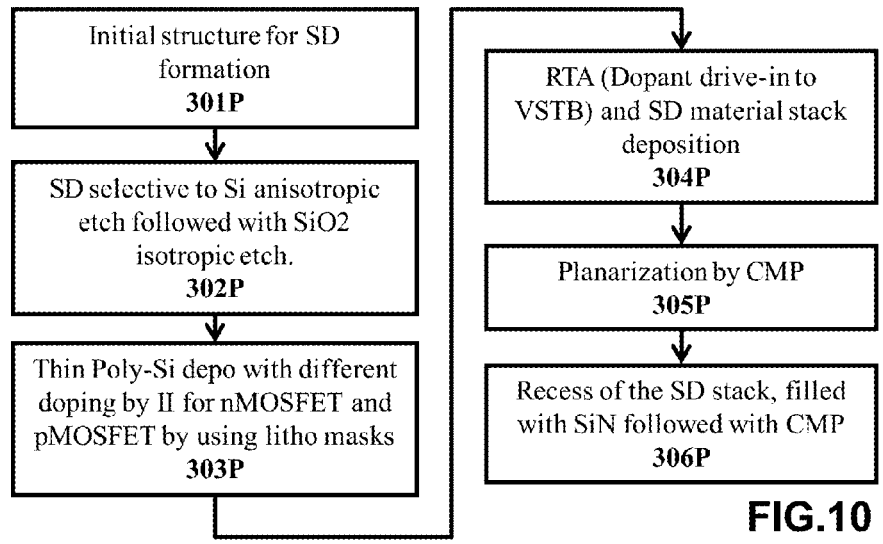

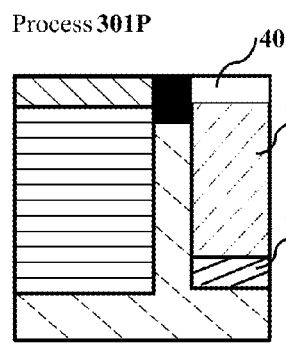
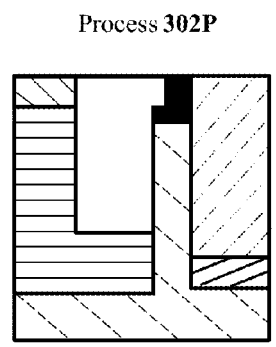
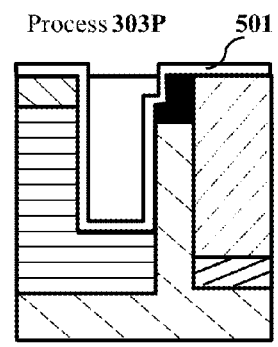
FIG.11a  FIG.11b  FIG.11c
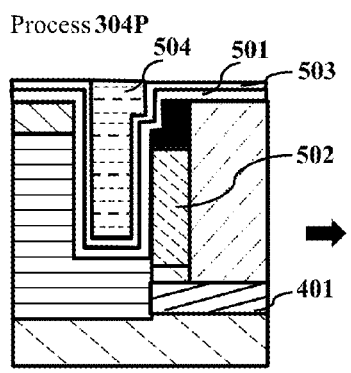
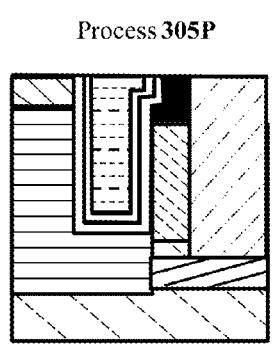
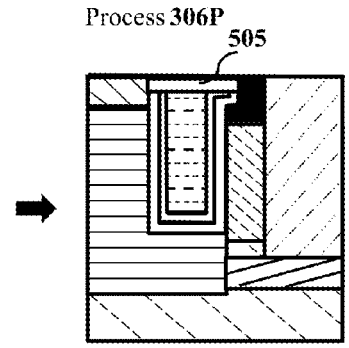
FIG.11d  FIG.11e  FIG.11f
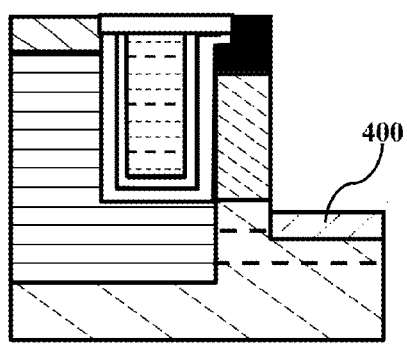
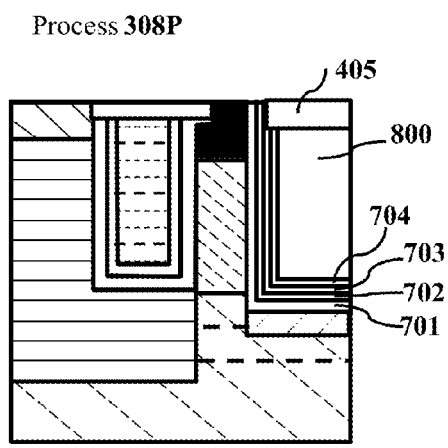
FIG.12a  FIG.12b

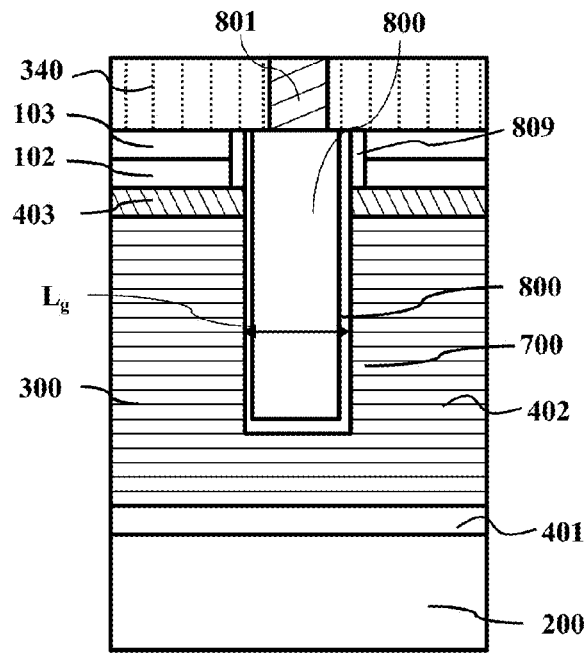
FIG. 22
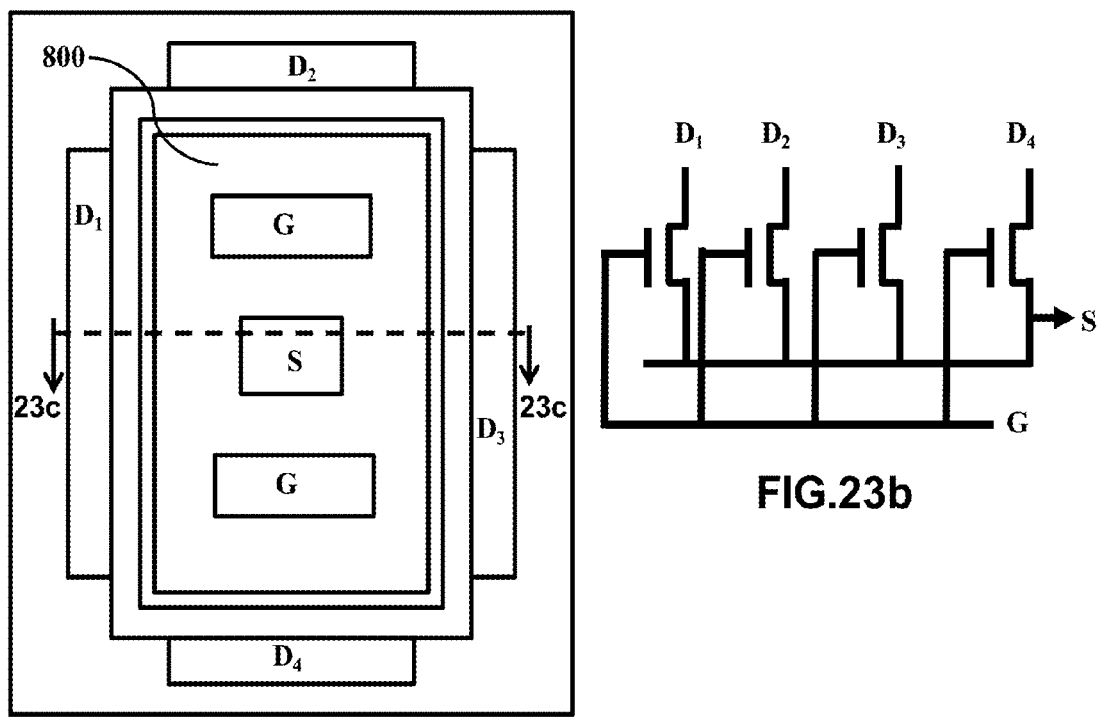
FIG.23a
FIG.23b

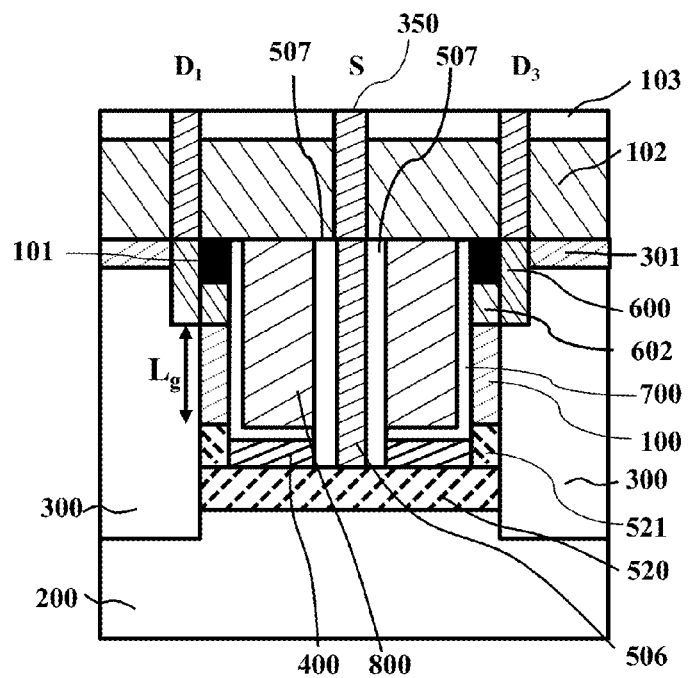
FIG.23c
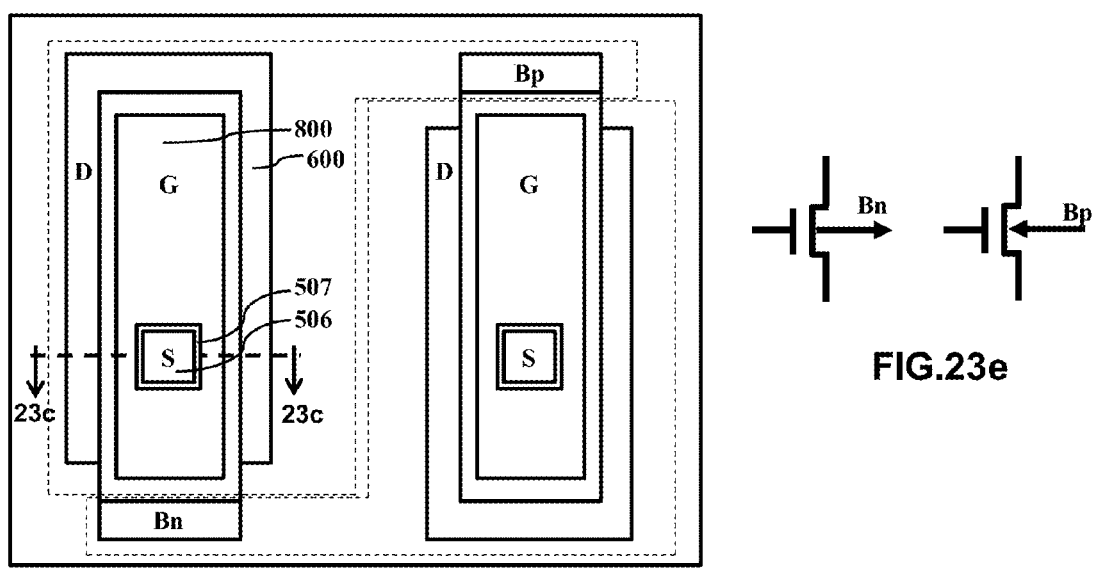
FIG.23d
FIG.23e

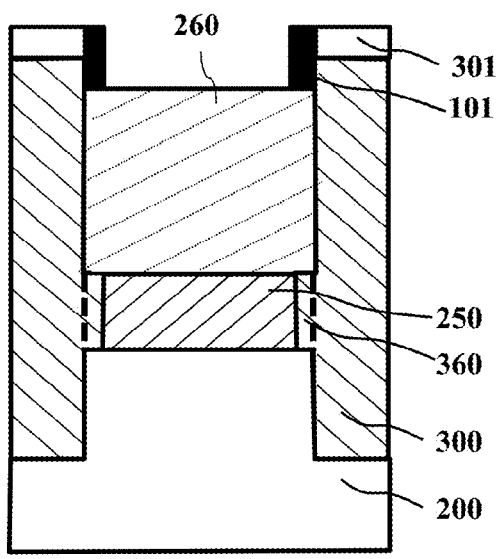
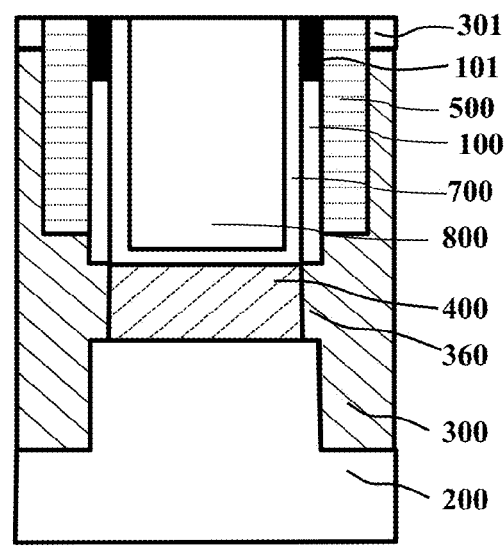
FIG.24a        FIG.24b
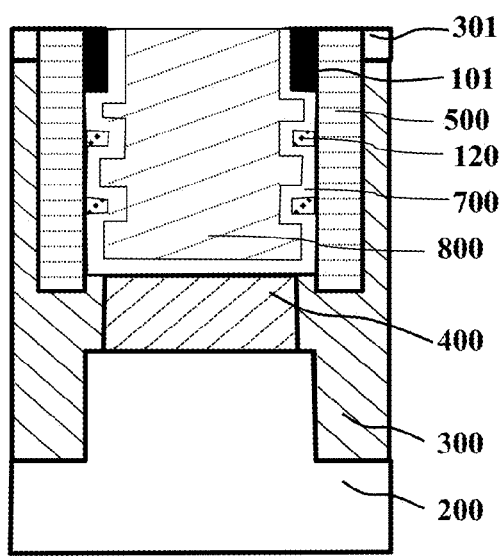
FIG.25

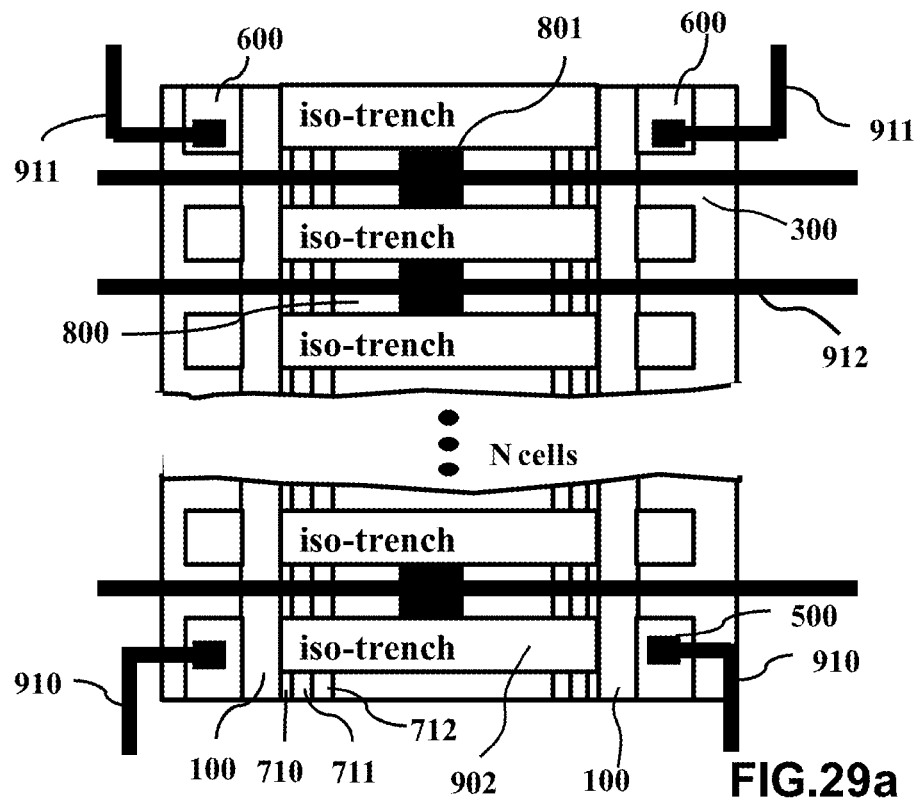
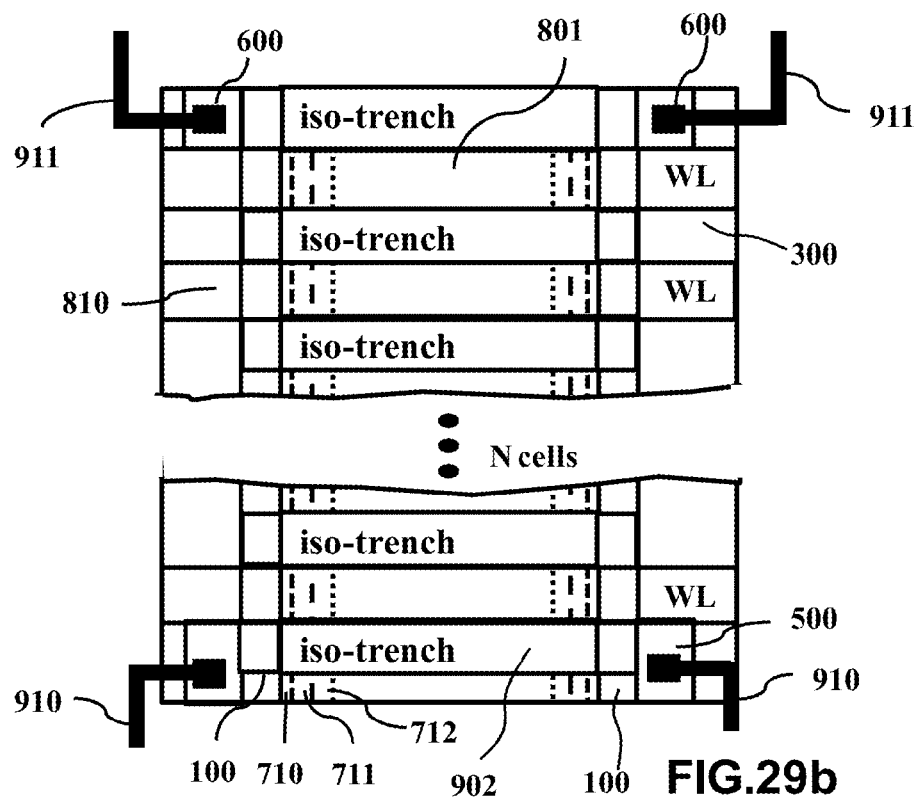

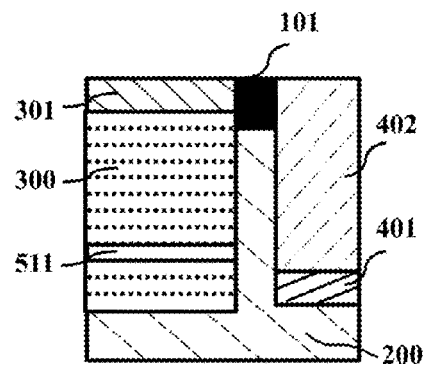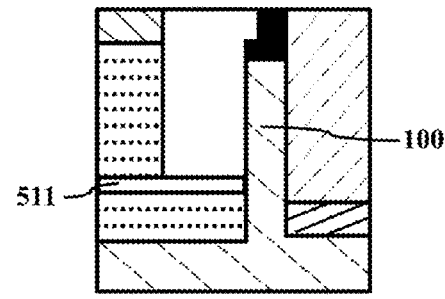
FIG.34a    FIG.34b
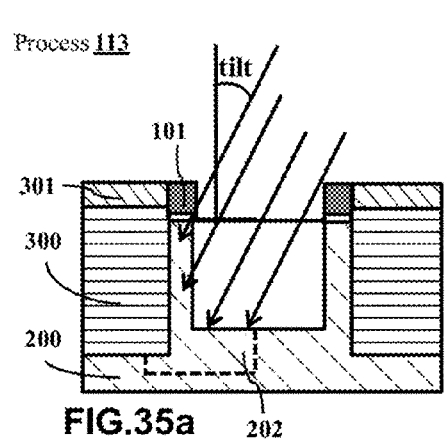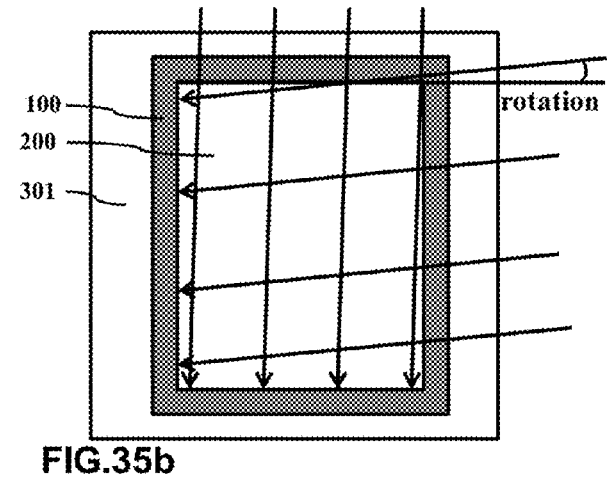
FIG.35a    FIG.35b

VERTICAL SUPER-THIN BODY SEMICONDUCTOR ON DIELECTRIC WALL DEVICES AND METHODS OF THEIR FABRICATION

CLAIM FOR PRIORITY

This application is a continuation of U.S. Non-Provisional patent application Ser. No. 13/940,190 filed on Jul. 11, 2013, which in turn claims priority to provisional patent application No. 61/713,003, filed on Oct. 12, 2012, by the inventor of the same name.

INCORPORATION BY REFERENCE

All publications mentioned herein are incorporated herein by reference to disclose and describe the methods and/or materials in connection with which the publications are cited. All publications, patents, and patent applications mentioned in this specification are herein incorporated by reference in their entirety and for all purposes to the same extent as if each individual publication, patent, or patent application was specifically and individually indicated to be incorporated by reference.

Such incorporations include U.S. Pat. No. 8,120,073, inventors: Rakshit et al. entitled, "Trigate Transistor having Extended Metal gate Electrode"; U.S. Pat. No. 7,279,774, Inventors: Seo et al. entitled, "Bulk Substrates In FINFETS With Trench Insulation Surrounding Fin Pairs Having Fins Separated By Recess Hole Shallower Than Trench"; U.S. Pat. No. 7,842,566, inventors Lee et al. entitled, "FINFET and Method of Manufacturing the Same"; U.S. Pat. No. 7,560,756, inventors: Chau et al. entitled, "Tri-Gate Devices and Methods of Fabrication"; U.S. Pat. No. 7,358,121, inventors: Chau et al. entitled, "Tri-Gate Devices and Methods of Fabrication"; U.S. Pat. No. 7,268,058, inventors: Chau et al. entitled, "Tri-Gate Transistors and Methods to Fabricate Same"; U.S. Pat. No. 7,005,366, inventors: Chau et al. entitled, "Tri-Gate Devices and Methods of Fabrication"; U.S. Pat. No. 6,914,295, inventors: Chau et al. entitled, "Tri-Gate Devices and Methods of Fabrication"; U.S. Pat. No. 7,560,756, inventors: Chau et al. entitled, "Tri-Gate Devices and Methods of Fabrication"; U.S. Pat. No. 7,148,548 inventors: Doczy et al. entitled, "Semiconductor Device with High-K gate Dielectric and a Metal Gate Electrode"; US Pat. App. No. 2010/0163970, inventors: Rakshit et al. entitled, "Trigate Transistor Having Extended Metal gate Electrode"; Auth, C., et al., A 22 nm High Performance and Low-Power CMOS Technology Featuring Fully-Depleted Tri-Gate Transistors, Self-Aligned Contacts and High Density MIM Capacitors, 2012 Symposium on VLSI Technology Digest of Technical Papers, (2012), 131-132; Park, J. K., et al., Lanthanum-Oxide-Doped Nitride Charge-Trap Layer for a TANOS Memory Device, 2011, IEEE TRANSACTIONS ON ELECTRON DEVICES, VOL. 58, NO. 10, OCTOBER (2011), 3314-3320; Padovami, A., et al., A Comprehensive Understanding of the Erase of TANOS Memories Through Charge Separation Experiments and Simulations, 2011, IEEE TRANSACTIONS ON ELECTRON DEVICES, VOL. 58, NO. 9, SEPTEMBER, (2011), 3147-3145; Beug, M. F., et al., TaN and Al2O3 Sidewall Gate-Etch Damage Influence on Program, Erase, and Retention of Sub-50-nm TANOS NAND Flash Memory Cells, 2011, IEEE TRANSACTIONS ON ELECTRON DEVICES, VOL. 58, NO. 6, JUNE (2011), 1728-1734; and James, Dick, *Intel's 22-nm Trigate Transistors Exposed*, SOLID STATE TECHNOLOGY, available at http://www.electroiq.com/blogs/chipworks_real_chips_blog/2012/04/intel-s-22-nm-trigate-transistors-exposed.html (last visited Sep. 24, 2012).

BACKGROUND OF THE INVENTION

1. Field of Invention

The present invention relates to the field of semiconductor integrated circuit manufacturing, and more particularly to a Vertical Super-Thin Body Field Effect Transistor (VSTB-FET) made of Semiconductor-On-STI-Wall structure and its methods of fabrication.

2. Discussion of Related Art

In order to increase the device performance, silicon on isolator (SOI) transistor has been proposed for the fabrication of modern integrated circuits. FIG. 1 illustrates the standard fully depleted (FD) silicon on isolator (SOI) MOSFET transistor (FD SOI MOSFET) 1000. The transistor 1000 includes a single crystalline silicon substrate 1020 having an insulating layer 1040, such as a buried oxide formed thereon. A single crystalline silicon body 1060 is formed on the insulating layer 1040. A gate dielectric layer 1080 is formed on the single crystalline silicon body 1060 and a gate electrode 1100 formed on the gate dielectric 1080. Source 1120 and Drain 1140 regions are formed in silicon body 1060 along laterally opposite sides of the gate electrode 1100.

From device physics it is clear that the body should not be doped which makes the drive current (Ion) of this device and other performance parameters beneficial. With no doping in the body only the electrostatic control is the mechanism for Vth and leakage control. To control the channel and provide low subthreshold leakage (Ioff) the thickness of the body (Tsi) is to be about ⅓ of the channel length. For practical purposes if one needs to make 15 nm channel length (Lg) Tsi is to be about 5 nm. As of now it is practically impossible to make a SOI wafer of 300 mm with 5 nm silicon body thickness and thickness variability across wafer about 5% (0.25 nm which is less than a single atomic layer of silicon lattice). This is the reason why such an approach has no scalability advantages.

A double gate (DG) FD SOI MOSFET device based on SOI FinFET structure, such as shown in FIG. 2 has been proposed to alleviate the silicon thickness control issue. The double gate (DG) device 2000 includes a silicon body 2020 formed on an insulating substrate 2040. A gate dielectric 2060 is formed on two sides of the silicon body 2020 and a gate electrode 2080 is formed adjacent to the gate dielectric 2060 formed on the two sides of the silicon body 2020. A sufficiently thick insulating layer 2090, such as silicon nitride, electrically isolates the gate electrode 2080 from the top of silicon body 2020.

The device 2000 essentially has two gates, one on either side of the channel of the device. Because the double gate device 2000 has a gate on each side of the channel, thickness (Tsi) of the silicon body can be double that of a single gate device and still obtain a fully depleted transistor operation. That is, with a double gate device 2000 a fully depleted transistor can be formed where Tsi=(2*Lg)/3. The most manufacturable form of the double gate (DG) device 2000, however, requires that the body 2020 patterning be done with photolithography that is 0.7× smaller than that used to pattern the gate length (Lg) of the device. Although, double gate structures double the thickness of the silicon film (since there is a gate on either side of the channel) these structures, however, are very difficult to fabricate for a practically usable aspect ratio. For example, silicon body 2020 requires a silicon body etch which can produce a silicon body 2020 with an aspect ratio (height to width) of about 5:1. Low performance achieved for more than 10 years of efforts, higher price per wafer for SOI and Floating body effects to be more pricy to address in designing any integrated circuitry all together have made the industry reluctant to work hard on the implementation of high aspect ratio double gate FinFET's.

A bit of improvement of the DG SOI FinFET is made as illustrated in FIG. 3a and FIG. 3b where the thick dielectric on the top of the FinFET was made as thin as the gate dielectric and the FinFET called as tri-gate since it has 3 active sides of the Fin as the channel. This innovation makes the effective channel width more beneficial. And it does make it more manufacturable for a practically achievable modest aspect ratio of the Fin to be about 1 to 3. FIG. 3a is a cross-sectional illustration of the semiconductor body and the gate electrode. FIG. 3a illustrates a cross-section taken within the channel region 7000 of the semiconductor body 3000. The metal gate electrode 1000 and a high-k gate dielectric layer 1100 are shown as being formed on three sides of the channel region 7000. The metal gate electrode 1000 and the high-k gate dielectric layer 1100 extend down into the isolation layer 4000 due to recess 8000.

FIG. 3b illustrates 3D view of the Tri-Gate FinFET. The device has a great advantage of having the body electrically connected to the substrate which removes all the circuit design, reliability, and leakage issues related to the floating body SOI UTB and FinFET devices so that it can be used for any high performance and low power application.

Further scaling to below 10 nm channel length which has to have the body thickness of 5 nm and less becomes difficult to fabricate because this three dimensional (3D) tiny Fin standing alone can be broken and/or washed away by cleaning especially when using sonication for better particle removal which is important for cleaning 3D reliefs. Another disadvantage in scaling is that. It is known that when Si body thickness gets below 5 nm the band structure starts depending on the thickness in a device performance improvement favor. Due to the quantum confinement effects the band gap gets wider which provides a higher barrier, significantly less the subthreshold leakage (Ioff) and better Ioff control which in turn allows to go for a more aggressive channel length reduction resulting as a positive side effect to a less temperature dependence of the performance parameters. It should be noted that as long as the body thickness is getting less than 8 nm the second gate from the opposite side and the top narrow gate are losing their effects on the total inversion charge concentration and at 5 nm thickness there is no merit of having double gate structure due to strong overlapping of the 2D inversion carrier layers from both gate sides. It is debatable at this point of the advance device physics knowledge, but mobility must also degrade for a double gate structure due to presence of the strong electric field on both sides. So manufacturing the three gates or double gates becomes more complex without the additional merit of having them.

Furthermore the double gate (or Tri-gate for that matter) is difficult to make with a Fin of a high aspect ratio. The best practically achievable ratio is about 3, which is difficult to increase while scaling the Fin thickness because of a Fin mechanical fragility concern.

In the proposed invention this aspect ratio can easily go to up to 10 or more. Using a single side gate the current achieved per Fin is potentially substantially more than for double-gate or triple gate structures. So a higher current can be achieved per µm-fp (per µm of footprint). The higher aspect ratio should certainly provide better mobility and less interface roughness scattering. This is most important at high inversion regime when Ion is measured as the most important performance parameter. Heat dissipation from the channel also becomes easier due to 4× less power density per physical µm width is generated. An important aspect of the Double-Gate architecture (and tri-gate for that matter) is that when the inversion layers are overlapped forming a single 2D-carrier gas, screening of the electric field from both sides doubles the carrier concentration in the channel. This has a few consequences:

1. Much higher electron-electron (hole-hole) scattering resulting in reduction of the mobility and the ballistic velocity;
2. Every carrier is now scattered by the interface roughness from both sides which again results in less mobility;
3. It is a very well known fact that usage of the high-k results in less mobility due to higher interface traps (Dit), soft-phonon scattering, and large intrinsic charge in high-k materials. So having the high-k on both sides of the body for the single inversion layer is certainly not beneficial for device performance.

As can be seen in a paper by Auth C. (see list of referenced papers above) the Fin is made with rather large tilts on both sidewalls suggesting that it is not simple even for the precision of Intel's technology to make it more vertical or ultimately ideal vertical Fin interfaces. This results in a few consequences:

1. Scaling of such a sloppy Fin goes to its limit when thinning at the bottom results in over-etching the tip and the Fin-height/Fin-thickness aspect ratio is self-limited;
2. Fin aspect ratio can not be large enough due to bringing a large variation of the body thickness and the threshold voltage (Vth) as a result of it and the thinner the Fin the more Vth variability comes about for the same relative variability;
3. Such a sloppy Fin results in a Vth changing along the Fin height leading to much less electrostatic control at the Fin bottom vs. the top. So a higher sub-Vth leakage (Ioff) is expected that limits the scaling;
4. It is well known that the sloppy Si surface will have a high interface trap density (Dit) which in turn brings a high GIDL current problem (not addressed in Auth's paper because of the leakage due to the consequence 3 above, which is likely over-shadowing the GIDL).

Rather low Ion current performance for both nMOSFET and pMOSFET published in Auth's paper suggests that these considerations above are likely correct and significant, especially accounting for such large efforts to reduce the parasitic resistance which might result that the total performance is indeed limited by the channel mobility.

Performance variability shown in Auth's paper is also needed to be better by at least 50% for Vth to be about 50 mV not 100 mV as of now.

There is a need, therefore, for a MOSFET transistor, which can be scalable and has better performance than DG or tri-gate transistors.

BRIEF SUMMARY OF THE INVENTION

Fabrication of the super-thin body on SOI with a required uniformity across a 300 mm (or 450 mm in future) wafer is not possible. FinFET on SOI is proven to be not manufacturable for a number of reasons observed as many unsuccessful efforts to implement it in the mass production. Bulk-FinFET (a.k.a. tri-gate) with a modest aspect ratio of the Fin width to height is implemented into the mass production at about 24 nm and now has become the main stream in R&D activity across the industry. Scaling of the latter concept is under scrupulous attention. For the technology nodes at and below 10 nm it seems to be rather difficult to scale the bulk FinFET as a tri-gate structure to a highly manufacturable device. A very thin Fin below 6 nm keeping a practical aspect ratio is difficult to fabricate due Fin's mechanical fragility. For a tri-gate MOSFET structure with less than 20 nm channel length, a thin Fin of 9 nm or less is needed. For such a thin Fin the quantum confinement effects of the inversion layer formation suggest little merits in having double gate not even talking about the third gate. But making a tri-gate transistor in a scaled fashion of the known architecture brings tremendous obstacles for achieving its acceptable manufacturability. The present invention is a semiconductor device comprising a semiconducting low doped vertical super-thin body (VSTB) formed on an dielectric body wall such as the STI-wall as an isolating substrate having the VSTB body connection to the bulk semiconductor wafer on the bottom side, isolation on the top side, and the channel, the gate dielectric stack, and gate electrode stack on the opposite to the STI side surface resulting in a Field Effect Transistor (VSTB-FET). The VSTB body is made self-aligned to the STI hard mask edge allowing a very tight control of the VSTB body thickness. Source and Drain are made by etching trenches/holes vertically in the STI connecting at the STI side to the VSTB semiconductor body and filling with high doped poly-Si appropriately doped and covered with a low resistive material or materials stack including any appropriate silicides, metal nitride barrier layers or/and metal. The device is very flexible in accommodating the Schottky barrier Source/Drain in a very efficient way. Tunneling MOSFET is also easy to form taking the advantage of the Source/Drain formation method in the holes/trenches etched in the isolating wall such as STI wherein using appropriate materials a skilled in the art specialist can engineer and form the Source/Drain from materials having appropriate work functions and tunneling barriers as well as barrier materials to prevent any chemical interaction of VSTB semiconductor material with the Source/Drain forming materials if desired. To this extent any heterogeneous junctions can be formed as the Source/Drain stack providing an appropriate switching characteristics of the VSTB FET. "Gate first" or "Gate last" approaches can be easily implemented depending on applications. Single or many VSTB-FET devices can be fabricated in a single active area with VSTB body isolation between devices by iso-plugs combined with gate electrode isolation by iso-trenches. If desired, for high radiation hardness applications the VSTB body can be easily made as a VSTB SOI MOSFET with the current flowing horizontally with Source and Drain at the VSTB left and right sides or vertically with Source and Drain at the bottom and the top correspondingly. If desired, a device can also be made as a set of nanowire MOSFET's on the insulating wall such as the STI wall resulting in a nanowire-based VSTB-nWi-FET device. Many memory devices such as DRAM, NOR and NAND Flash (floating gate, trap-based, and ferroelectric based), SRAM and others stand alone or embedded semiconductor products can be fabricated using VSTB-FET as the basic building device and basic fabrication method. The absence of the doping in VSTB results in absence of Vth variability related to the random dopant fluctuation which is the main component of Vth variability in the standard CMOS technology based on the highly doped substrate. Low Vth variability brings VSTB-FET to be suitable for all the high performance ULSI, microprocessors, SRAM, DRAM, Flash, many analog, RF, CMOS IS (Image Sensors), and System-On-Chip (SoC) applications.

Objects and advantages will become apparent to those skilled in the art from the following detailed description read in conjunction with the appended claims and the drawings attached hereto.

BRIEF DESCRIPTION OF THE DRAWINGS

FIG. 9a through FIG. 9g are cross-sectional illustrations of the self-aligned approach of the VSTB formation process.

FIG. 10 is a process flow fragment for the SD formation.

FIG. 11a through FIG. 11f are cross-sectional illustrations of the SD formation process. Protection layer (403) formed on the top of the dummy filled gate area (402) is optional for a higher manufacturability of SD formation process is shown only in FIG. 11a and not shown in other FIG. 11b through FIG. 11f for clarity of illustration.

FIG. 12a, FIG. 12b, and FIG. 12c are cross-sectional illustrations of the gate stack formation process and its location with respect to the Source/Drain depth.

ESL (301), ILD (102), and Protection layer (103) are not shown for more clear illustration of functioning the key device layers.

Figure 15A:
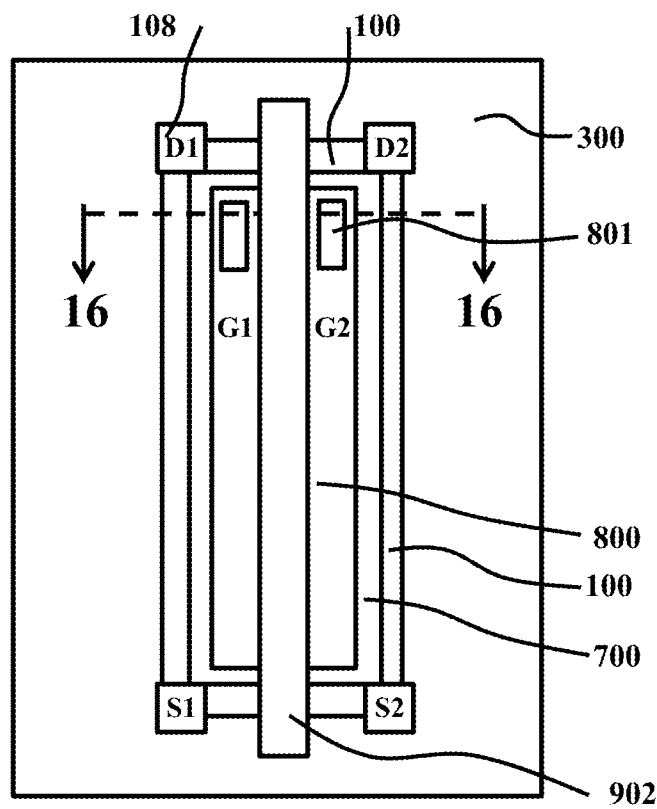
FIG. 15a is a layout view of a particular embodiment of VSTB-FET devices where 2 MOSFET's with the isolated gates are formed in the same active area. The very top layers.
Figure 15B:
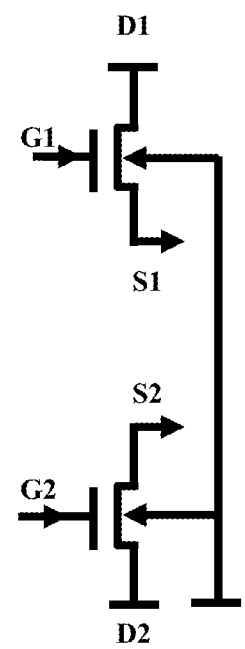

FIG. 15*b* is an electrical equivalent circuit of the two separate VSTB-FET devices formed in a single active area.

Figure 16:
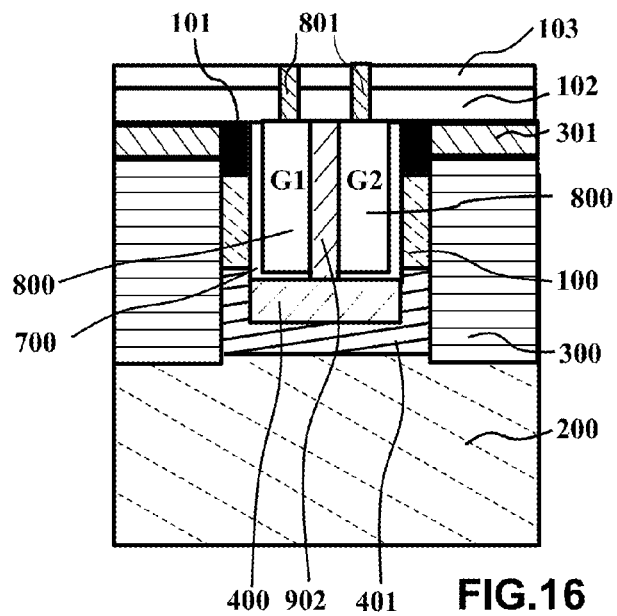

FIG. 16 is a cross-sectional view of a particular embodiment of the VSTB-FET devices where 2 MOSFET's with the isolated gates are formed in the same active area.

FIG. 17*a* through FIG. 17*f* are sets of cross-sections is shown to illustrate the evolution of the SD in SD formation process when a protection layer is implemented.

Figure 18A:
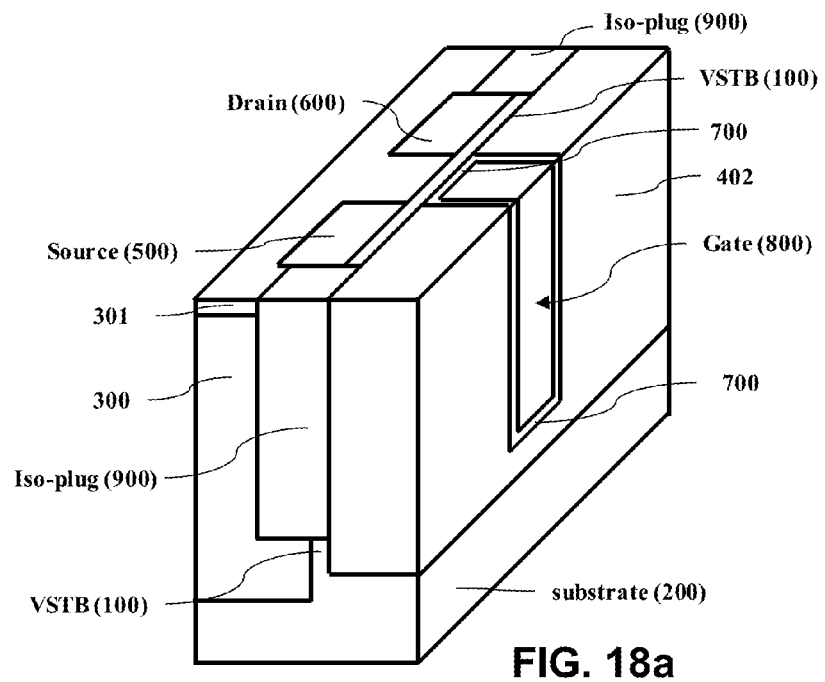

FIG. 18*a* is a schematic 3D view of a VSTB-FET with SD self-aligned to the Gate and VSTB by 2-Dimensional self-alignment (2DSA) process.

Figure 18B:
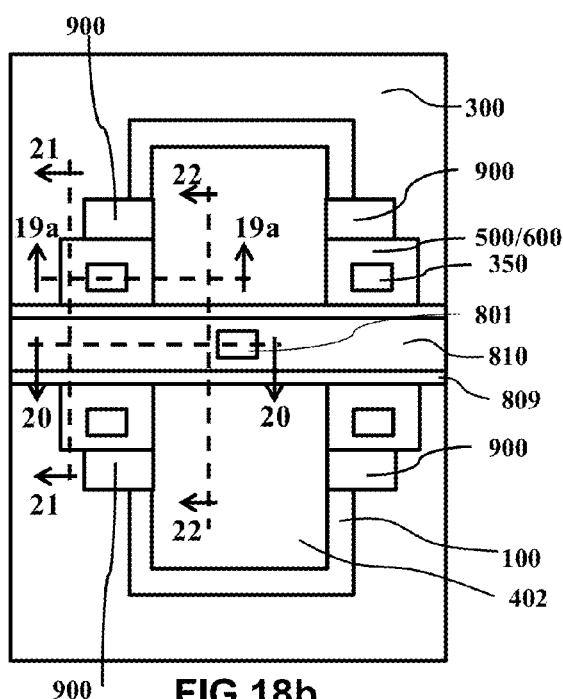

FIG. 18*b* is a top view of two VSTB-FET's having the common gate formed by the 2DSA process. Layers 102, 103 and 340 are removed for clarity.

Figure 19A:
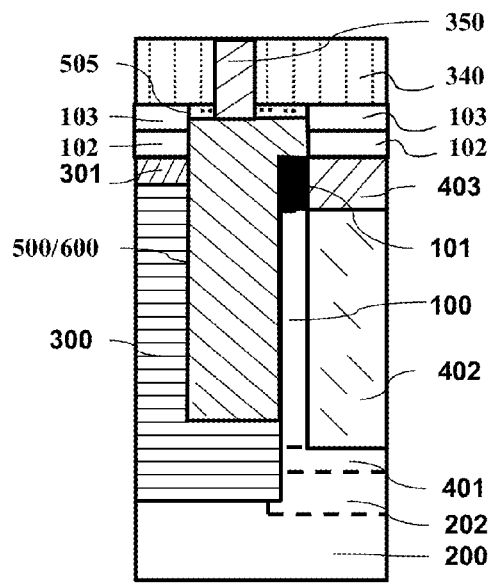
Figure 19B:
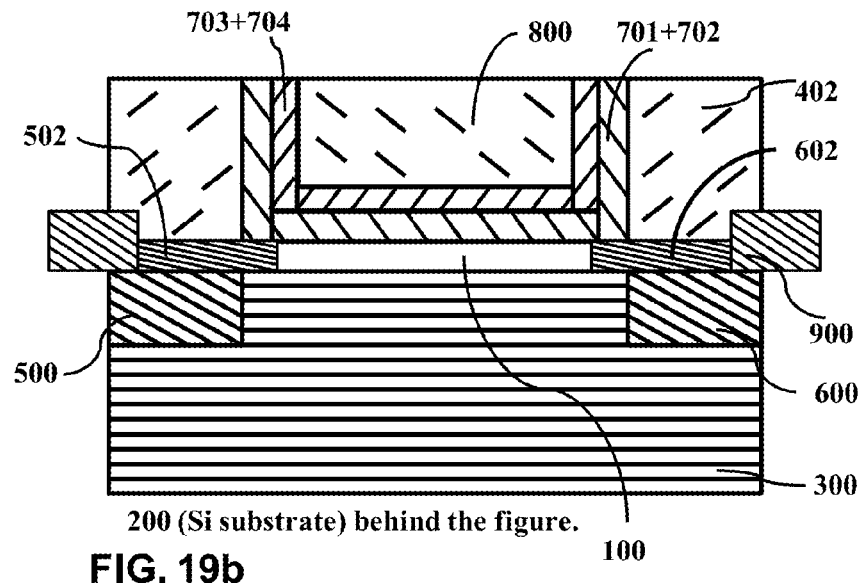

FIG. 19*a* and FIG. 19*b* are vertical at the source-to-isolation area overlap location and horizontal at the mid-depth of VSTB cross-sectional views to illustrate all the principle layers of the VSTB-FET formed by the 2-Dimensional self-alignment (2DSA) process shown in FIG. 18*b*.

Figure 20:
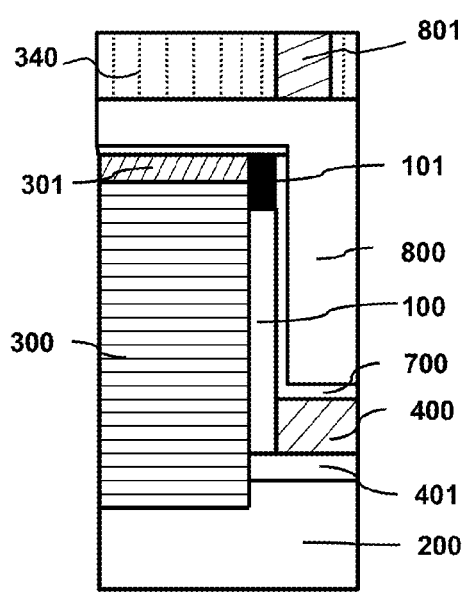

FIG. 20 is a cross-sectional view of the VSTB-FET formed by the 2-Dimensional self-alignment (2DSA) process: 20-20 cross-section in FIG. 18.

Figure 21:
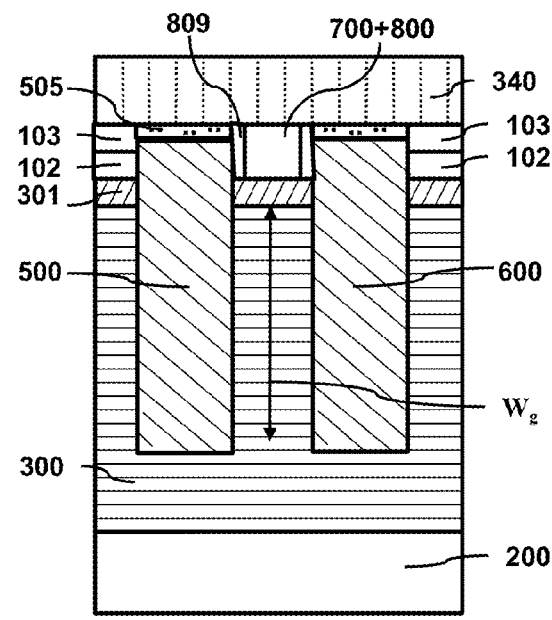

FIG. 21 is a cross-sectional view of the VSTB-FET formed by the 2-Dimensional self-alignment (2DSA) process: 21-21 cross-section in FIG. 18.

FIG. 22 is a cross-sectional view of the VSTB-FET formed by the 2-Dimensional self-alignment (2DSA) process: 22-22 cross-section in FIG. 18.

FIG. 23*a* is a top view of the VSTB-FET device formed as a circular SOI VSTB-FET device with the vertical channel in a single active area.

FIG. 23*b* is an electrical equivalent circuit of the circular SOI VSTB-FET devices formed in a single active area.

FIG. 23*c* is a cross-sectional view of the final structure according to the modified embodiment for forming the SOI VSTB-FET device with the vertical channel.

FIG. 23*d* is a top view of the VSTB-FET CMOS inverter formed in two active areas as a couple of SOI VSTB-FET devices with the vertical channel in a single active area with the body connected to an external contact each. 2 L-shaped areas drawn by the dashed lines illustrate the mask shape for ion implantation of p-type and n-type for Source/Drain and body contact formation.

FIG. 23*e* is an electrical equivalent circuit of CMOS inverter formed as a couple of SOI VSTB-FET devices with the vertical channel in a single active area with the body connected to an external contact.

FIG. 24*a* is across-section views of the initial structure according to the preferred embodiment for forming the true SOI VSTB-FET device.

FIG. 24*b* is a cross-section view of the final structure according to the modified embodiment for forming the true SOI VSTB-FET device.

FIG. 25 is a cross-section view of the final structure according to the modified embodiment for forming a nanowire based transistor called VSTB-nWi-FET device.

Figure 26A:
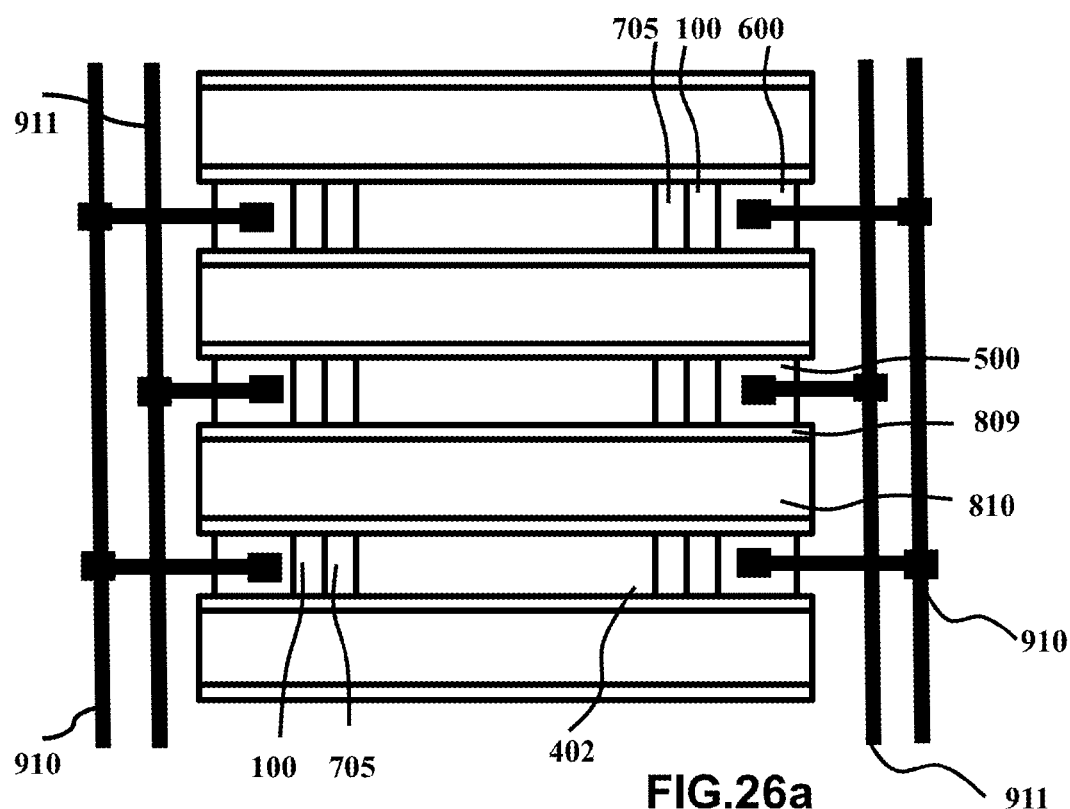

FIG. 26*a* is a layout view of a NOR 1T Flash cell with 1 transistor and 2 bits per cell fabricated using VSTB-FET design where a ferroelectric dielectric stack (such as $SiO_2$-$SrTiO_3$, $Pb(TiZr)O_3$, $Sr_2(TaNb)_2O_7$ and the like) or SONOS (TANOS and the like) stack is formed as the gate stack. By repeating this column of cells to the left and to the right a NOR Flash array can be formed with 2 bits per cell.

Figure 26B:
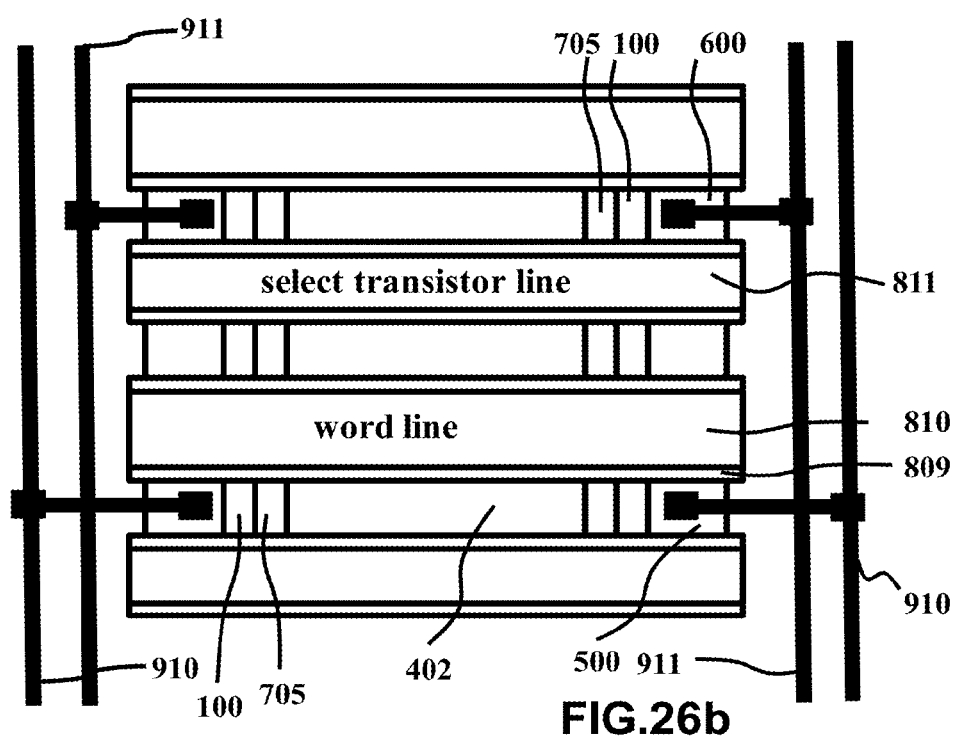

FIG. 26*b* is a layout view of the NOR 2T Flash device design with 2 transistors and 2 bits per cell fabricated with 2DSA method where Source/Drain and doped layer between the Word Line (WL) and Select Line (SL) are formed in self-aligned way w.r.t. the VSTB, WL, and SL.

Figure 26C:
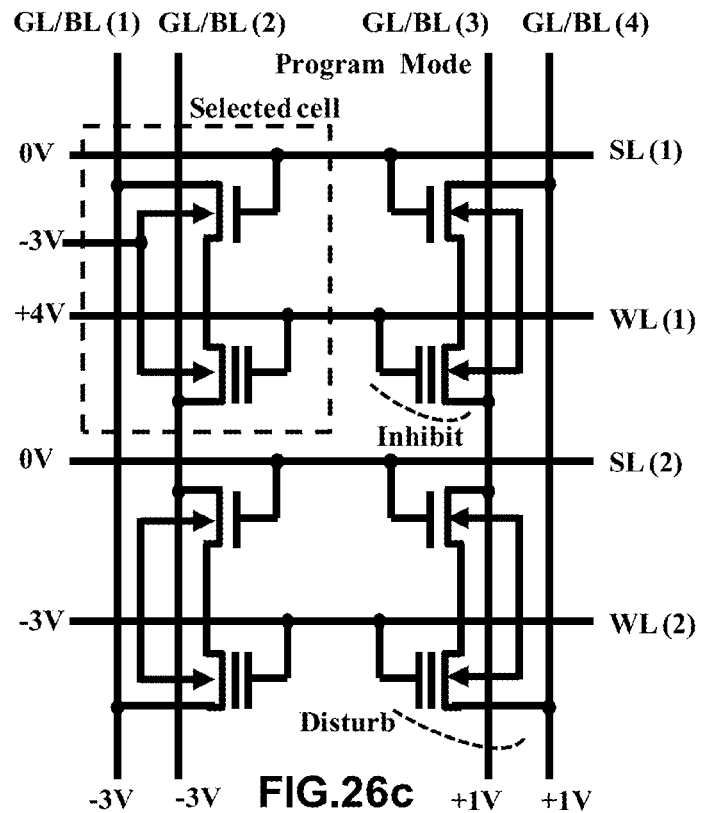

FIG. 26*c* is an electrical equivalent circuit of a NOR 2T Flash cell with 2 bits per cell in Program mode. Voltage magnitudes marking WL, BL, GL (Ground Line), and the substrate node are shown as an example of the voltage magnitudes and signs of those voltages and the real voltages are determined by a particular cell design, types of barrier and memory materials, and thicknesses of choice. Dashed lines show some disturb locations for which the requirements are more relaxed as compared to the planar MOSFET design due to the non-doped VSTB and fully-depleted mode of operation reducing the disturb electric fields in the memory stack significantly.

Figure 26D:
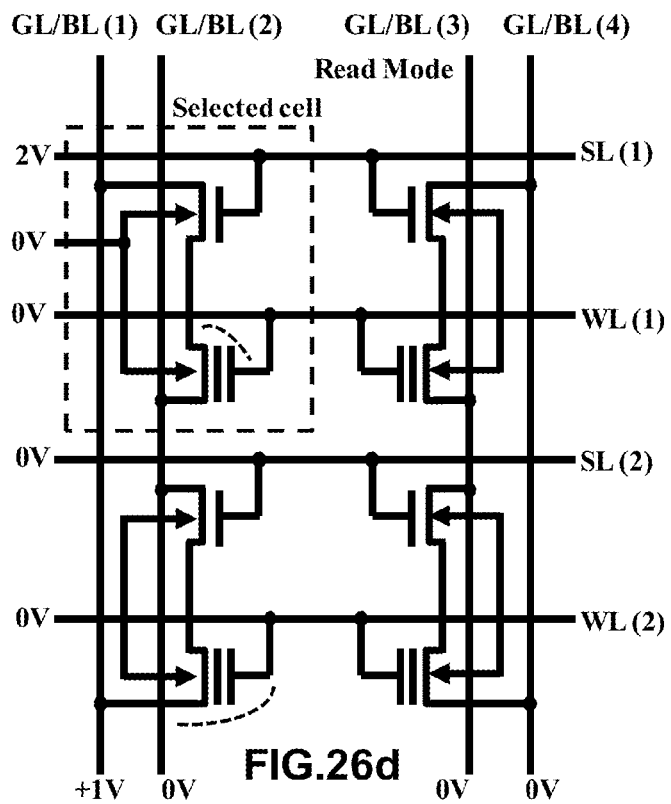

FIG. 26*d* is an electrical equivalent circuit of a NOR 2T Flash cell with 2 bits per cell in Read mode. Voltage magnitudes marking WL, BL, GL (Ground Line), and the substrate node are shown as an example of the potential scale and signs of those voltages and the real voltages are determined by a particular cell design, types of barrier and memory materials, and thicknesses of choice. Dashed lines show some disturb locations for which the requirements are more relaxed as compared to the planar MOSFET design due to the non-doped VSTB and fully-depleted mode of operation reducing the disturb electric fields in the memory stack significantly.

Figure 27A:
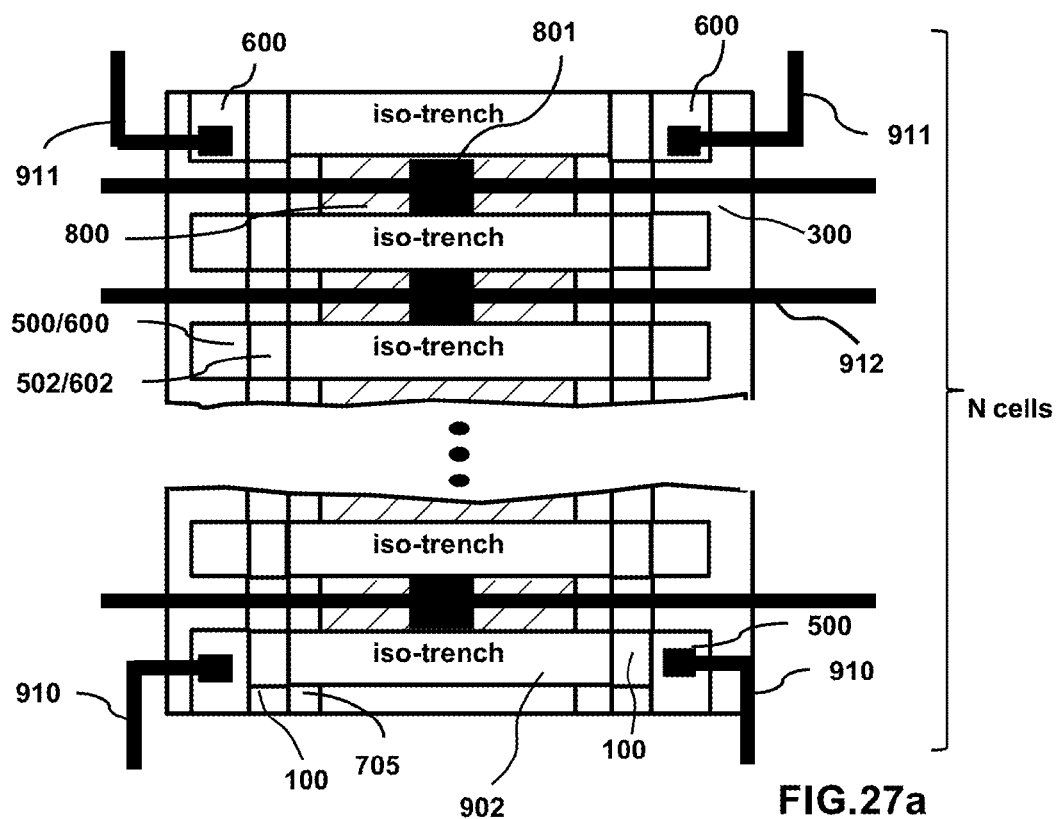

FIG. 27*a* is a layout view of a NAND Flash column with 2 bits per cell fabricated using VSTB-FET design with Source/Drain along column VSTB used for low resistive connection along the column VSTB where a ferroelectric dielectric stack (such as $SrTiO_3$ and the like) or trap-based memory stack (TANOS, SONOS and the like) is formed as the gate stack. By repeating this column to the left and to the right a NAND Flash array is formed with 2 bits per cell. 912 is a word-line made of metal-zero (marked elsewhere by number 810), Me1 interconnects, or metal-zero strapped by Me1.

Figure 27B:
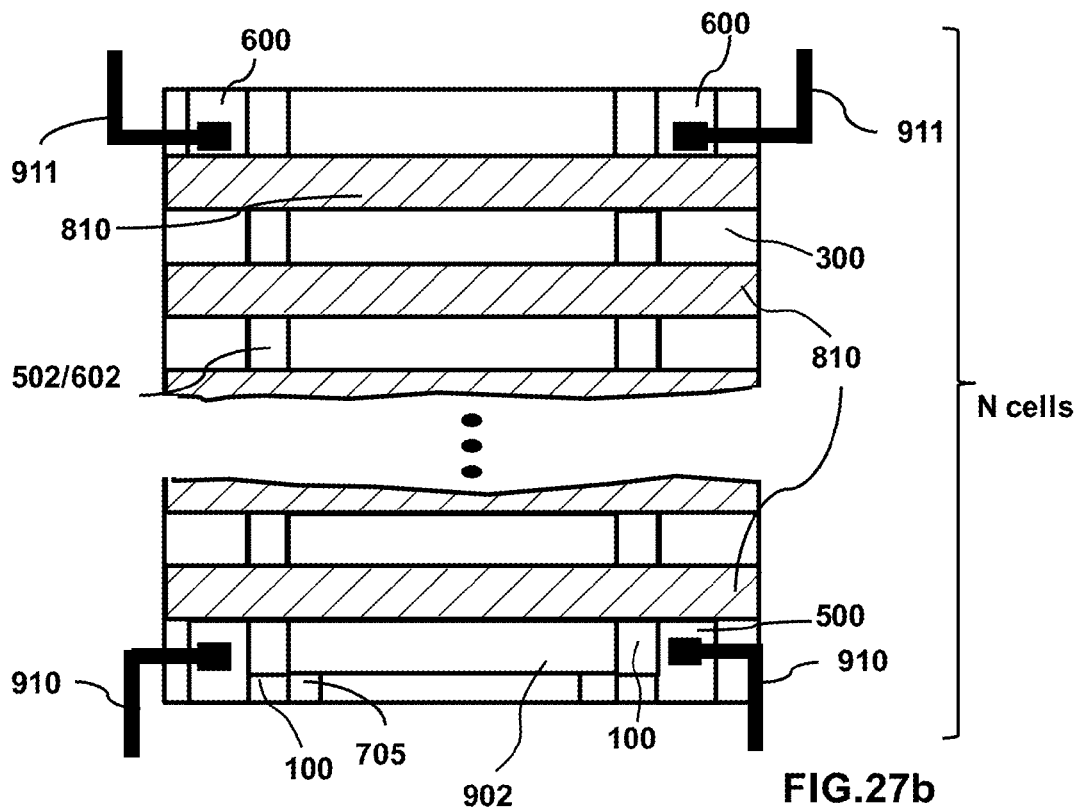

FIG. 27*b* is a layout view of a NAND Flash column with 2 bits per cell fabricated using VSTB-FET design with no Source/Drain used for low resistive connection along the column VSTB having highly doped those portions of VSTB column against the iso-trenches formed in the gate area and where a ferroelectric dielectric stack (such as $SrTiO_3$ and the like) or trap-based memory stack (TANOS, SONOS and the like) is formed as the gate stack. By repeating this column to the left and to the right a NAND Flash array is formed with 2 bits per cell. 912 is a word-line marked by 810 here if made of metal-zero.

Figure 28A:
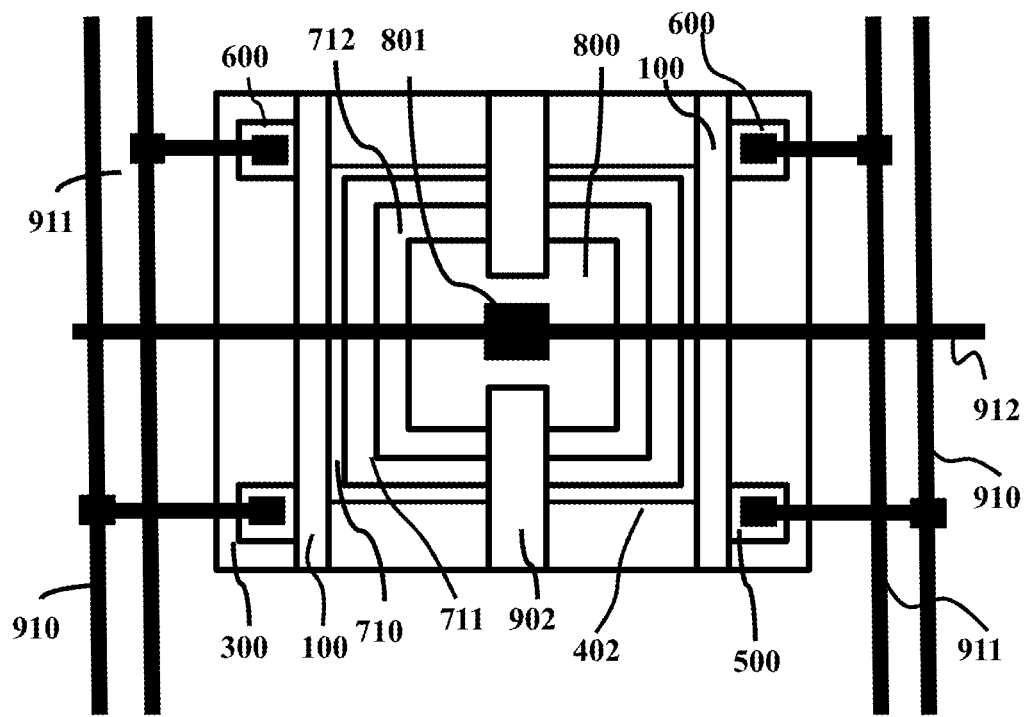

FIG. 28*a* is a layout view of a NOR FG Flash 2 bits cell fabricated using the preferred embodiment of the VSTB-FET design where the floating gate is included in the dielectric stack as a part of the gate stack. Iso-trenches parallel to the VSTB string are needed to isolate the FG from each other in a single active area. By repeating this cell upward and downward and to the left and to the right a NOR Flash array can be formed with 2 bits per cell.

Figure 28B:
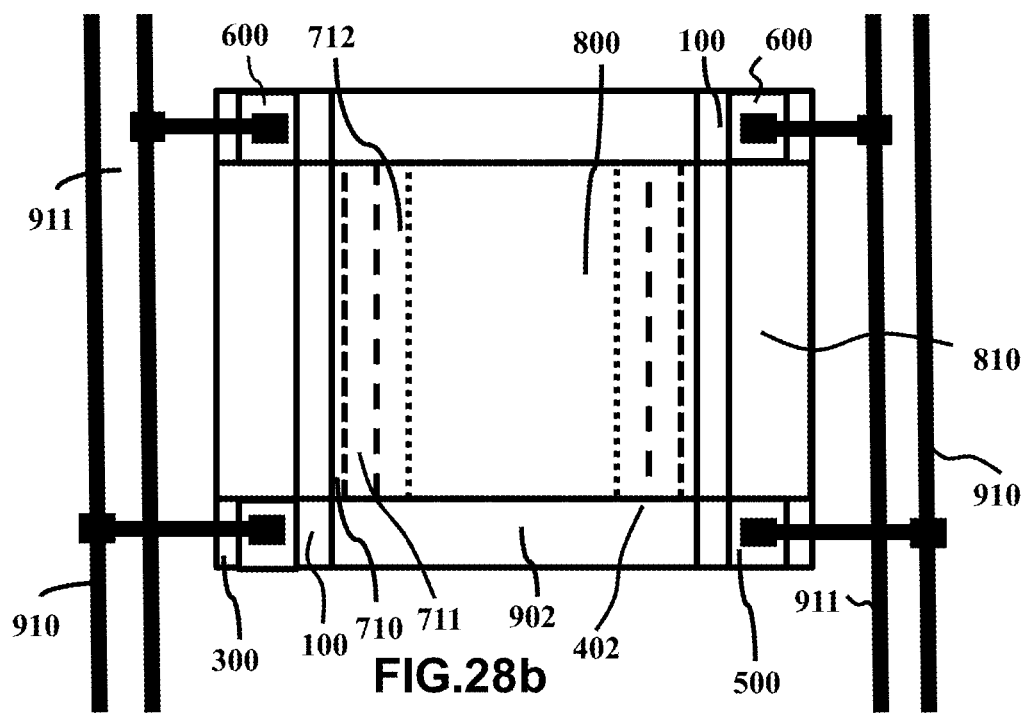

FIG. 28*b* is a layout view of a NOR FG Flash 2 bits cell fabricated using VSTB-FET design featuring 2DSA where the floating gate is included in the dielectric stack as a part of the gate stack. Iso-trenches perpendicular to the VSTB string is needed to isolate the FG from each other in a single cell string. Repeating this cell upward and downward and to the left and to the right a NOR Flash array can be formed with 2 bits per cell.

FIG. 29a is a layout view of a NAND FG Flash column with 2 bits per cell where the floating gate is included in the dielectric stack as a part of the gate stack with the iso-trenches formed to isolate the FG from each other in a single column having the VSTB-FET device design with Source/Drain at the STI side on the opposite side from iso-trenches formed for low resistive connection along the column VSTB. By repeating this column to the left and to the right a NAND FG Flash array is formed with 2 bits per cell.

Figure 29C:
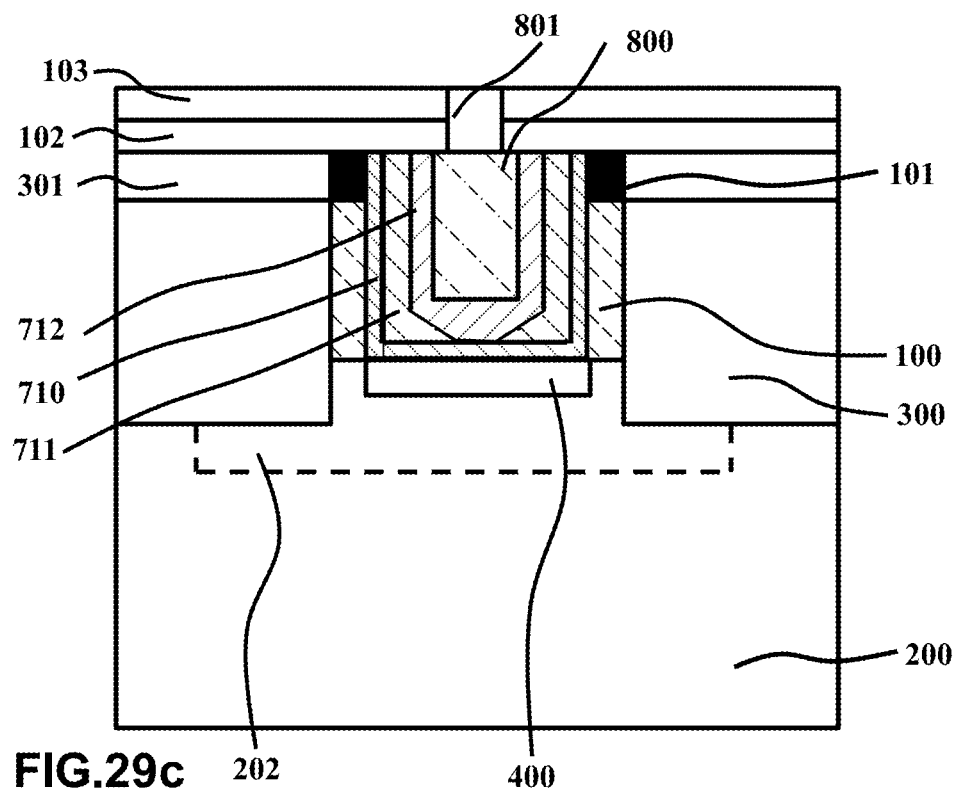

FIG. 29b and FIG. 29c are a layout view of a NAND FG Flash column with 2 bits cell using VSTB-FET device design where the floating gate is included in the dielectric stack as a part of the gate stack with iso-trenches formed to isolate the FG from each other in a single column fabricated having no Source/Drain for low resistive connection along the column VSTB and a cross-sectional view showing Floating-Gate tapering-off shape for increasing the floating-gate to control gate capacitive coupling for program voltage reduction. By repeating this column to the left and to the right a NAND FG Flash array is formed with 2 bits per cell.

FIG. 29c is a cut away view of a floating gate in a FG flash array.

Figure 30A:
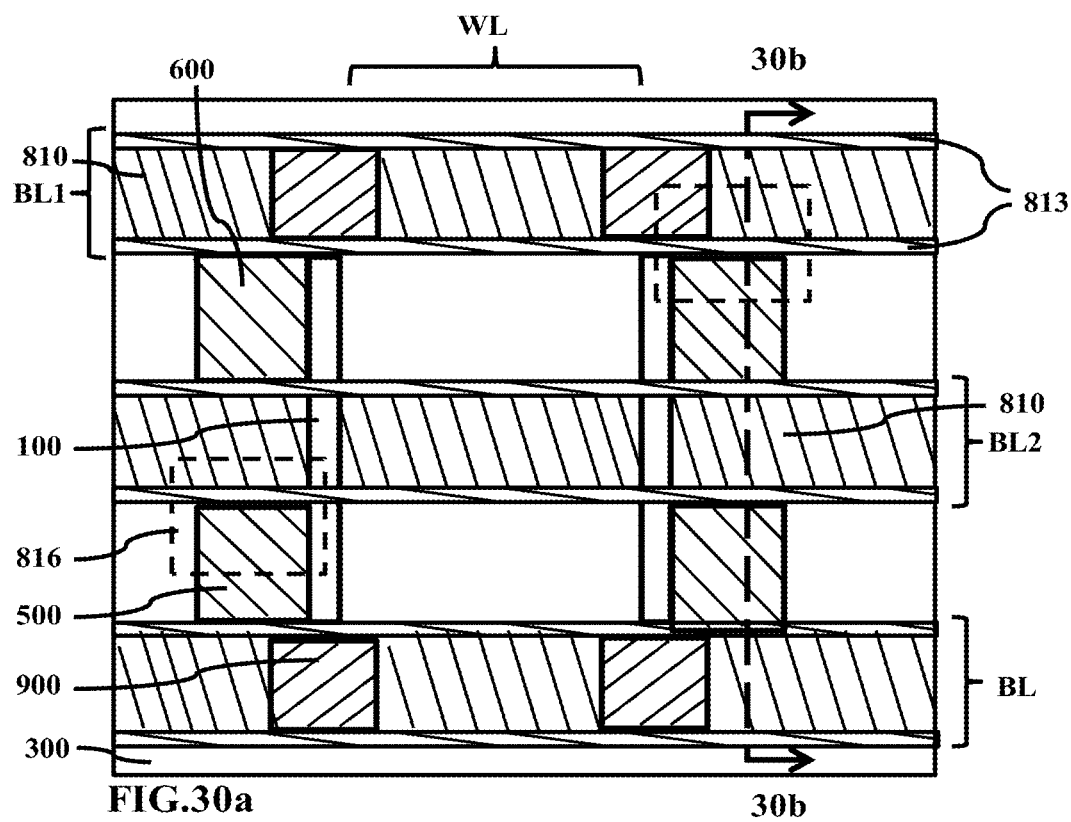

FIG. 30a is a layout view of a DRAM cell group to illustrate the location of BL's, WL, iso-plugs, Drain connected to the Capacitor (not shown), Source connected to the BL.

Figure 30B:
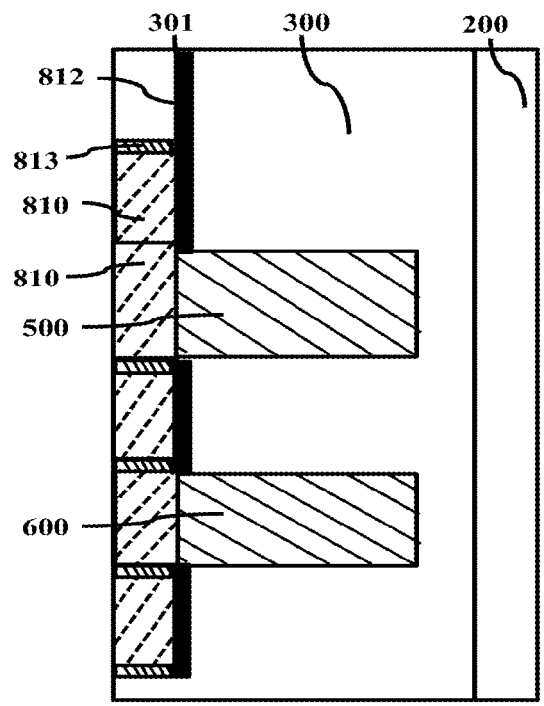

FIG. 30b is a cross-sectional view to illustrate the location of the Drain and Source connected to the BL.

Figure 31A:
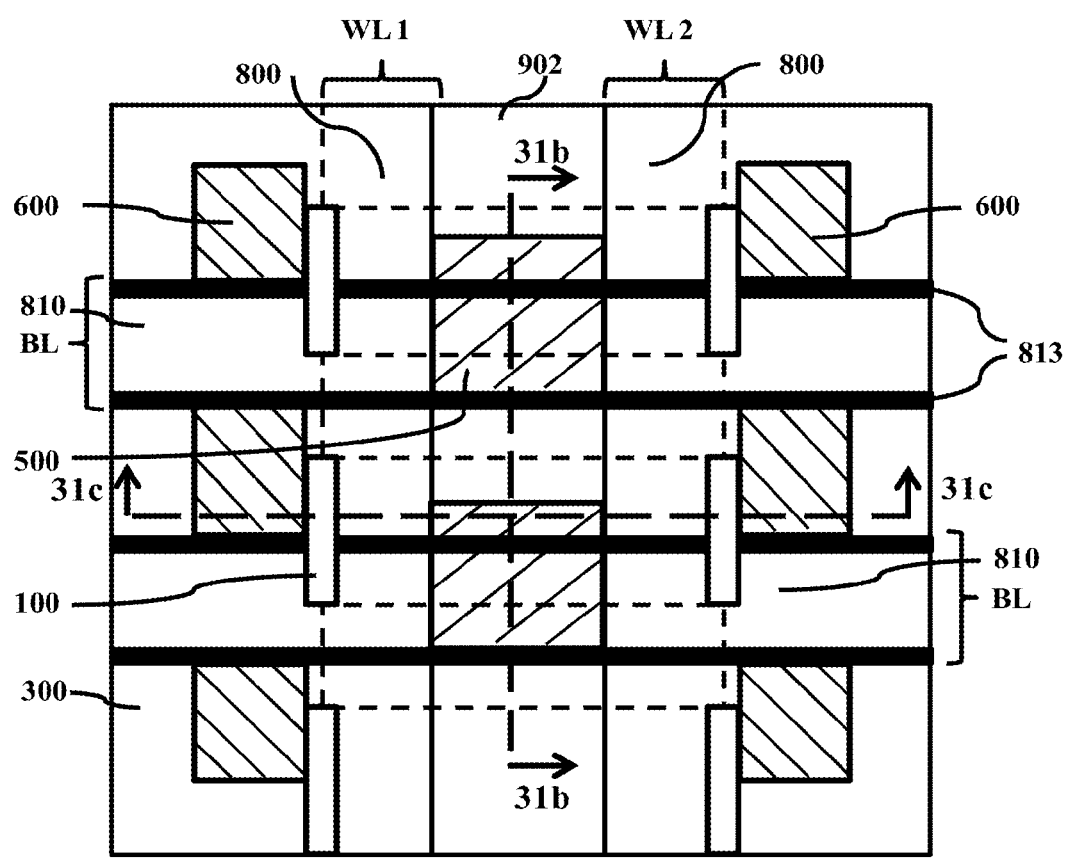

FIG. 31a is a layout view of a DRAM cell to illustrate the location of 2 WL's, 1 BL, Source, Drain, and inter-cell isolation.

Figure 31B:
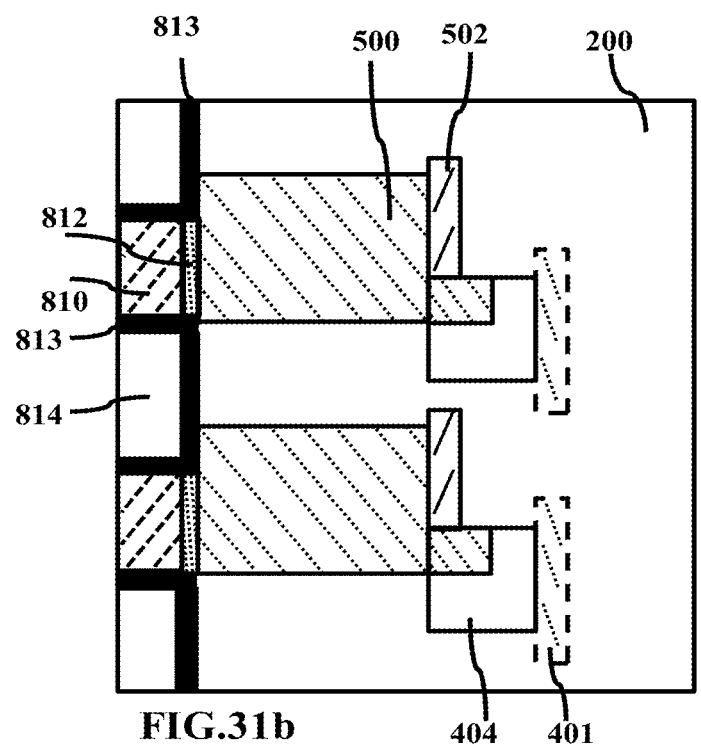

FIG. 31b is a cross-sectional view of a DRAM cell to illustrate the location of BL's, Source and Source regions, and inter-cell isolation at the bottom of the gate area.

Figure 31C:
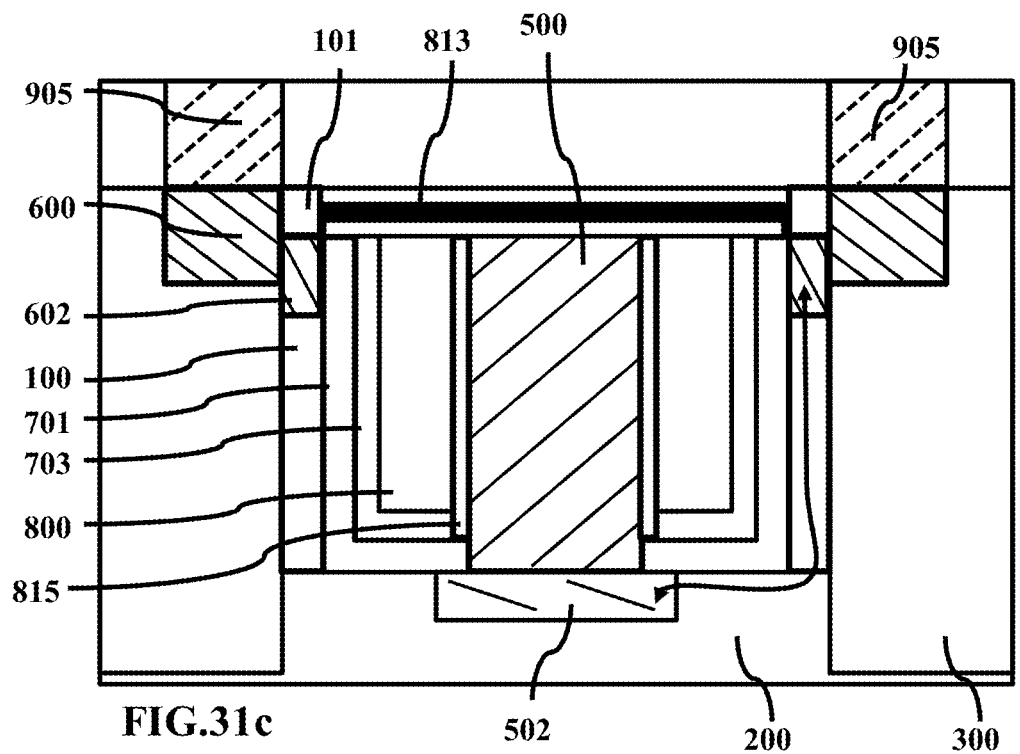

FIG. 31c is a cross-sectional view of a DRAM cell to illustrate the location of WL's, Drains and Drain regions, Source regions, AT channel, and inter-WL isolation. The curve with 2 sided arrows shows the channel current path. DRAM capacitors are connected to the drain contact made of the zero-metal trench and drain contact filling (905). Curve with two arrows indicates the current path from Source to Drain.

Figure 32A:
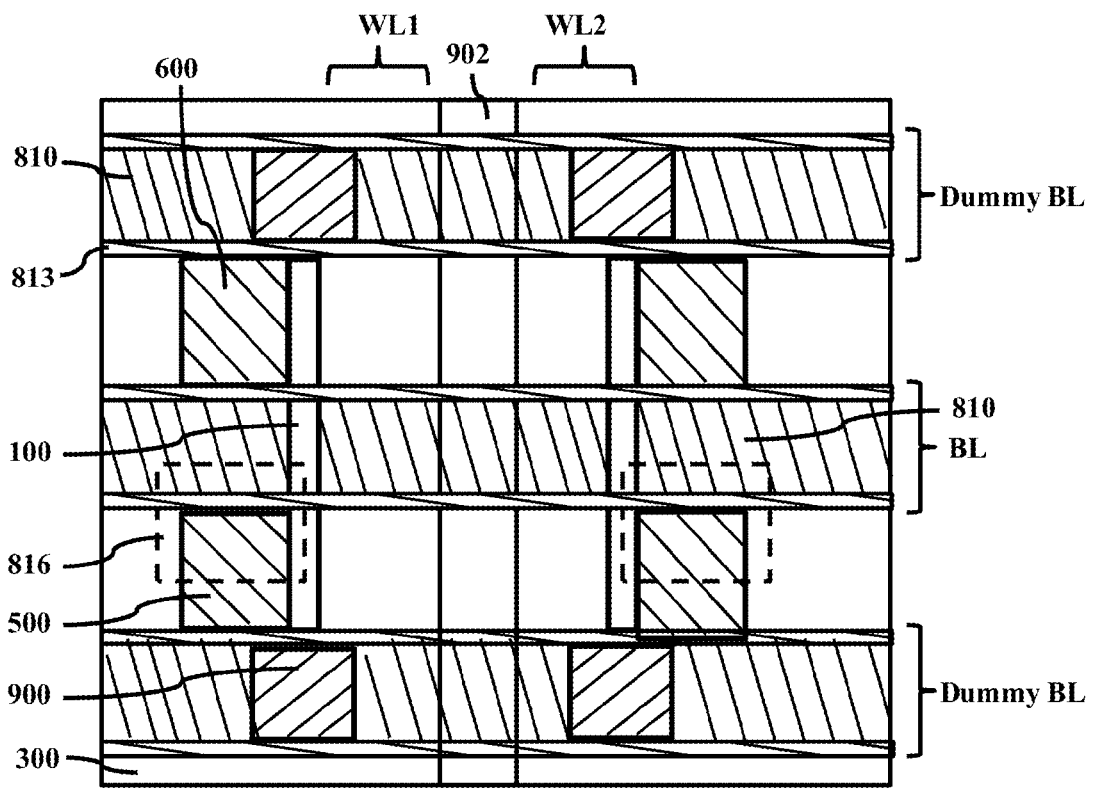

FIG. 32a is a layout view of a DRAM array fragment of architecture with a single BL and 2 WL's having a set of dummy BL's as well, to illustrate the location of BL's, WL, iso-plugs, Drain connected to the Capacitor (not shown), Source connected to the BL.

Figure 32B:
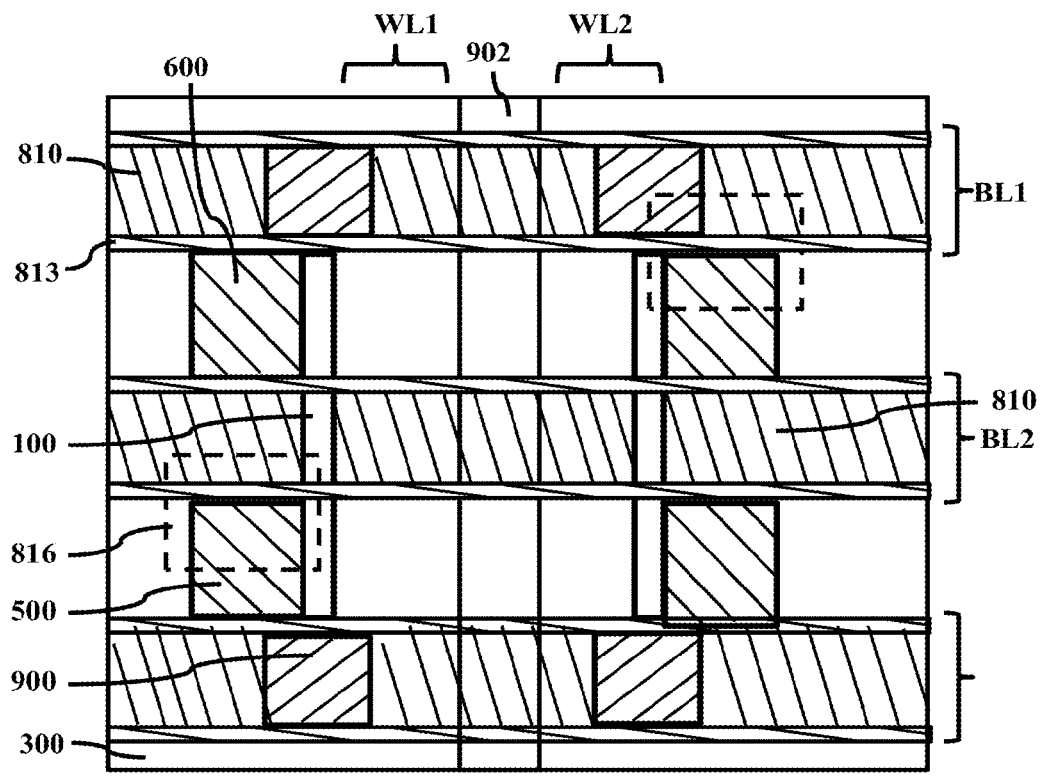

FIG. 32b is a layout view of a DRAM array fragment of architecture with 2BL's and 2 WL's to illustrate the location of BL's, WL, iso-plugs, Drain (connected to the Capacitor, not shown), Source connected to the BL.

Figure 33A:
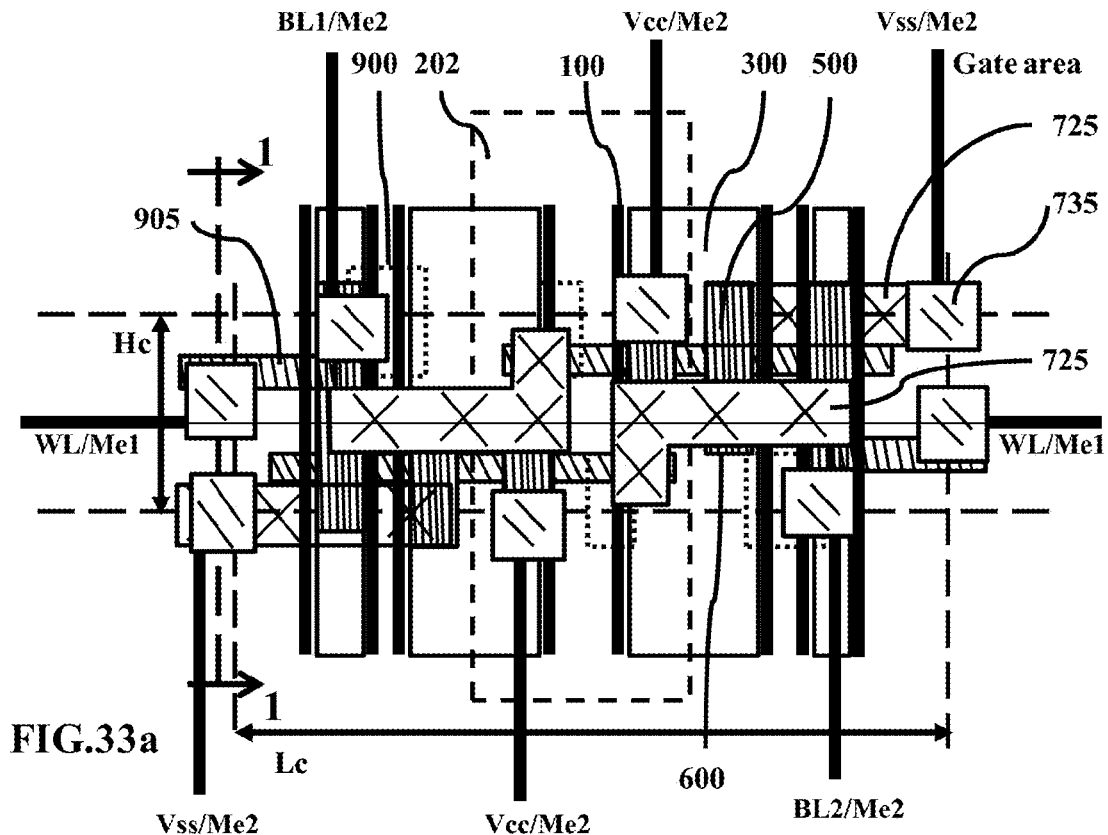

FIG. 33a is a layout view of the SRAM cell fabricated from VSTB-FET devices. Layout of Me1 and Me2 interconnects are not shown but rather they are indicated schematically by black wide lines connected to the contact (735). Hc and Lc arrows indicate the cell size and the long-dashed lines show the cell symmetry lines for mirroring the cell upward/downward and to the left and the right to form the array.

Figure 33B:
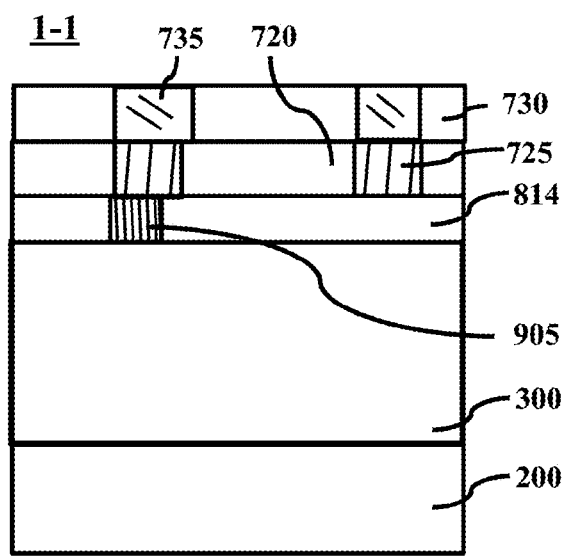

FIG. 33b is a cross-sectional view of the SRAM cell along a plane 1-1 as indicated in FIG. 33a.

FIG. 34a is a cross-sectional view to illustrate the location of the STI buried etch stop layer for SD depth control after the gate area planarization process step.

FIG. 34b is a cross-sectional view to illustrate the location of the Source/Drain bottom surface at the STI buried etch stop layer after the Source/Drain area is opened.

FIG. 35a is a cross-sectional illustration of the counter-doping of a portion of VSTB and a portion of the substrate in a single active area to form a couple of CMOS inverters with the common gate in a single active area if desired to significantly increase the transistors density.

FIG. 35b is a top view illustration of the counter-doping of the VSTB and the substrate in a single active area to form a couple of CMOS inverters with the common gate in a single active area.

Figure 35C:
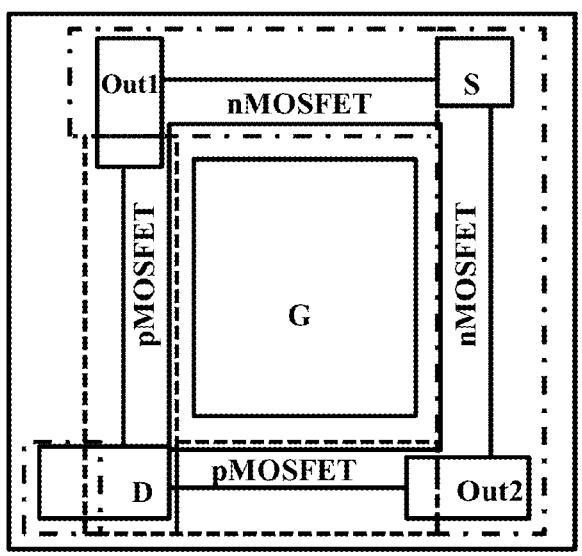

FIG. 35c is a top view as in a layout of a couple of CMOS inverters with the common gate formed in a single active.

Figure 35D:
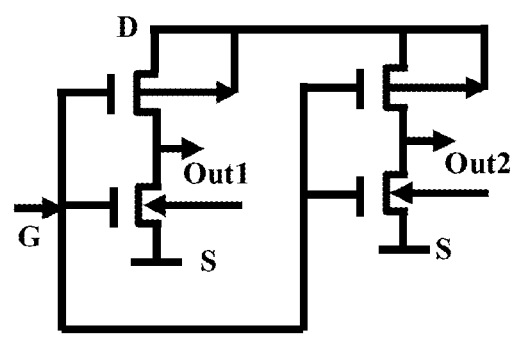

FIG. 35d is an electrical equivalent circuit of the couple of CMOS inverters with the common gate formed in a single active area. A skilled in art specialist can design a lot of varieties of IC blocks which can have 4 and more inverters in a single active area.

DETAILED DESCRIPTION OF THE INVENTION

The present invention is a novel vertical super-thin body (VSTB) field effect transistor (FET) structure (VSTB-FET) and its methods of fabrication. In the following description numerous specific details are set forth in order to provide a thorough understanding of the present invention. In other instances, well-known semiconductor process and manufacturing techniques have not been described in particular detail in order to not unnecessarily obscure the present invention.

In an embodiment of the present invention, the VSTB-FET is a semiconductor on bulk c-Si transistor. The VSTB-FET is ideal for use in fully depleted VSTB transistor applications where the body electrical connection to the wafer substrate is essential, as illustrated in FIG. 4, FIG. 5a, and FIG. 5b.

The present invention is a semiconductor device comprising a semiconducting low doped vertical super-thin body (VSTB) connected to a vertical wall of a dielectric body, such as the STI, having the connection to the bulk semiconductor substrate at the bottom side, isolation at the top side, and the channel and the gate stack (GS) consisting of gate dielectric stack (GDS), metal gate stack (MGS), and gate electrode filling (GEF) on the opposite to the dielectric body (STI side) VSTB surface. Source and Drain (SD) are formed in the dielectric body connected to the VSTB on the opposite sides of the gate resulting in VSTB-FET. The body is formed self-aligned to the STI hard mask edge allowing a very tight control of the body thickness. Source and Drain are formed before the gate stack formation ("Gate last approach") by using dummy dielectric filling (such as SiO2 or the like) in the volume where the GS is going to be. Source and Drain are made by etching trenches/holes vertically in the STI adjacent at the STI side to the VSTB and depositing in to the trenches/holes a thin heavily appropriately doped poly-Si layer followed with an anneal to driven-in doping from the poly-Si into SD regions of VSTB. Doped poly-Si is covered with low resistivity materials stack (typically a barrier layer and a metal layer) like any appropriate silicides or/and inert metal or metal nitrides, and the rest of the volume filled in with an inert conductive material (such as Tungsten), and finished with the surface planarized by using chemical-mechanical polishing (CMP). If desired, a recess of the SD filling can be formed filled with a dielectric (such as SiN and the like) selective in etch to SiO2 and the like. The device is very flexible in accommodating the Schottky barrier Source/Drain in a very efficient way. "Gate first approach" can be also easily implemented depending on applications and lithography capabilities available. Single or multiple VSTB devices can be fabricated in a single active area with VSTB isolation by iso-plugs combined with gate electrode isolation by iso-trenches. For a high radiation hardness applications the body can be easily made as a VSTB SOI MOSFET with the current flowing horizontally from Source to Drain in the VSTB channel or vertically with Source fabricated at the bottom and Drain fabricated at the top. Also the device can be made as a set of nanowires on an isolating wall of the dielectric body such as the STI wall to be a nanowire-based VSTB-nWi-FET SOI device.

Figure 4:
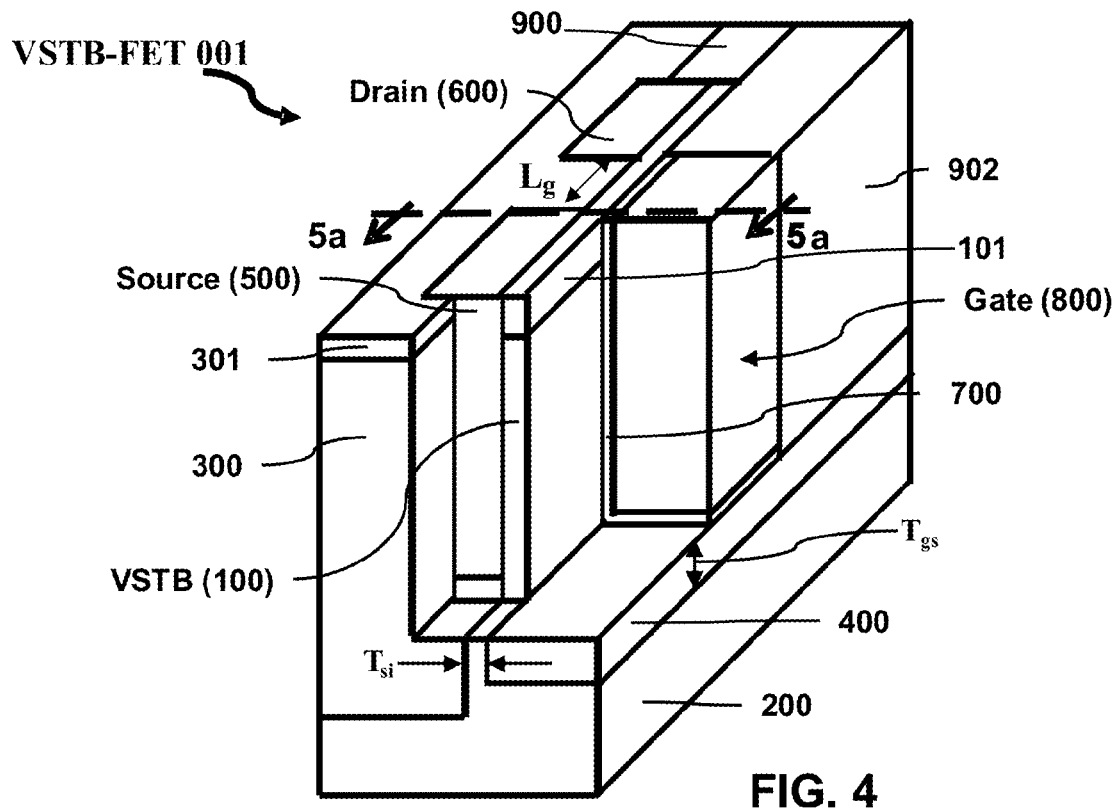
FIG. 4 is a 3D illustration of all the principle layers of the invention. Some parts are removed for clarity of the locations of the most important layers.
Figure 5A:
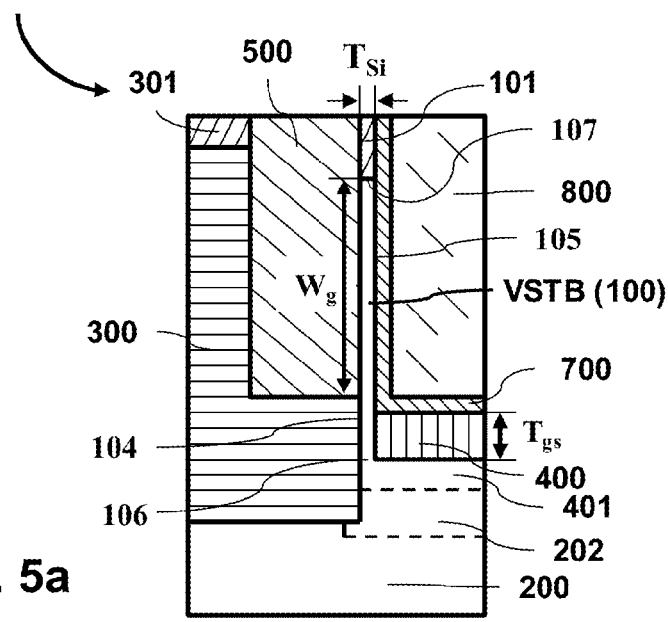
FIG. 5a and FIG. 5b are vertical at the gate-to-source overlap location and horizontal at the mid-depth of VSTB cross-sectional views to illustrate all the principle layers of the VSTB-FET.
Figure 5B:
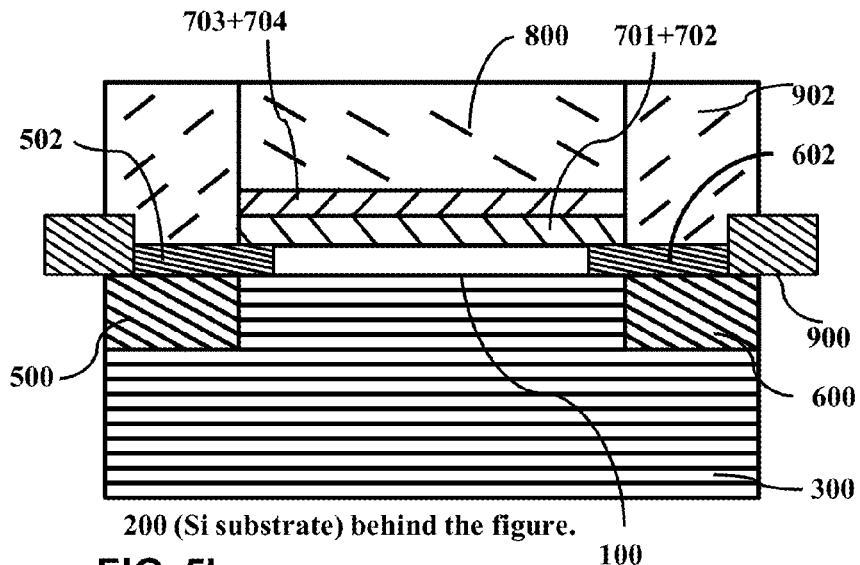

An example of VSTB-FET 001 in accordance with a preferable embodiment of present invention is illustrated in FIG. 4, FIG. 5a, and FIG. 5b. VSTB-FET 001 is formed according to the embodiment of a process integration flow 002 shown in FIG. 6. Source/Drain holes/trenches etching and filling can be formed after Gate stack formation (Traditional "Gate first" approach) since a much less thermal budget is needed for dopant drive-in and activation due to using VSTB. VSTB-FET 001 is formed on the semiconductor substrate 200 such but not limited to monocrystalline silicon, germanium, gallium arsenide substrates and the like.

Referring now to FIGS. 4 and 5a, VSTB-FET transistor 001 includes a semiconductor body 100 formed on bulk semiconductor substrate 200 or on a stack such as semiconductor-on-isolator (SOI). Semiconductor body 100 can be formed of any well-known semiconductor material, semiconductor-on-semiconductor stack, or semiconductor material-on-isolator, including but not limited to monocrystalline (c-Si) or polycrystalline silicon (poly-Si), germanium (Ge), silicon germanium (SixGey), gallium arsenide (GaAs), GaP, GaSb, InSb, carbon nanotubes (C-nT), and Graphene or Graphene-c-Si-stack (deposited onto the dielectric body wall formed of dielectric stack such as SiO2(STI)-BN (Boron-Nitride barrier) wall, SiO2 STI wall, or c-Si VSTB and the like and integrated into a VSTB-FET according to Process 100P. Semiconductor body 100 can be formed of any well-known material which can be reversibly altered from an insulating state to a conductive state by exploiting the field effect which provides near-surface conductive changes by applying external electric potential controls. In a one preferred embodiment, when the best electrical performance of VSTB-FET transistor 001 is desired, semiconductor body 100 is ideally a single crystalline film. For example, semiconductor body 100 is a single crystalline film when VSTB-FET transistor 001 is used in high performance applications, such as in Integrated Circuits (IC) with a high density circuit, such as a microprocessor and system-on-chip (SOC). However, Semiconductor body 100 can be a polycrystalline film when the VSTB-FET transistor 001 is used in applications requiring less stringent performance, such as in liquid crystal displays. A dielectric body 300 insulates semiconductor body 100 from other FET and forms interface with VSTB that provides a good electrostatic control of the gate voltage over the entire body between Source 500 and Drain 600. The dielectric body 300 is named the STI or the dielectric body in equivalent sense further on in this description. In an embodiment of the present invention, semiconductor body 100 is a single crystalline silicon film. Semiconductor body 100 has a pair of laterally opposite sidewalls 104 and 105 separated by a distance which defines a semiconductor body thickness $T_{Si}$. Additionally, semiconductor body 100 has a top surface 107 opposite a bottom surface 106 located at the boundary between the semiconductor body 100 and substrate 200. The distance between the top surface 107 and the bottom surface 106 defines the height of the semiconductor body 100. In the embodiment of the present invention the body height is approximately equal to the channel width $W_g$. Actually the channel width is equal to semiconductor body 100 height minus the gate-to-substrate isolation 400 with a thickness $T_{gs}$.

Figure 6:
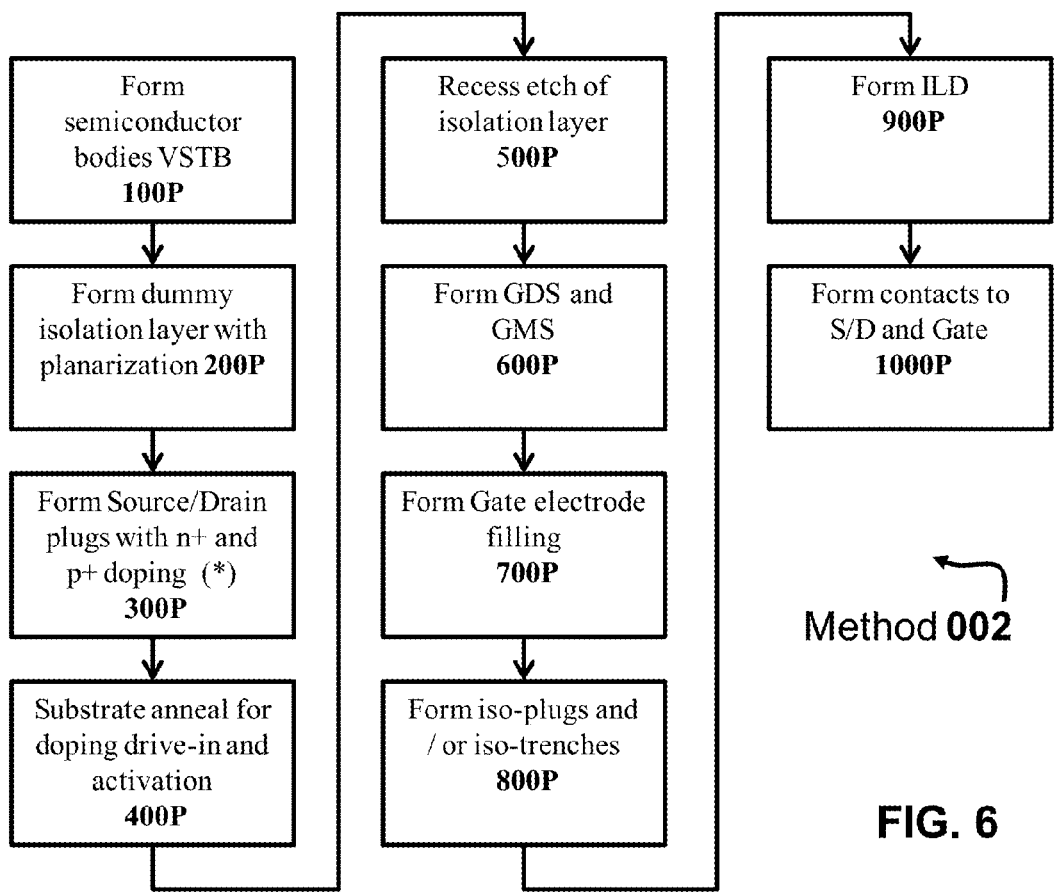
FIG. 6 is a process flow of forming a VSTB-FET device. "Gate last" approach.
Figure 7:
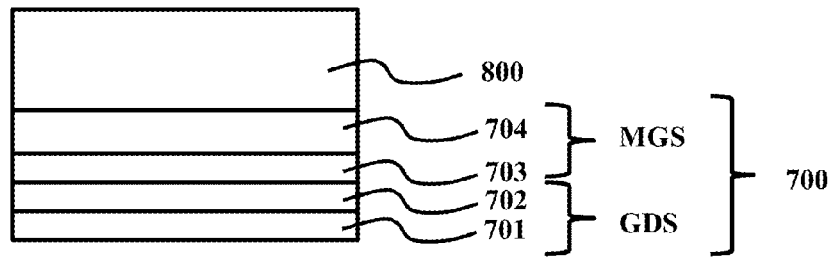
FIG. 7 is a cross-sectional illustration of gate stack comprising the gate dielectric stack (GDS) and gate metal stack (GMS) with gate electrode filling.
Figure 8:
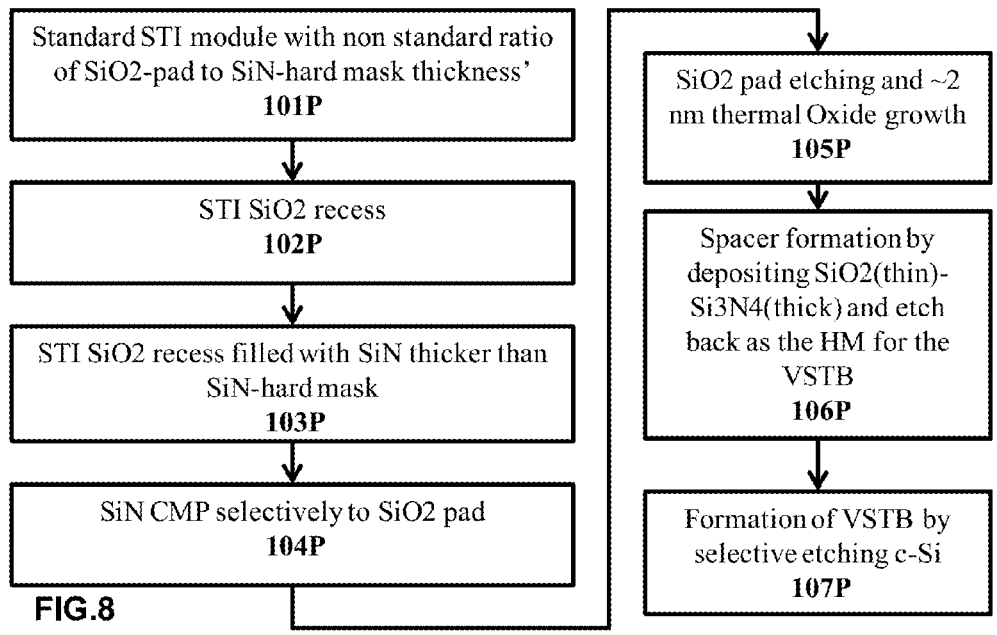
FIG. 8 is a process flow fragment for the self-aligned approach of VSTB formation.

A process flow of VSTB-FET formation is shown in FIG. 6. After process 100P of the VSTB formation by etching the c-Si under STI-hard mask edge spacer, the space opened 404 (the gate area, See FIG. 9g) is filled with the dummy dielectric 402 (such as TEOS SiO2, see FIG. 11a), process 200P. Then after the Sources and Drains are formed, process 300P, a substrate anneal is made for dopant drive-in into VSTB to form SD junctions, process 400P. Then the dummy SiO2 is recessed down leaving at the bottom the dielectric thickness appropriate for reduction of the gate-to-substrate capacitance, process 500P. In the preferred embodiment of the present invention, the VSTB-FET has a channel length $L_g$ which is defined by placement of the Source 500 and Drain 600, see FIG. 4. Source 500 and Drain 600 are formed in a manner self-aligned to the Semiconductor body 100 and formed by etching square or rectangular shaped holes/trenches in the STI along the surface 104 (see FIG. 5a), process 300P, with a separation distance equal to the channel length $L_g$. After the SD hole formation a thin layer of semiconductor (such as poly-Si, SiGe, Ge, and the like) is deposited and doped for n-channel VSTB-FET by any donors (such as Arsenic—As, phosphorus—P) or for p-channel VSTB-FET by any acceptors (such as Boron—B, Indium—In, and the like) using lithography followed with a rapid thermal anneal (RTA), process 400P, to drive in the dopants into VSTB to form Source 502 and Drain 602 junction regions (see FIG. 5b) reaching the opposite surface of the VSTB 105 where the channel under the gate stack 700 and 800 is formed. After the RTA any methods for forming low resistive Source and Drain plugs is used such as forming barrier layer made of such as materials like a metal silicide or conductive metal nitride and filling the rest of the hole space with any high conductive material such as Tungsten, Copper, metal silicides, metal nitrides, and the like and then planarized from the top surface by CMP. If desired to protect metal filling in the SD plug areas from oxygen and moisture contamination resulting in increase the SD resistance and to protect the gate dielectric from metal contaminations coming from SD-plugs a slight recess of the SD-plugs is formed and filled with any dielectric material (such as SiN) or any inert conductive material such as metal nitride with high selectivity to etching of SiO2 and SiN forming a protection layer 505, FIG. 11f. Gate stack formation is described here to illustrate that the VSTB-FET device has such an advantage that it is easy to be integrated with any advanced gate stack. In an embodiment described in more details below a protection layer 403 (see FIG. 11a) made of a material which can be selectively etched with respect to SiO2 and SiN such as poly-Si, Al2O3, and the like is placed on the top of the recessed dummy dielectric 402 to improve the SD mask misalignment manufacturability of the VSTB-FET. The gate electrode is formed as follows. First the protection layer 403 and dummy dielectric 402 layers are etched, process 500P, FIG. 6. Next the gate stack 700, see FIG. 7, which includes the gate dielectric stack (GDS), the metal gate stack (MGS), and the gate electrode filling (GEF) 800 is formed, process 600P. GDS stack includes an interfacial layer 701 (such as an ultra thin SiO2) and a high-k (such as HfO2, ZrO2, HfO2- and ZrO2 silicates, and the like) layer 702. MGS includes the $1^{st}$ metal gate layer, metal stack, or composite 703 as the barrier layer prohibiting any interaction between the high-k and the Work-function materials, $2^{nd}$ layer providing the correct work functions for n-channel VSTB-FET (being about 4 eV) and p-channel VSTB-FET (being about 5 eV), and a conductive barrier layer, stack or composite 704 for suppressing interaction of the work function determining gate material with the gate electrode filling (such as poly-Si or W, or the like), process 700P. To isolate VSTB-FET's belonging to the same VSTB string in an active area the isolation plugs 900 are to be formed (iso-plugs), process 800P.

An alternate method of creating a VSTB without the use of a hard mask spacer would use a high resolution lithography process (EUV). This would involve the placement of photo resist in a such a manner as would provide similar etch protection as a hard mask spacer.

Referring now to FIG. 5b, in order to isolate the gate electrodes formed in a single active area but belonging to different VSTB-FET's the isolation tranches 902 (iso-trenches) are to be formed, process 800P. Since the depth of etching is about the same for both iso-plug and iso-trenches they can be formed with a single mask in a single litho step and the same dielectric filling process. Unselective etching of different materials is made and the iso-plugs and iso-trenches are filled with a dielectric such as TEOS SiO2, TEOS SiO2(N) enriched with Nitrogen, Si3N4-SiO2 stack and the like with as small dielectric constant as possible, followed with CMP to planarize the surface. ILD stack consisting on at least two layers such as SiO2 and S3N4 are deposited on the top of the planarized structure, process 900P. Contacts through ILD to the Source, Drains, Gates, and substrate/n-well are formed, process 1000P, to finish the FEOL integration process.

Due to a very original integration scheme some key processes like VSTB formation process, Source/Drain formation process, and Gate stack formation process need to be considered in more details.

VSTB formation process module. There is no accurate lithographical method to make such a thin layer of VSTB in the range of 10 nm to 2 nm or such. A few methods can be foreseen to form it using the STI hard mask edge step by forming a spacer, which can serve as hard mask for the VSTB formation. Usage of a spacer processing to make a small mask has been known for a while but it is not directly applicable for forming VSTB. The first method is to make the spacer at the direct STI-hard mask step after the hard mask etch when SiN-masking layer and SiO2-pad layers are etched away in STI area-to-be, defined by the Lithography. The second method is to form the spacer at the reverse edge of the STI-hard mask after the STI formation is finished and the reverse hard mask is formed in a self-aligned fashion. A specialist skilled in art can modify these methods being suggested in this invention. The second method is illustrated in FIG. 8 and FIG. 9a-FIG. 9g where it is shown how the standard STI formation process is modified to form the reverse STI hard mask edge spacer. A standard STI formation process 101P results in the cross-sectional view illustrated in FIG. 9a. A thermal SiO2 layer 303 is used as the pad and LPCVD SiN layer 302 is deposited as the hard mask. The typical ratio range of the hard-mask made of SiN layer to the SiO2-pad oxide layer thickness is about 3 to 20 (pad oxide is significantly thinner). In the suggested process 101P the ratio is opposite to the typical and is about 1 to 0.2 or so. Next process step 102P is to recess the STI SiO2 filling by etching the STI material (such as HDP SiO2 and the like). The recess depth determines the VSTB thickness and should be optimized accordingly. In the next process step 103P the recessed area is filled with LPCVD SiN 301, FIG. 9c, followed with planarization by CMP process going selectively to SiO2-pad oxide unless all the SiN on the top of the SiO2-pad is removed exposing the pad oxide, process 104P, FIG. 9d. The pad oxide is now etched anisotropically and selectively to c-Si, followed with a low temperature formation of a thin thermal oxide layer 109 (thickness in a range of 1 to 5 nm or so), process 105P, resulting in the structure illustrated in FIG. 9e. After a dielectric VSTB hard mask material deposition and etch back, process 106P, the dielectric cap 101 (the VSTB hard mask) looks as shown in FIG. 9f. The VSTB hard mask material is to be the hardest for the selectivity when etching the SiO2, poly-Si, c-Si, and other SiN layers. The material can be such as high temperature LPCVD SiN, Al2O3 is the preferable choice, a stack of the Al2O3 covered with the HT LPCVD SiN of ⅓ or so of the total thickness, Al2O3 nitridized from the surface by the N-plasma such as DPN (Decoupled Plasma Nitridation) or SPA (Slot Plane Antenna) process, AlON, Sc2O3, Gd2O3 and the like material with a high etch selectivity to other materials in the structure. Next step is the etching of the c-Si to a depth determining the VSTB height and the result is a formation of VSTB 100 and the gate area 404, process 107P, FIG. 9g. An anti-parasitic doping layer 401 of the same type as VSTB doping (to increase the parasitic MOSFET Vth between the right and the left VSTB-FET's in a cell (parasitic MOSFET suppression) is done and the gate trench is filled with the dummy dielectric 402 that was then planarized, process 301P, resulting in the structure cross-section shown in FIG. 11a. Protection layer 403 formed on the top of the dummy filled gate area 402 is optional for a higher manufacturability of SD formation process is shown only in FIG. 11a and is explained in more detail below. The protection layer 403 can be made of poly-Si, a-SiCH(PECVD) as preferable material, Al2O3, AlN, AlON and the like to provide the gate area protection when SD mask misalignment results in opening the gate area as well as the STI area near VSTB and Si3N4 and SiO2 layers are to be etched for SD formation.

Source/Drain formation process module as a fragment of the total process integration flow can be done in a few different locations of the total process flow. This is a unique feature of the VSTB-FET device design concept suggested in this invention. Three different locations are briefly discussed here. The first preferable location is after VSTB formation ("gate last" process,). FIG. 10 shows the process flow chart and FIG. 11a through FIG. 11f shows the evolution of the structure in doing this process module. A critical dimension control and alignment mask is applied and the SD holes or trenches are etched, process 302P, with resulting structure cross-section illustrated in FIG. 11b. Next a thin poly-Si layer 501 (or any other appropriate semiconducting/conducting material) is deposited and doped by making masks and ion implantation, process 303P. Doping is made by donors (such as P, As, and the like for c-Si) for n-channel VSTB-FET and by acceptors (such as B, In, and the like for c-Si) for p-channel VSTB-FET. A high to moderate temperature fast RTA process is applied as a first step of the doping drive-in anneals to form appropriately doped a VSTB Source region 502 and a Drain region 602, process 304P, FIG. 11d. A conductive barrier layer 503 formed from a material such as a very inert metal not forming metal-silicide (such as conductive metal nitrides, Al, and the like) or metal silicide itself (such as NiSi, CoSi2, and the like) is deposited after the RTA, followed with filling the rest of the hole/trench space with a highly conductive material (such as W, Cu and the like), a filling layer 504, process 304P, FIG. 11d. Densification/silicide formation low temperature anneal follows with a CMP process to planarize the structure and remove these materials above the area where the gate is going to be, process 305P, FIG. 11e. A small recess of the SD stack is made and filled with a material (conductive or dielectric) such as SiN for protecting source/drain metal filling such as W and the like from O and moisture contamination with a high selectivity in etching to other exposed to the surface materials such as SiN (PECVD), polysilicon, and SiO2 followed with the planarization by CMP, process 306P, of the protection layer 505 in FIG. 11f.

It should be noted that when VSTB thickness reaches the quantum layer thickness of about 4 nm for materials like c-Si as the results of the VSTB-FET scaling there is no need any more in forming Source/Drain regions doped differently for nMOSFET and pMOSFET. The ideal Source-Drain would be a Fermi level pinning free heterojunction between the Silicon VSTB and a Source/Drain material. The Source/Drain material is formed as a stack of materials having the first chemically inert interfacial layer material with the gap approximately equal to the VSTB semiconductor gap (1.1 eV for c-Si as an example) +/−10% and minimal band-offsets with the semiconductor VSTB covered with a cover material having a certain work function (Wf). This interfacial layer could be any material satisfying the requirements listed above including non-stoichiometric TiN, TaTiN, and the like deposited by ALD with N-containing precursor going first having such N concentration which provides the gap close to the gap of c-Si or material such as mono- to multi-layered Graphene sheet. The cover material is to be with low Wf for nMOSFET (so called n+/−type metal with Wf=~4 eV) and with high Wf for pMOSFET (so called p+-type metal with Wf=~5 eV). Low Wf material can be any highly conductive material such as Al, Ta, TaAl, AlTiC, AlTiCO, Zr, Hf, and their alloys, and the like. High WF material can be any highly conductive material such as Pt, PtSi, NiSi, TiN, AlCO, TiAlN, and their alloys, and the like. Since the interfacial layer is inert and not interacting with the silicon the source/drain structure is not the typical Schottky barrier MOSFET which has the fundamental unsolvable issue of Fermi pinning at the interface with n-doped silicon.

Figure 12C:
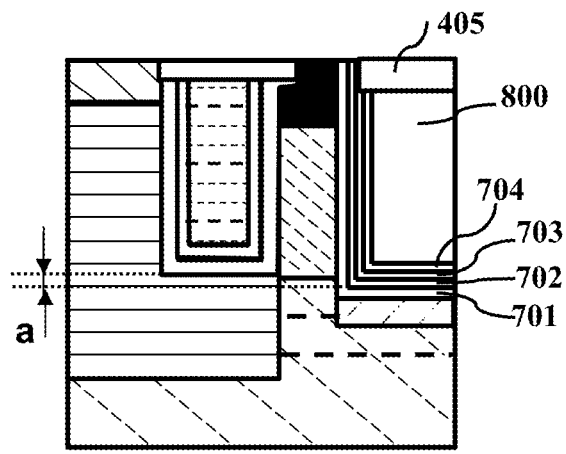

Gate stack process module. In the gate last integration scheme for the structure shown in FIG. 11f, the first step is to remove the dummy dielectric filling layer by the anisotropic selective etching leaving at the bottom an appropriate thickness, which is to be the gate-to-substrate isolation 400, process 307P in FIG. 12a. Then an advanced process of formation "high-k/metal gate" is applied. FIG. 12b shows that it is possible to use the advanced gate stack process 308P in the VSTB-FET device. GDS comprising the ultra-thin interfacial dielectric layer and high-k layer itself can be easily formed inside the gate area. GDS formation follows with MGS formation comprising the appropriate p+/−type work function material or a stack of materials for p-channel VSTB-FET formed by deposition the layer and removal the layer in the area of n-channel VSTB-FET followed by the deposition of the n+/−type of material or a stack (or vise versa), followed with the metal barrier layer deposition for protecting the work function specific material metal layers from interaction with the gate electrode stack (GES). After GES is formed and planarized the structure looks as illustrated in FIG. 12b. FIG. 12c indicates that the gate stack can be easily formed deeper than the bottom location of the Source/Drain for providing a better electrostatic control of the gate potential over the channel in VSTB resulting in the subthreshold leakage reduction. If the filling material is W or the like a formation of the protection layer 405 made of SiN and the like is done on the top of the gate area to protect the gate electrode from O2 and moisture contaminations and increasing the resistivity. The protection layer is formed by making recess by selective etch and filling with SiN, followed with CMP (shown in FIG. 12b as an optional layer 405).

Deposition of the interlayer dielectric (ILD) made of such material as SiO2 and a protection interlayer dielectric (PILD) on the top of ILD such as SiN is very well known and these are final two steps of the FEOL integration process. Making contacts holes through the ILD with filling them with any conductive material stack such as TiN and W (or any other adequate material known in the art) is the last process before BEOL processing starts. Etch stop layer (ESL) deposition is performed before the ILD deposition for some IC applications like DRAM where a large difference in the contact depth occurs between the DRAM and periphery areas.

Figure 13A:
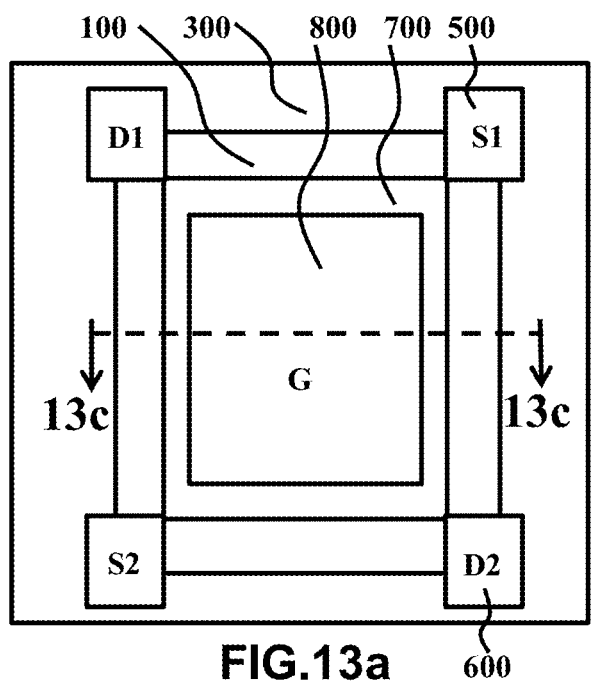
FIG. 13a is a layout view of the 1G-4T device when 4 MOSFET's with the common gate are formed in the same active area (cell). The very top layers: ESL (301), ILD (102), and PILD (103) are not shown for more clear view of the key device layers.
Figure 13B:
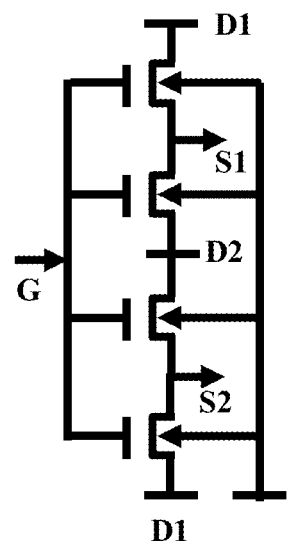
FIG. 13b is an electrical equivalent circuit of the 1G-4T device formed in the same active area (cell).
Figure 13C:
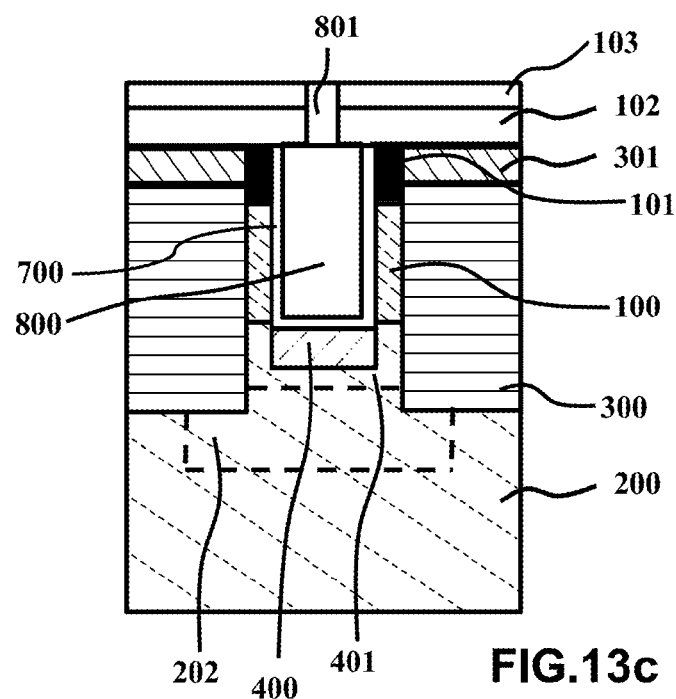
FIG. 13c is a cross-section view along section 13c-13c in FIG. 13a of the 1G-4T device formed in the same active area (cell).

FIG. 13a illustrates a layout design showing the important device layers, FIG. 13b illustrates an equivalent circuit of an implementation, and FIG. 13c illustrates a cross-sectional view of the device with the gate contact 801 and a deep n-well 202 for only p-type of VSTB-FET's. The design can be called as 1G-4T (1 Gate-4 Transistors) integrated device having four VSTB-FET's fabricated in a single active area (cell) with the common gate 800 according the preferred embodiment of VSTB-FET device. The active area is surrounded by the dielectric body 300.

Embodiments of the invention have been described in detail with respect to transistors on bulk silicon. A VSTB can be made of various types of semiconductor including Ge, GaAs, InGaAs, Graphene, Carbon nanotubes, etc. Dielectrics used to form the VSTB-FET are SiO2 and SiN but they can be any dielectrics satisfying etching selectivity properties with respect to each other. In today state-of-the-art CMOS technology the 4 basic materials used include SiO2, Si3N4, SiON and crystalline-Si/polysilicon (poly-Si). Depending on the deposition method the etch rate of SiO2 deposited with different methods including TEOS-SiO2 (Tetraethylorthosilicate based dielectric), HDP-SiO2 (High Density Plasma deposition based dielectric), HTO-SiO2 (High Temperature deposition based dielectric), etc. can be different and the layers can be exploited for forming VSTB-FET. Depending on the deposition method the etch rate of Si3N4 or SiON deposited with different methods including PECVD (Plasma Enhanced Chemical Vapor Deposition), LPCVD (Low Pressure CVD), APCVD (Atmospheric Pressure CVD), HT (High deposition Temperature), etc. can be significantly altered and these layers can be used as dielectrics to form VSTB-FET. Some other dielectrics specified in this description as Mat1, Mat2, and Mat3 can be various types of materials including but not limiting to HT Si3N4, Al2O3, AlON, Sc2O3, Gd2O3, AlB, SiB as Mat1 representatives, poly-Si, a-SiCH(PECVD), Al2O3, AlN, AlON as Mat2 representatives, poly-Si, a-C (DLC=Diamond Like Carbon, a-CH), a-SiC, a-SiCN, a-SiOC as Mat3 representatives. Such materials which are used in modern ULSI fabrication as TiO2, Ta2O5, ternary alloys (SiOC, etc.), 4-components (BaSrTiO3 also known as BST, etc), and multi-components alloys can be also used for masking to provide highly selective etching rates with respect to each other in fabricating VSTB without use of very expensive and accurately aligned masks. In two instances a polysilicon layer is used as the dummy protection layer to provide a selective etching protection of the underlying layers which are supposed to be not etched while similar materials are removed in appropriate places. Such a method mitigates the alignment difficulties and problems and makes easy to fabricate the devices bringing a smaller overhead of using some extra protection or dummy layers. Usage of Al2O3 instead of poly-Si as a dummy mask layer in the same contents can dramatically increase manufacturability and less cost. The more materials with selective etch properties with respect to each other are involved the better manufacturability and lower lithography cost can be achieved. Alternative embodiments of the invention can be used with other types of dielectrics and semiconductor materials on bulk semiconductor substrates. Embodiments of the invention can be used with a VSTB-FET having the cap layer formed from such material as a HT Si3N4, Al2O3, or any dielectric described above. If there is a Si3N4 cap layer, the transistor can have a gate electrode stack fabricated from various materials, including metals and poly-Si. Alternative embodiments of the invention can be used with nanowire devices. Embodiments of the invention are applicable to nanowire devices as long as they have a transistor structure with a gate similar to the silicon transistors described herein. The nanowire devices can be made of various materials, such as Si, Graphene, or carbon nanotubes. Embodiments of the invention can involve the fabrication of square or rectangular iso-plugs, rectangular iso-trenches, self-aligned contacts to the gate electrode and Source and Drain. A specialist experienced in the ark can make some combinations of the materials mentioned above and create a more manufacturable and cost effective VSTB-FET devices and process integration schemes within these concepts of the device and fabrication method of therein.

Figures 14A, 14B:
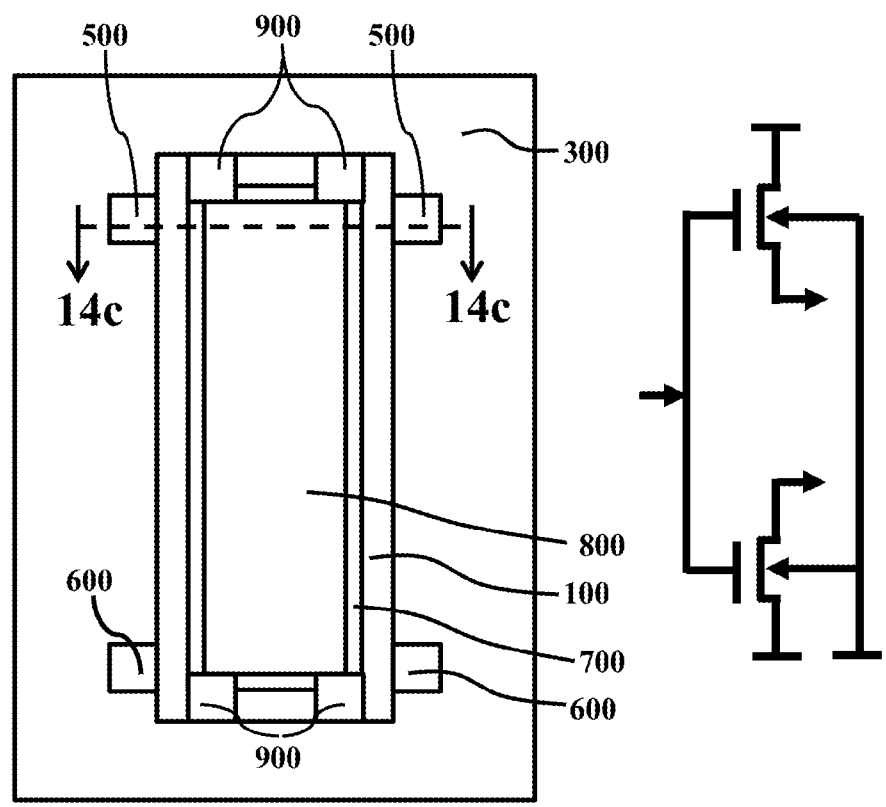
FIG. 14a is a layout view of a particular embodiment of the VSTB-FET device where 2 MOSFET's with the common gate are formed in the same active area. The very top layers: ESL (301), ILD (102), and PILD (103) are not shown for more clear view of the key device layers.
FIG. 14b is an electrical equivalent circuit of the two VSTB-FET devices formed in a single active area.
Figure 14C:
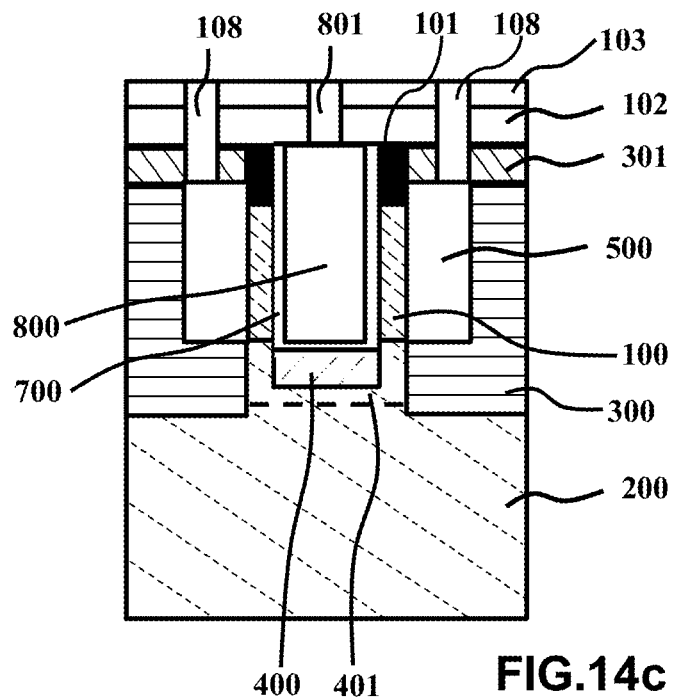
FIG. 14c is a cross-section illustration along section 14c-14c in FIG. 14a of the 2 VSTB-FET devices in parallel formed in a single active area (cell).

FIG. 14a and FIG. 14b illustrate an example of a particular embodiment of the VSTB-FET device having two VSTB-FET's with the common gate and formed in a single active area. The active area is surrounded by the dielectric body 300 having 2 VSTB-FET devices connected in parallel with the common gate 800 as illustrated in FIG. 14b. FIG. 14a shows the device most important layers where the top layers 102 and 103 are removed for clarity and FIG. 14c shows a cross-sectional view of the structure with a gate contact 801 and Source contacts 108. Since SD are separated by the iso-plugs 900 the devices can be used with separated output or joined together by Metal-zero's or Metal-1 interconnects. This couple of devices can be duplicated vertically or horizontally as a design brick as many times as needed in parallel to form a powerful device for amplifying a signal to the long interconnects, a pad, or in ESD-protection devices if the clump-based ESD-design approach is adopted. The left and the right iso-plugs can be merged. To reduce the gate-to-source/drain overlap capacitances the SD plugs 500 and 600 are formed closer to the end of VSTB's. The corners of the VSTB at the end of VSTB's are typically filled with a thicker gate dielectric stack which also helps reduce the overlap capacitance near the corners.

FIG. 15a (layout design), FIG. 15b (equivalent circuit), and FIG. 16 (cross-sectional view) illustrate an example of using the iso-trenches 902 to isolate two gates in the same active area. This device design is typical for logic circuits. The structure is formed by the preferable embodiment of the process flow described above.

The VSTB-FET device concept allows also integrating the standard SiO2-based gate dielectric and poly-Si-based gate electrode integration scheme. For this approach the gate first process is more suitable which can be easily done for VSTB-FET devices by an experienced in the art specialist. This is especially important for low leakage products like DRAM access transistor and DRAM periphery, CMOS-IS (Image Sensor) and periphery, Ultra-Low Power ULSI, Floating Gate (FG) Flash NVM, and the like where the usage of transition metal oxide based high-k is still not practical due to excessive metal contaminations resulting in high device leakages.

A few solutions are suggested below to provide more robust integration process for improving the manufacturability if the current industrial lithography tools do not provide the alignment accuracy required for nano-sized VSTB-FET's.

SD formation mask misalignment with the dielectric cap 101 and the gate area is a potential concern and solutions needed to address it. If the mask is overlapping not only with the dielectric cap 101 but also if the mask edge goes beyond the dielectric cap 101 in the gate area direction over the dummy fill of the gate area this results in an overetch of the dummy dielectric on the gate stack side, FIG. 17a, encircled area 111. This results in less reliable isolation between the gate and the SD where the isolation will be determined by the GDS (Gate Dielectric Stack) and make parasitic capacitance a little larger than in the case with a good alignment. These consequences are not desirable. One way to address this concern is that. The protection layer 403, FIG. 17b, can be placed on the top of the dummy gate oxide 402. The protection layer 403 should not be etched away when the SiN STI hard mask is etched in SD mask openings, should not be etch when STI SiO2 is etched away for opening SD holes, and should not react or at least less react with all materials of the SD stack 510 (see FIG. 17d) when the SD formation is processed, FIG. 17c through FIG. 17f. In an exemplary embodiment the protection layer 403 has to have a small etch rate (be selective in etching) with respect to SiN and SiO2. One of a simple candidate for such a material is poly-Si. So a recess etch of the dummy oxide is made selectively to SiN on the top of STI and on the top of the dielectric cap 101 made for instance of high density SiN deposited at high temperature LPCVD and filling it with the poly-Si layer followed with poly-Si CMP (etch-stop layers are those SiN layers). ALD Al2O3 can be the second choice for this protection layer. Then when the STI protection layer made of easy to etch SiN such as PECVD SiN is etched away in the SD opening in a photoresist mask opening and STI-oxide starts to be etched the plasma does not etch the dummy gate oxide because it is covered with the protection layer such poly-Si or a thin Al2O3 or any material from the group of Mat2, FIG. 17c. The SD is formed by depositing the SD-stack 510 consisting of at least 3 layers inside SD holes: the poly-Si layer 501 doped opposite for n-channel VSTB-FET and p-channel VSTB-FET and annealed, a conductive barrier layer 503, and the SD filling layer 504. Then by CMP all these three layers are removed from the top of the wafer, FIG. 17e. If poly-Si is used as the gate protection layer it will be doped a little bit but still will not be connecting source/drain areas after CMP. Forming a recess by etching of the SD stack selectively to the SiN and poly-Si the protection layer 505 is deposited and planarized by CMP on the top of the SD areas, FIG. 17f. Next the poly-Si protection layer 403 above the dummy oxide 402 or thin Al2O3 are removed with little etch of the dielectric cap if it is made of Al2O3 as explained above followed with etching the dummy oxide itself leaving at the bottom the gate-to-substrate isolation 400 of the enough thickness to provide an acceptable small gate-to-substrate capacitance. DPN/SPA plasma nitridized Al2O3 dielectric cap helps keep the VSTB protection with no issues at all. The structure is ready for the gate stack formation module ("gate last" scheme).

Figure 17A:
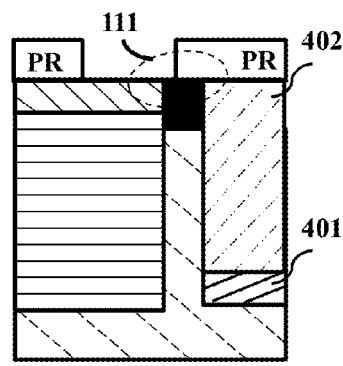
Figure 17B:
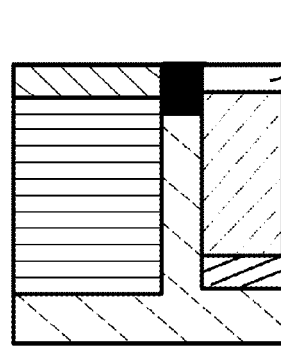
Figure 17C:
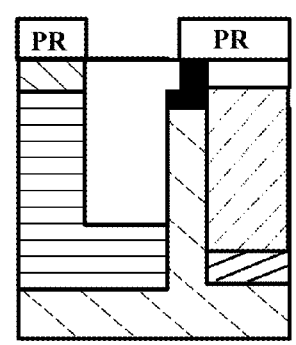

Another potential concern left for this integration method is now related to a small overetch of the VSTB hard mask, FIG. 17c, if made of the similar material such as the STI hard mask and STI protection layer, such as Si3N4. This overetch might make a very small area of a few nanometers width to be separating SD from the gate by gate dielectric stack. To address the potential concern a solution is suggested. It should be reminded that the hard mask for VSTB formation is formed as the spacer at the reverse/direct STI hard mask edge with a dielectric material such a high density Si3N4. But if another material (Mat1) is used which is dielectric and can be selectively etch with respect to SiO2, c-Si or poly-Si, and SiN, then the perfectly manufacturable process is determined with no etching of the VSTB-hard mask. The Mat1 material has to have a very low etch rate (high selectivity) in all plasma etching processes which used for SiN, SiO2, and poly-Si. Mat1 in the preferable embodiment is the high density SiN or Al2O3 (nitridized from the surface or not) but it can be any dielectric material from the list mentioned above. Another significant simplification of the pattering process and the manufacturability increase can be done at the expense of using a material Mat2 for the protection layer 403 instead of poly-Si as explained above. This Mat2 is to be a dielectric, with very low etch rate with respect to SiN, SiO2, Mat1, c-Si in corresponding etching plasmas and be not interactive with the poly-Si deposited into SD as the first layer and occurring on the top of this Mat2 layer. Possible candidates for such materials might be low temperature ALD Al2O3, high density SiN with low H concentration, poly-Si, a-SiCH(PECVD), AlN, AlON and the like.

Figure 17D:
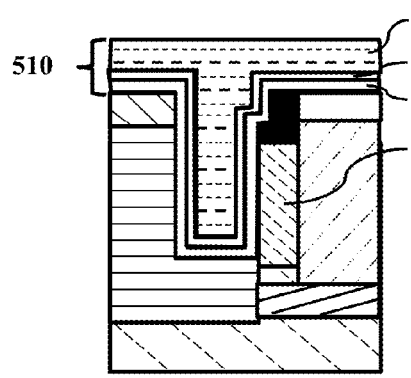
Figure 17E:
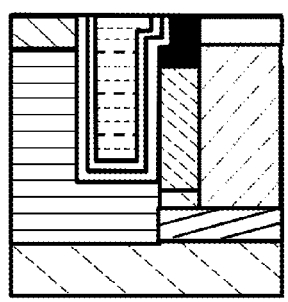
Figure 17F:
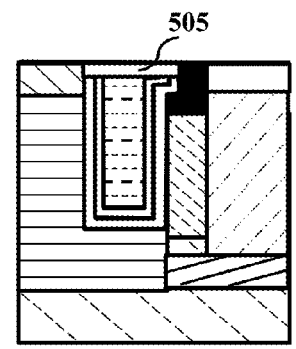

Channel length control is one of concerns which can affect the manufacturability through the channel length variability. In the preferred embodiment the channel length is determined by a distance between the Source and Drain junctions at the channel side. Variability of the distance is directly translated into the variability of the channel length. To have a control over the channel length by the Gate size is a very favorable solution. Another strict requirement is to self-align the SD with the VSTB at the STI side. A solution based on a two-dimensional self-alignment process (2DSA-process) suggested for SD to be self-aligned with the VSTB and the gate. Schematic 3D view of a VSTB-FET with SD self-aligned to the Gate and VSTB is shown on FIG. 18a. A 2DSA-process is used to form a 2 VSTB-FET structure with the common gate that is illustrated in FIG. 18b through FIG. 22. Additional advantage of the suggested process is that Metal-zero (Me0) as the short distance interconnects can be formed by extending the gate electrode on the top of the STI. FIG. 18b illustrate the top view of the final VSTB-FET structure where a few top layers are not shown for clarity while they are shown in FIG. 19a, FIG. 19b through FIG. 22 to illustrate how the contacts are formed for SDs and the Gates. The initial structure for 2DSA-process is shown in FIG. 17b where the dielectric cap 101 are formed from material Mat1 and the protection layer 403 are formed from material Mat2 which are selective in etching mutually to themselves and to SiO2, SiN, c-Si/poly-Si. Then an interlayer dielectric (ILD) made of TEOS-SiO2 102 and a protection interlayer dielectric (PILD) made of LP/PE CVD-Si3N4 103 are formed on the top. Lithography step is applied with the CD-control for the gate. A trench is selectively etched through the layers 102 and 103. To reduce the capacitance between the SD and the gate a spacer 809 is formed in this trench by depositing a dielectric material such as Si3N4 and etching back. Then the trench is filled with the dummy gate material (Mat3) such as poly-Si, which is selective in etching to SiO2, SiN, Mat1, and Mat2, by deposition and planarization process (such as CMP). A lithographical step for SD is made with overlapping of Mat3 and the Gate area. Actually a single window for both Source and Drain on both sides of the trench can be open with relaxed margins for alignment. Etching the SD holes/trenches through the layers 102 and 103 follows with continuing etching through the SiN protection layer 301 and the dielectric body 300 unless the specified depth is achieved. Then the SD openings are filled with the corresponding SD-stack as illustrated in FIG. 17d except that a deeper area is filled because of the ILD-PILD-stack layers 102 and 103, followed with CMP, recessed and protected by layer 505 similar to as shown in FIG. 17f but this time planarized at the level of layer 103 top surface. The final structure after the SD formation is shown in FIG. 19a, where also the sandwiched layer as the top FEOL dielectric stack 340 is shown together with the contact 350. In order to form the gate, the gate dummy layer made of Mat3 is etched away selectively to the Mat1, Mat2, and SiN on the top of the dielectric body 300. To further reduce the SD-to-Gate capacitance a second spacer is optional to be deposited in the opened trench before etching the gate area protection layer 403. The protection layer 403 made of Mat2 and the dummy oxide in the gate area then etched away selectively to the SiN, c-Si and Mat1 having the hard mask made of the sandwiched layers 102, and 103, and the spacers 809. The dummy oxide 402 in the gate area is etched leaving a certain layer thickness at the bottom to form the gate-to-substrate isolation 400 to reduce the gate-to-substrate capacitance. The final structures after the gate stack formation process are shown in FIG. 19b and FIG. 20. Auxiliary FIG. 21 and FIG. 22 illustrate some details of the VSTB-FET formed according to the 2DSA-process at the certain cross-sections indicated in FIG. 18b. This completes the fabrication of a VSTB-FET in accordance with the present invention of the 2DSA VSTB-FET device and method of its fabrication.

FIG. 23a, FIG. 23b, FIG. 23c, FIG. 23d, and FIG. 23e illustrate another embodiment of the VSTB-FET devices where the four vertical channel pseudo-SOI VSTB-FET's are formed with the source connected to the substrate. The term pseudo-SOI is used to underline the device feature that VSTB is not isolated from the substrate by a Buried Oxide (BOX) but rather is connected to the substrate through the junction. The drain can be formed continuously along a perimeter to form one device with width equal the perimeter. The channel length is marked by arrow with symbol $L_g$ in FIG. 23c and the same arrow is showing the channel current direction from the Source 520 at the bottom to the Drain 600 at the top. The device can be formed with a slight alteration of the preferred formation process of VSTB-FET. After the gate area etching the donor type ion implantation into the substrate 200 forms the Source 520 for n-channel VSTB-FET and the acceptor type ion implantation into the substrate n-well 202 forms the Source 520 for p-channel VSTB-FET. The Source 520 creates a highly doped source region 521 at the bottom of the VSTB. The drain if formed in the hole 600 etched in the STI as shallow as to reach the top of the VSTB with a small overlap of 5 nm to 10 nm or so to form the highly doped Drain region 602 in the VSTB. Contact to the source is formed by etching through the gate stack 800 and the gate-to-substrate isolation layer 400 to reach the highly doped Source. Spacer 507 in the hole is formed to reduce the capacitance between a source contact plug 506 to the source 520 and the gate. If desired, in order to reduce the source parasitic resistance a buried highly conductive layer can be formed inside or on the top of Source 520. One of an embodiment comprises a formation of heavy transient metal silicides buried layer (such as ZrSi2 or HfSi2 and the like, where the metal is to have a small diffusivity in c-Si or any substrate for that matter). The silicide is made of any suitable metal such as heavy transition metals (Zr, Hf, and the like) by deposition method such as MOCVD, ion implantation and the like after gate area etching followed with a low temperature anneal for the silicide phase formation. VSTB protection from potential metal contamination can be done by making a protection layer made of an oxide/nitride sandwich in a form of a spacer on the VSTB which is removed after the silicide formation. If heavy metal ion implantation is used then to protect the top VSTB layers from metal contamination a thicker than the preferred dielectric cap thickness made of high density Si3N4 or Al2O3 (VSTB hard mask) is formed to be partially removed by a cleaning step after the silicide formation together with the metal implanted in to there. If a thin layer of heavy metal MOCVD process is used the heavy transition metal is annealed to form the silicide followed by etching of not reacting metal on the VSTB spacer walls and the top dielectric layer followed by removal of the spacer. Strictly speaking this design is not exactly SOI-VSTB-FET because there is an electrical connection of the body to the substrate through the Source junction. Since typically this junction isolation is a low leakage one the VSTB is almost perfectly isolated and can be called a pseudo-SOI type of isolation.

If desired for some specific applications a true SOI VSTB-FET can be formed as illustrated in FIG. 24a and FIG. 24b. The semiconductor device of the preferred embodiment, wherein the VSTB-FET is formed in a Si—SiGe—Si sandwiched semiconductor substrate so that VSTB is cut from the electrical connection to the substrate at the VSTB bottom by selectively removing SiGe resulting in a true local vertical SOI body as the main element of the VSTB-FET. The gate-to-substrate isolation layer 400 can be formed by a few different processes. In one of the embodiments a SiGe layer 250 can be formed in the initial semiconductor substrate 200 buried under c-Si layer 260. Then during the gate area etching the SiGe layer is laterally and selectively to c-Si etched away. This area is filled later with the gate-to-substrate isolation layer 400. Moreover when forming STI trench, the etching front comes to the SiGe buried layer and it is always etch SiGe layer laterally forming an isolation region under c-Si 360 due to different anisotropy of etching c-Si vs. c-SiGe. This phenomenon helps form the isolation region 360 at the VSTB bottom when the gate area etching is performed. Another method of forming the isolation region 360 is to switch from an anisotropic etching of the gate area to isotropic etching at the end of the formation process. Lateral reduction of the VSTB thickness is to be foreseen and compensated by slightly wide (thicker) VSTB hard mask. Also it is easy to suggest that another true SOI VSTB-FET can be made on thick SOI wafer with VSTB formation method as described above with all the SD and Gate formation etching in depth steps stopped at the BOX-SOI interface.

If desired a multi-nanowire device such as VSTB-nWi-FET can be formed as illustrated in FIG. 25 based on a modification of the preferred invention embodiment. VSTB can be partitioned by the same methods as illustrated in FIG. 24 and explained above. The VSTB-nWi-FET has a great advantage of making logic switching with an extremely small power and this device should have a lot of applications in future.

If necessarily, System-on-Chip, ASIC, and other products, or stand alone memory can be fabricated using the VSTB-FET's. The VSTB-FET device concept and fabrication method of therein are very flexible and allows to design and to fabricate many types of embedded and stand alone memories such as DRAM (access and periphery transistors), SRAM, and Flash NOR and NAND non-volatile memory (NVM): trap-based such as TANOS and the like, polarization based such as SrTiO2 ferroelectric and the like, and floating gate based NVM as well as PCM-based NVM. The power of VSTB-FET device concept is so strong that it is easy to integrate such a device with Spin-Transfer Torque Magnetic RAM (STT-MRAM) memory element or Ferroelectric capacitance memory element in a DRAM-like design where the DRAM Capacitor is replaced with SST-MRAM element or Ferroelectric Cap element. A slight modification of 2T NOR cell can be used for fabricating a DRAM with a MOSFET having a gate dielectric stack made of a ferroelectric material (FeFET) and a non-ferroelectric gate dielectric access transistor comprises the memory cell where both FET are made in a form of VSTB-FET devices.

A Flash NVM semiconductor device can be formed by using the preferred embodiment manufacturing process or by using 2DSA-process, wherein the VSTB-FET's can be transformed in to a NOR Flash cell array with 2 bits per cell, FIG. 26a and FIG. 26b. There are two types of NOR Flash cell: 1T cell made of a single memory transistor (FIG. 26a) and 2T cell made of a memory transistor and a select transistor in series (FIG. 26b). No new processes involved to form these embodiments are needed except for those processes to form material layers with memory effect. A ferroelectric dielectric stack (such as SrTiO3 and the like) or trap-based stack (SONOS, TANOS and the like) 705 is formed as the gate dielectric stack. Repeating the cell column illustrated in FIG. 26a and FIG. 26b to the left and to the right a NOR Flash array can be formed with 2 bits per cell architecture having word line 810 made of the metal-zero and two couples of bit lines: source bit line 910 and drain bit line 911 made of two first levels of the interconnect system integrated together with VSTB-FET design for the periphery/logic IC. 1T cell is a very memory dense design but it brings a lot of overheads for the periphery for smart program and erase to keep Vth after the program and erase under a tight distribution control and having a non-zero read voltage which is the main disturb for retention characteristics. 2T cell in this respect is much simpler though it takes a larger area. Also the gate dielectric formation modules which are different for World lines (WL) and Select Lines (SL) brings some process integration overheads in order to simplify the periphery circuits. Many ASIC and SoC designers would prefer to use 2T cell due to these reasons. Another important consideration for 1T cell is that. In order to position the program-erase window around the initial Vth, the initial Vth is to be high. 1T cell design having a high initial Vth in the standard planar technology is made by a stronger doping but this method can not be used in VSTB-FET devices because the Vth is controlled by the VSTB thickness and the work functions of the metal gate and Source/Drain barrier layer (as for the ultimate design scaling having 4 nm of VSTB for Si technology). The initial Vth can be adjusted by a memory FET metal gate deposition with the predefined work function in a range of the mid-gap work function of 4.5 eV as for such materials like Ru, TaSiN, TaRu, TaTi, Mo, MoSi2, WSi2 alloys and the like or even in a range of higher work functions of about 5 eV like for materials like Pt, PtSi, NiSi, TiN, AlCO, TiAlN, and their alloys, and the like. FIG. 26c and FIG. 26d show the Program and Read conditions important to consider in NVM design. It should be noted that the disturbs indicated in FIG. 26c and FIG. 26d have a more relaxed requirements as compared to the planar MOSFET design due to the non-doped VSTB and fully-depleted mode of operation which helps reduce the disturb electric fields in the memory stack significantly. Voltage magnitudes for the program and read conditions are given in FIG. 26c and FIG. 26d for illustrative purposes and are to be significantly smaller for the sub 20 nm memory designs. A specialist experienced in the art can design some variety of layouts and architectures to enhance certain performance parameters important in a particular application using the same basic elements of the VSTB-FET and basic fabrication process of therein.

If desired a NAND Flash with 2 bits per cell can be fabricated using VSTB-FET device and fabrication process where a ferroelectric dielectric stack (such as SrTiO3 and the like) or trap based (TANOS consisting of TaN/Al2O3/Si3N4/SiO2/Si, SONOS consisting of Si/SiO2/Si3N4/SiO2/Si, SNONOS consisting of Si/Si3N4/SiO2/Si3N4/SiO2/Si, and the like) stack 705 is formed as the gate stack as illustrated in FIG. 27a and FIG. 27b of layout view. Repeating this column of cells to the left and to the right a NAND Flash array architecture can be formed with 2 bits per cell. Depending on a specific application a simple preferred embodiment based NVM can be made as illustrated in FIG. 27a or a more elaborated 2DSA method can be used for a much denser NVM as illustrated in FIG. 27b.

It should be noted that quite a range of varieties of the NVM gate dielectric stacks are developed these days for different applications and to satisfy some integration requirements. Integration of such stacks into VSTB device concepts and fabrication methods is not sometimes straightforward. For example, if TANOS stack is taken as the basic NVM stack then when etching the gate dummy filled dielectric such as SiO2 in order to form the gate electrode there is no etching problem at all because TaN is a very good protection layer and TANOS stack is not damaged by SiO2 etching. To the contrary if SONOS stack is used for the same step of the SiO2 etch there is no any etch stop layer and SONOS-stack oxide can be damaged and thickness is affected with less controllability. To avoid such an issue it is advisable to use SNONOS stack with a very thin SiN layer of the top of the SONOS-stack top oxide layer. Another example is that. It is commonly accepted that the gate electrode is made of the heavily doped n+-type poly-Si and the main improvement of the erase mode performance is achieved by engineering the barrier height and dielectric constant of the top dielectric layer. However, a stack of any conductive material with a specified work function such as TiN, TaN and the like can be used as the gate material covered with poly-Si on the top of the NVM gate electrode stack. An optimal work function is actually the mid-gap work function which allows improving both the program and the erase mode. Heavily p+-doped poly-Si is an extreme case of strong improving the erase mode if the program mode has enough margins. Resistance reduction requirements have resulted in usage a more elaborated gate electrode stacks such as a policide stack (poly-Si—WN—W) and the like. A specialist skilled in the art can use many modification of the basic structure to make it more manufacturable with no changing the essence of the invention.

If desired a NOR Floating Gate (FG) Flash with 2 bits per cell can be fabricated using VSTB-FET design FIG. 28a, where the floating gate 711 and inter-gate isolation 712 layers and the gate dielectric 710 separating the floating gate from the VSTB are included as a part of the gate dielectric stack. Iso-trenches 902 needed to isolate the FG from each other in a single cell as illustrated in FIG. 28a in a layout view. Design in FIG. 28a is of a great advantage of having a large capacitive coupling between the FG and CG (Control Gate) resulting in a less programming voltage. Repeating this cell upward and downward and to the left and to the right a NOR Flash array can be formed with 2 bits per cell. 2 Bit Lines 910 and 911 and Word Line 912 are made of Metal-1 and Metal-2 interconnects. If desired to make a more compact cell usage of Metal-1, Metal-2, and Metal3 interconnects can be exploited.

If desired to create a high density NVM array, a NOR Floating Gate (FG) Flash with 2 bits per cell can be fabricated using VSTB-FET design featuring 2DSA method where the floating gate 711 and inter-gate isolation 712 layers and the gate dielectric 710 separating the floating gate from the VSTB are included as a part of the gate dielectric stack along the VSTB string, FIG. 28b. The high density comes at the expense of a more complex processing. Design in FIG. 28b has WL made of metal-zero in 2DSA design and is more compact. For having a large capacitive coupling between the FG and CG it is desirable to etch FG in spacer type processing leaving some tapering of FG material at the bottom of the gate area to achieve a less programming voltage.

If desired a NAND FG Flash with 2 bits per cell can be fabricated using VSTB-FET device designs and fabrication methods where the floating gate 711 and the inter-gate isolation 712 are included in the gate dielectric stack as a part of the gate stack. Iso-trenches 902 are formed to isolate the FG and CG stack within a cell from other cells as illustrated in FIG. 29a and FIG. 29b in a layout view. By repeating this column to the left and to the right a NAND Flash array with N=256 or 512 or so cells can be formed with 2 bits per cell. Two different methods are suggested to reduce the parasitic resistance along the VSTB line if the fringing electric field from the neighboring cells is not enough to provide a low resistive connection. One method involves formation of the Source/Drain plugs which provides the heavily doping into the VSTB portion opposite to the iso-trenches. The other method is to use a tilted Ion Implantation in to the VSTB portion between the iso-trenches for low resistive path through VSTB column in self-aligned manner with the iso-trenches when they are opened right before filling them with an isolating material like TEOS SiO2 followed with any planarization technique like the CMP. To isolate two columns of VSTB on the left and right in the same active area at the top and at the bottom of the total active area the iso-plugs are used which are used anyway in the periphery of the NAND Flash product. Two possible designs can be exploited in a particular application based on the preferred device design and fabrication method or using 2DSA method. In the preferred device/method approach the first interconnect level can be used for WL as illustrated in FIG. 29a. In the 2DSA device/method approach, the metal-zero lines are used for WL as illustrated in FIG. 29b. The fabrication process is very similar to the polarization based NAND Flash devices using ferroelectric materials, deep trap-containing memory dielectric layers, or a composite of a dielectric with embedded conductive nano-particles or quantum dots as described above. It is important to note that a very high density memory can be achieved by using a Flash memory design shown in FIG. 29b.

Referring now to FIG. 29c, one of the main concern in FG Flash device design is making a good Control Gate 800 to Floating gate 711 capacitive coupling. In these devices it can be made a large enough coupling due to an extra CG-FG capacitance in vertical direction where CG 800 is located on the top of the FG 711 but there is no FG-to-channel capacitance, due to using high-k stack as the inter-gate isolation layer, and due to etching of the FG 711 in a spacer formation manner with the tapering off profile at the bottom of the FG 711. Hot electron effect or tunneling effect can be used for programming and tunneling back to channel can be used for erasing. It should be noted that SD's inside a column in FIG. 29a are not connected to the interconnects but serve as an electrical conductive path between the VSTB-FET's NVM cells column. Electrostatic induced channel by the fringing electric field from CG's 800 in the VSTB portions adjacent to the iso-trenches can be strong enough allowing not to use the Ion implantation for forming the low resistive electrical connection of the VSTB-FET NVM cells which significantly simplifies the process integration. The more scaled NVM cell is the stronger the electrostatic fringing effect is developed, suggesting a great scalability path for a VSTB-FET NVM cell design.

Figure 1:
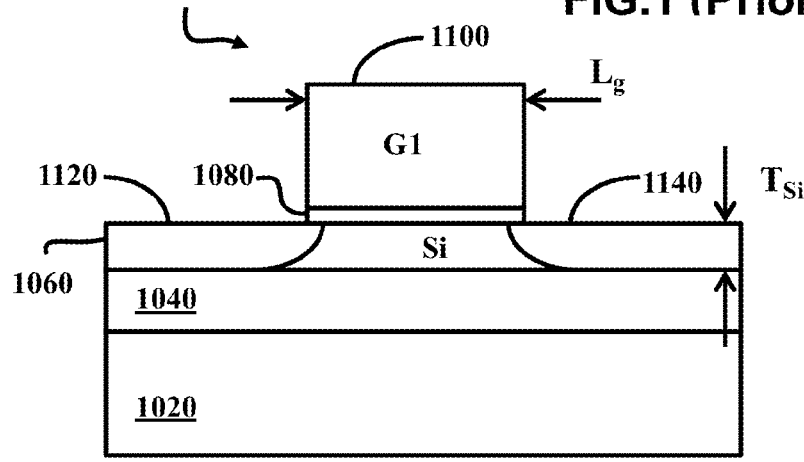
FIG. 1 (Prior art) is a cross-section of UTB SOI MOSFET.
Figure 2:
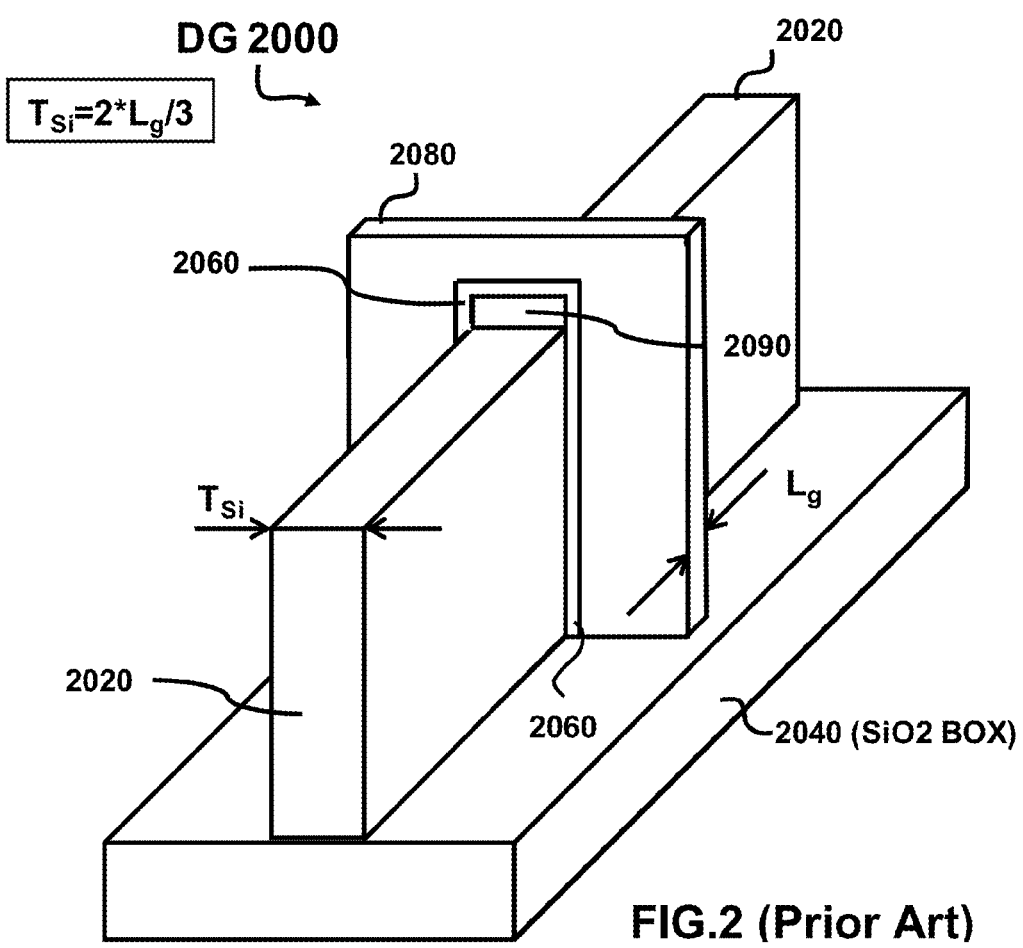
FIG. 2 (Prior art) is a 3D illustration of Double Gate MOSFET made of SOI FinFET.
Figure 3A:
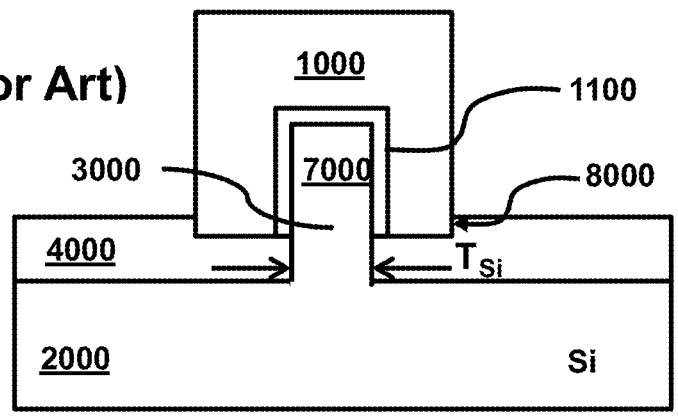
FIG. 3a (Prior art) is a cross-section of Tri-gate MOSFET made of Bulk FinFET.
Figure 3B:
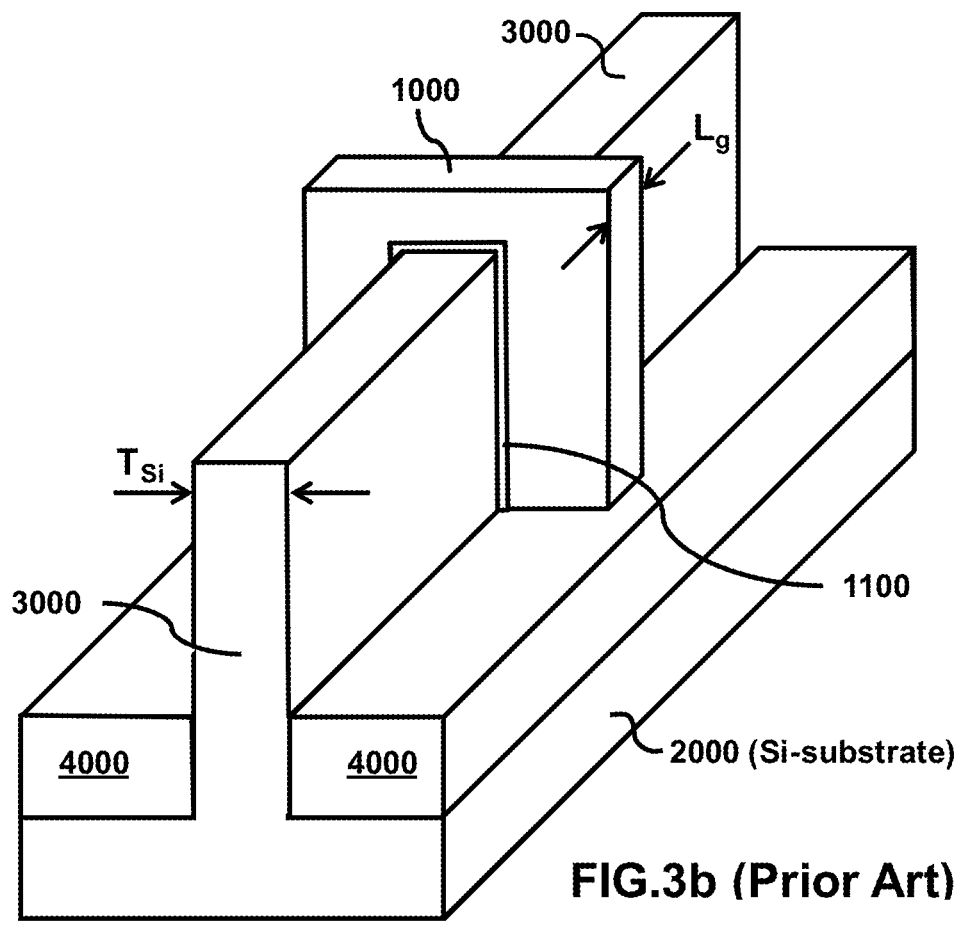
FIG. 3b (Prior art) is a 3D illustration of Tri-gate MOSFET made of Bulk FinFET.

VSTB-FET devices are ideal candidates for a DRAM Access Transistor (VSTB-AT) and for high performance periphery devices as required by the DDR4 & DDR5 specifications. Because of no-channel doping in VSTB-FET the electric fields in the channel are expected to be very small which results in a low junction leakage and in a high retention time. Also because the Source/Drain can be made of poly-Si interfacial layer for doping of VSTB it is also naturally compatible with the industrial standard RCAT fabrication process which has Source/Drain doping from poly-plugs and proven to provide low leakage current. Source/Drain for VSTB-AT can be made separately from the periphery VSTB-FET Source/Drain by making use the very well established complete poly-plug process. Source/Drain for the HP periphery can be made in a way suggested in this invention by forming Source/Drain stack to reduce the parasitic resistance. A silicide layer in the stack can be used made of heavy transition metals such as ZrSi2, HfSi2, and the like which have low diffusivity of Zr, Hf, and other materials like these in c-Si and can not bring metal contaminations to the DRAM array area through diffusion in the substrate and can not reduce the retention time. The generic issue in DRAM processing is related to using high-k/metal gate. In the Capacitor last integration scheme, the Capacitor formation thermal budget (TB) is the high temperature long time Thermal Budget (Harsh TB) applied for forming the capacitor array which does not allow using very well developed by this time high-k/metal gate stack used across the industry based on HfO2 material. A practical solution is to apply a stack of the SiO2 interfacial layer and the high-k materials which are robust and can withstand the Harsh TB. Such dielectrics are Si3N4 and Al2O3 deposited by ALD, plasma jet process and the like which provide no deterioration of the interfacial SiO2 layer quality and the interface with the semiconductor. Poly-Si gate electrodes appropriately doped for nMOSFET and pMOSFET are a viable option for DRAM before some harsh thermal budget robust materials for high-k and metal gate are developed. These practical options are totally compatible with the VSTB-FET device design and the method of forming therein and can be implemented with minimal modifications of the standard industrial processing capabilities. 3 different types of DRAM array can be suggested using VSTB device structure: 1) horizontal channel VSTB-AT with single recessed word line in 1WL-2BL per cell array architecture as illustrated in FIG. 30a and FIG. 30b, 2) a vertical channel VSTB-AT with the shallow Drain and deep Source between two recessed word lines in 2WL-1BL per cell array architecture as illustrated in FIG. 31a through FIG. 31c, 3) horizontal channel VSTB-AT with two recessed word lines in 2WL-1BL per cell array architecture as illustrated in FIG. 32a and 2BL-2WL array architecture as illustrated in FIG. 32b.

6T SRAM array is a very frequently used embedded memory in many ULSI products. SRAM typical design consists of 6 transistors where 2 pull-down nMOSFET transistors are 2× to 3× more powerful versus 2 pull-up pMOSFET transistors and Word-line access nMOSFET transistors. When the transistors are fabricated in the standard technology according to the Dennard's scaling they have a very high substrate doping level (up to 3e18 cm−3 and higher) which results in a significant Vth variations due to the random dopant fluctuations (RDF) constituting about 70% or so of the total Vth variability of 15 mV and more in terms of the standard deviation. Such a high variability has resulted in a very unstable SRAM functioning and XT SRAM cells designed with X=7, 8, 10, and even 12 transistors are now in a research stage and many solutions of this sort are being patented. Due to the no substrate doping feature of the VSTB-FET device design the Vth variability related to the RDF are very small below 1 mV. Vth variability related to the VSTB thickness variability and the channel length variability are expected to be smaller than for the traditional MOSFET design due to the processing features. As a result the traditional 6T SRAM is expected to be functioning very stable. In fabricating the Metal-zero (called in SRAM design as Metal-01) interconnects there is a choice of making isolation between the SD top layer and Metal-01 top layer by forming a spacer like isolation in the Metal-01 trenches or in SD holes/trenches. A little more compact design of VSTB-FET based SRAM cell can be made by using spacer formation in SD-holes/trenches. SRAM has a very intensive set of the short distance interconnects. So an extension upwards of the Metal-01 interconnect to constitute Metal-02 interconnect is suggested which is a very simple in fabricating and brings very small overhead. After the fabricating the Gate stack and Metal-01 local interconnects in a single module according to 2DSA method, a stack of a thin SiN layer, thick SiO2 and thin SiN layers is deposited. Mask is made to open the area above SD and Metal-01 followed with a barrier metal deposition such WN, TiN and the like followed with W deposition and CMP. A thin SiN is deposited on the top of such structure before making the contact ILD-PILD stack formation. Metal-01 and Metal-02 local interconnect layers can be used in HP logic or analog ULSI very efficiently as well as a periphery of the SRAM memory array (embedded or stand-alone).

Source/Drain etching depth is an important process performance parameter affecting the channel width variability and it would be very desirable to have it under tighter control. One way of doing it is to use an etch stop layer buried into STI dielectric body. The semiconductor device of the preferred embodiment, wherein the VSTB-FET is formed in such a way that the STI buried etch stop layer 511 is formed, FIG. 34a and FIG. 34b. The etch stop layer 511 is made of a dielectric with selectivity to etching of SiO2 and the like materials for SD etching depth control. The buried layer is formed during the STI formation by depositing SiO2 followed with any nitridation technique such as directional plasma nitridation, Si3N4 layer deposition and the like at the appropriate depth, followed with the SiO2 (TEOS, HDP, and the like) deposition, recess anisotropic etching, followed with another SiO2-TEOS deposition and CMP. The additional layer might significantly increase the VSTB-FET manufacturability if the STI SiO2 etch process is not capable of an accurate etch rate control. Fabrication of the VSTB-FET Source/Drains with more controllable depth is provided by a buried dielectric layer with high selectivity to etching of SiO2 and the like materials for Source/Drain depth control resulting in the channel width control and subthreshold leakage control.

It is always desirable to make as dense MOSFET's design as possible. An exemplary embodiment is suggested to form a couple of CMOS inverters in a single active area as illustrated in FIG. 35a through FIG. 35d. Process 113 (FIG. 35a and FIG. 35b) is suggested to form a couple of CMOS inverter in a single active area. N-well 202 formation process is moved from FEOL process after STI formation to a FEOL point when the c-Si is etched away in an active area and gate area is opened. Then a two quarter tilted Ion Implantation of n-type doping such as Phosphorus for c-Si is applied. A typical tilt angle depends on an aspect ratio of the VSTB height to the gate area size and is such that the half of the active area at the bottom of the gate area is doped as n-type 202 leaving the other half to stay p-type doped (as initially). Rotation angle is in a range 3 to 5 degrees to provide no parasitic doping of the VSTB belonging to n-MOSFET's due to the ion lateral spreading. A metal gate stack with a mid-gap work function range of about 4.5 eV made of materials such as Ru, TaSiN, TaRu, TaTi, Mo, MoSi2, WSi2 alloys and the like is formed which is common for both n-MOSFET and p-MOSFET. This method provides a very simple integration of the high Vth VSTB-FET fabrication and can be used for low power and very low power applications. It is a little bit more difficult to implement this device concept when two different work function materials are needed for nMOSFET and pMOSFET. A similar tilted ion implantation method would be applicable for the work function modification from one type of the work function, say n+-type of materials, into the p+-type of the work function materials. Unfortunately, by now there is no any robust technique to turn the low work function material into the high work function (or vice-versa) by some ion implantation as simple as the industry needs. So such a method has to be yet invented. In FIG. 35c an exemplary layout design is suggested to illustrate a particular circuit realization shown in FIG. 35d. One feature of Drain/Out's formation in FIG. 35c is to be mentioned. An electrical contact to the n-well in Drain area and Source and Drain shorts in Out areas are needed. This can be done by separate tilted doping of extended size of the Drain and Out's using the litho step which makes it a little not as small in size as it needs to be. This is illustrated in FIG. 35c where by dashed L-shaped rectangular as a mask for p-MOSFET Drain/Out's poly-Si p+-doping is indicated. For n-MOSFET the similar mask for poly-Si n+-doping is an L-shaped dot-dashed rectangular and the hole-shape in Drain area. If n-well is going to be common for a few VSTB-FET's only one contact for n-well is needed. EUV lithography would be extremely needed for such an inverter design. It is easier to do if neighboring active areas are used in such a way that the common doping layers can be designed and used.

As mentioned above any MOSFET with sub-10 nm channel length operates in the ballistic regime of the current transport since the free-path for electrons and holes in non-doped c-Si is also about 10 nm. In other materials such as GaAs, Ge, Graphene, and the like the free-path is even longer. Though there are some arguments whether the ballistic carrier velocity can be affected by the strain in the semiconductor body material or not it is clear that it is not difficult to apply all the known stress-engineering techniques by a specialist skilled in the art and get a gain in the mobility or the ballistic velocity. Both the mobility and the velocity enhancement are certainly preferable for a longer channel length, for example, longer than 15 nm or so, and can be implemented because the VSTB-FET device design and manufacturing process are naturally absorbing all the stress engineering techniques known by today such as: (a) the intrinsically stressed semiconductor substrate which will keep the stress during VSTB formation since the VSTB is attached to the vertical wall of STI, (b) the stress memorization technique, (c) uniaxial along-channel compressive stress for p-channel MOSFET, (d) uniaxial along-channel tensile stress for n-channel MOSFET, (e) selective epitaxial growth of SD in the SD holes with an intrinsic compressive stress coming from materials like SiGe (for p-channel) or with an intrinsic tensile stress coming from materials like Si(C) (for n-channel) instead of depositing a thin poly-Si oppositely doped for n-channel and p-channel MOSFET's as described in the preferred embodiment, (f) STI intrinsic stress (tensile or compressive as needed accordingly) can be formed during the STI formation process. Also the oppositely intrinsically stressed iso-plugs/iso-trenches at the end of the channel behind SD can be used for applying the stress engineering to the VSTB-FET. The applicability of all these stress engineering techniques to the VSTB-FET suggests that the novel device in this invention is really highly manufacturable because of its flexibility to absorb the best achievements and best practice in the device fabrication in the semiconductor industry.

In scaling the VSTB down the thickness is coming to the ultimate thickness equal to the inversion layer thickness in a particular material used for the VSTB. The typical inversion layer thickness is about 4 nm for semiconductor like c-Si and closed to this for many semiconductor materials. In ultimately scaled VSTB-FET design when the semiconductor body thickness gets equal or thinner than the inversion layer thickness the semiconductor gap start depending on the VSTB thickness. In this situation a new knob for Vth engineering is the semiconductor body thickness. Any High Performance (HP) IC needs at least 3 levels of the Vth: low Vth (HP MOSFET), Medium Vth (Medium Performance MOSFET), and high Vth (Standard Performance MOSFET). It is possible to adjust the Vth by making use of the Short Channel Effects (SCE) and the channel length is made of such a size that it modulates the Vth's. This knob is available in VSTB-FET concept and can be used if desired. To make a few Vth's for the same channel length a VSTB thickness can be adjusted by the dielectric cap (VSTB hard mask) width. This can be done by making the thickest cap (made for low Vth) for all the MOSFET in a die. Then by opening the area with Medium Vth VSTB-FET's and by trimming the cap width by a selective etch a medium Vth VSTB can be formed. Then opening the high-Vth VSTB-FET areas and trimming further the cap width the high Vth VSTB-FET are formed.

Another VSTB-FET design aspect of the ultimate VSTB thickness is that. There is no need for making Source and Drain doping regions because the material placed into the Source/Drain holes/trenches is now in immediate contact with the inversion layer. So the entire Vth engineering problem has now an additional free parameters (knobs) provided by VSTB FET concept which allows to design a set of Vth's like HP (High Performance), MP (Medium Performance), and SP (Standard Performance) by varying the materials not only at the gate stack side of MOSFET and by the VSTB thickness but also by the Source/Drain material work function (Wf). The last option is available for first time in regards to VSTB-FET device structure suggested in this invention. The VSTB does not have to have Source/Drain (SD) regions doped accordingly for nMOSFET and pMOSFET because the inversion layer is taking all the VSTB thickness and the Source/Drain must provide the electrical contact to the inversion layer from the opposite to the gate side. Such a contact is a hetero junction between the VSTB semiconductor material and the Source/Drain material or material stack formed of materials providing "ideal contact" to the inversion layer from the opposite to gate side. Typically the heterointerface between two materials has some final non-zero density of interfacial traps (Dit a.k.a. localized states). The ideal contact is to have zero interface trap concentration or negligibly small density of below 3e10 per $cm^2$ in a practical case of making Fermi-level pinning free interface. Source/Drains materials of choice also have an important parameter such as their work functions. The work functions of these Source/Drain (SD) materials are now affecting the threshold voltages of the VSTB-FET and can be used for Vth adjustment for a particular application depending on choices made for the work functions of the gate materials: n-GS-WF for nMOSFET and p-GS-WF for pMOSFET. Thus n-SD-metal work function (n-SD-WF) material for nMOSFET and p-SD-metal work function (p-SD-WF) for pMOSFET are to be considered in a Vth design of VSTB-FET's. The ideal SD contact needs to have an inert interfacial layer between the SD material responsible for the right WF's and the VSTB. The band gap and band gap offsets of this interfacial material with respect to the VSTB material is another parameter which can be a knob to adjust the Vth of the corresponding VSTB-FET's. So in the ultimate VSTB-FET design these set of material parameters is important and can significantly complicate or simplify the VSTB-FET Vth design objectives.

The question arises if there are any materials which can significantly reduce the inversion layer thickness by say an order of magnitude compared to the Si inversion layer thickness? One of the ultimate materials such as Graphene has indeed such a density of state (DOS) which results in the inversion layer thickness equal to the layer thickness. In a single layer Graphene this thickness is equal to 0.3 nm and in a double-layer Graphene (a.k.a bilayer Graphene) the thickness is equal 0.6 nm. Graphene is a viable semiconductor material with a very high mobility in ordered Graphene morphology and still reasonably high mobility in a form of slightly disordered morphology when deposited on the amorphous material like SiO2. A significant mobility improvement in Graphene can be achieved if a suitable lattice template is used for pseudo-epitaxial growth of the Graphene. Such a template can be made from a material which is a close relative to the Graphene which is Boron Nitride (BN). BN is a highly ordered quasi-crystal structure dielectric material deposited on many disordered substrates like SiO2 and the others. Those are well established facts that a high-k material such as HfO2 and ZrO2 and metal contact such as Hf, Zr, TiN and others can be used for the Graphene as the gate dielectrics and as contact and conductive materials correspondingly. They can be used when exploiting today rather exotic material like Graphene as a VSTB material. Vth adjustment objectives can be solved with the approach suggested in this invention. Also Carbon nano-tubes (C-nT) can be used in a disordered form as a highly conductive filling material in the gate electrode and in Source/Drain holes and trenches. Slight order in depositing C-nT can be made if the Langmuir-Blodgett type of method is used for a quasi-ordered deposition of C-nT into a deep holes and trenches resulting in a higher conductivity.

In the foregoing specification, specific exemplary embodiments of the invention have been described. It will, however, be evident that various modifications and changes may be made thereto. The specification and drawings are, accordingly, to be regarded in an illustrative rather than a restrictive sense.

Thus, Vertical Super-Thin Body Field Effect Transistors (VSTB-FETs) and methods of fabrication have been described.

The invention claimed is:

1. A transistor device, comprising: a semiconductor substrate; a dielectric body, the dielectric body embedded in the semiconductor substrate and including sidewalls; and
    a semiconducting vertical super-thin body ("VSTB") formed from the semiconductor substrate and supported by at least the sidewall of the dielectric body, the VSTB having two vertical faces, a first face and a second face, the first face in contact with the sidewall of the dielectric body, the VSTB serving as a channel for the transistor device;
    at least one source and drain electrode pair (electrode pair), comprising a source electrode and a drain electrode formed in isolated holes made in the dielectric body, wherein each source electrode and each drain electrode physically contact the first face of the VSTB.

2. The transistor device of claim 1, wherein the VSTB thickness is less than 10 nm.

3. The transistor device of claim 1, wherein the VSTB additionally serves as a channel for neighboring transistor devices.

4. A transistor device, comprising:
    a semiconductor substrate;
    a dielectric body, the dielectric body embedded in the semiconductor substrate and including sidewalls;
    a semiconducting vertical super-thin body ("VSTB") formed from the semiconductor substrate and supported by at least the sidewall of the dielectric body, the VSTB having two vertical faces, a first face and a second face, the first face in contact with the sidewall of the dielectric body, the VSTB serving as a channel for the transistor device;
    at least one source and drain electrode pair (electrode pair), comprising a source electrode and a drain electrode formed in isolated holes made in the dielectric body, wherein each source electrode and each drain electrode physically contact the first face of the VSTB; and
    a gate, the gate in contact with either the first or the second face.

5. The transistor device as recited in claim 4, wherein the second face of the VSTB is supported by a second dielectric body, the second dielectric body associated with a neighboring transistor device formed in the semiconductor substrate.

6. The transistor device as recited in claim 4, wherein the gate contacts the second face and the VSTB is wrapped around the gate such that the second face of the VSTB makes contact with the gate on all sides in at least a 2D plane, and including at least a second source and drain electrode pair and arranged such that at least two transistors are created using the single gate.

7. The transistor device as recited in claim 4, wherein the VSTB is a first VSTB and the dielectric body is a first dielectric body, and further comprising:
    a second VSTB; and
    a second dielectric body;
    wherein the second face of the second VSTB contacts an opposite side of the gate than contacts the first VSTB, and the second VSTB includes at least one additional electrode pair, thereby creating a second transistor mirroring the transistor device and both the second transistor and the transistor device using said gate.

8. The transistor device as recited in claim 4, wherein said semiconductor substrate is further electrically and physically connected to multiple VSTBs in a single active area with isolated source and drain electrodes and where gates are separated by forming an isolation trench through the gate stack and filled with a dielectric material.

9. The transistor device of claim 4, wherein the semiconductor substrate used is a silicon-on-isolator such that the VSTB is separated from the semiconductor substrate electrically by the buried oxide layer and the gate-to-substrate isolation layer is the isolator layer in the semiconductor substrate.

10. The transistor device of claim 4, wherein the semiconductor substrate has multiple alternating layers of semiconductor material and a dielectric or a second semiconductor material with a substantial difference in lateral etch rate such that when formed, the VSTB comprises nanowires parallel to the substrate.

11. An array of transistors formed on a single semiconductor substrate, each transistor in the array comprising:
   a dielectric body, the dielectric body embedded in the semiconductor substrate and including sidewalls;
   a semiconducting vertical super-thin body ("VSTB") formed from the semiconductor substrate and supported by at least the sidewall of the dielectric body, the VSTB having two vertical faces, a first face and a second face, the first face in contact with the sidewall of the dielectric body, the VSTB serving as a channel for the transistor device;
   at least one source and drain electrode pair (electrode pair), comprising a source electrode and a drain electrode formed in isolated holes made in the dielectric body, wherein each source electrode and each drain electrode physically contact the first face of the VSTB; and
   a gate, the gate in contact with either the first or the second face.

12. The transistor array of claim 11, each transistor in the array further comprising:
   a memory stack which is formed on either the first face or the second face of the VSTB, between the gate and the VSTB, thereby enabling the transistor device to be used as a memory device.

13. The transistor array as recited in claim 11, further comprising:
   a metal-zero interconnect electrically connected to the gate but electrically isolated from the electrodes pair, the metal-zero interconnect electrically connecting the gate of a plurality of transistors in the array of transistors, thereby configuring the gate of neighboring transistor devices act as a common gate.

14. The transistor array as recited in claim 11, further comprising:
   a metal-zero interconnect electrically connected to either the source electrode or drain electrode and electrically isolated from other electrode and provides an electrical connection to a corresponding electrode on a neighboring transistor.

15. The transistor array of claim 11, further comprising:
   isolation plugs, wherein the isolation plugs sever the VSTB on either side of each transistor in the array such that at least a plurality of the transistors in the array do not share a common VSTB.

16. The transistor array of claim 12, wherein the transistor array is comprised of cells, the transistor array is configured as a circuit to act as a NOR flash memory array and further comprising:
   bit lines where source and drain electrodes are common for every cell connected to the bit lines and gates purposed as word lines.

17. The transistor array of claim 12, wherein the array is configured as a circuit to act as a NAND flash memory array.

18. The transistor array of claim 12, wherein groups of at least six transistors in the array are wired as a circuit and function as a SRAM array cell.

* * * * *